(12) United States Patent
Rosenbluth et al.

(10) Patent No.: US 8,108,802 B2
(45) Date of Patent: Jan. 31, 2012

(54) METHOD FOR FORMING ARBITRARY LITHOGRAPHIC WAVEFRONTS USING STANDARD MASK TECHNOLOGY

(75) Inventors: Alan E. Rosenbluth, Yorktown Heights, NY (US); Jaione Tirapu-Azpiroz, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 338 days.

(21) Appl. No.: 12/431,865

(22) Filed: Apr. 29, 2009

(65) Prior Publication Data

US 2010/0281449 A1 Nov. 4, 2010

(51) Int. Cl.
*G06F 17/50* (2006.01)
(52) U.S. Cl. ............... 716/50; 716/51; 716/53; 716/54; 716/55; 716/56
(58) Field of Classification Search ............... 716/50–56; 430/5, 30
See application file for complete search history.

(56) References Cited

U.S. PATENT DOCUMENTS

| | | | |
|---|---|---|---|
| 6,869,739 B1 | 3/2005 | Ausschnitt et al. | |
| 7,703,069 B1 * | 4/2010 | Liu et al. ................. | 716/50 |
| 2002/0014667 A1 | 2/2002 | Shin et al. | |
| 2006/0105513 A1 | 5/2006 | Afzali-Ardakani et al. | |
| 2006/0151844 A1 | 7/2006 | Avouris et al. | |
| 2007/0207394 A1 * | 9/2007 | Dersch et al. ............. | 430/30 |

OTHER PUBLICATIONS

"Optimum Mask and Source Patterns to Print a Given Shape", Society of Photo-Optical Instrumentation Engineers, vol. 1 No. 1, Apr. 2002, pp. 13-30.
"Phase Calibration for Attenuating Phase-Shift Masks" Michael S. Hibbs, Timothy A. Brunner. Metrology, Inspection, and Process for Microlithography, vol. 6152, 2006, pp. 1-8.
"Lithographic Image Simulation for the $21^{st}$ Century with $19^{th}$ Century Tools", Wavelength Optical Systems Engineering II, vol. 5182, 2003, pp. 73-87.
"Mutually Optimizing Resolution Enhancement Techniques: Illumination, APSM, Assist Feature OPC, and Gray Bars". Rochester Institute of Technology, Microelectronic engineering Department, pp. 1-15 @2001.
"Incorporating Mask Topography Edge Diffraction in Photolithography Simulations"J.Tirapu-Azpiroz and E. Yablonovitch, vol. 23, No. 4, Apr. 2006, pp. 821-828.

* cited by examiner

*Primary Examiner* — Paul Dinh
*Assistant Examiner* — Nha Nguyen
(74) *Attorney, Agent, or Firm* — Harrington & Smith

(57) ABSTRACT

A desired set of diffracted waves using mask features whose transmissions are chosen from a set of supported values are generated. A representation of the mask as a set of polygonal elements is created. Constraints which require that the ratio of the spatial frequencies in the representation take on the amplitude ratios of the desired set of diffracted waves are defined. An optimization algorithm is used to adjust the transmission discontinuities at the edges of the polygons to substantial equality with the discontinuity values allowed by the set of supported transmissions while maintaining the constraints.

18 Claims, 35 Drawing Sheets

NA = 0.68, λ = 248nm, σ < 0.85
Cell unit f is 140nm.

Challenging requirement: Print rectangles with no line shortening, i.e. tips should be separated horizontally by 1.5f

| Order {x,y} | Relative Amplitude |
|---|---|
| {0,0} | -2.338633 |
| {0,2} | 3.7346026 |
| {1,1} | -0.210172 |
| {2,0} | 1 |
| {2,2} | 1.4796596 |
| {3,1} | -2.126245 |
| {4,0} | -1.624187 |
| {5,1} | 0.4933868 |

Positive Anti-BL        Negative Anti-BL

EMF Mask Transmission

METHOD FOR FORMING ARBITRARY LITHOGRAPHIC WAVEFRONTS USING STANDARD MASK TECHNOLOGY

TECHNICAL FIELD

The present disclosure generally concerns methods for forming lithographic wavefronts.

BACKGROUND

The well-known "wavefront engineering" approach to improved lithographic performance is based on the following consideration: At a fundamental level, it is often easier to maximize the quality of lithographic images by engineering them in the pupil, rather than the object plane. Put differently, it is often simpler (from a fundamental point of view) to derive an imaging wavefront that is suitable for producing a high quality image, rather than designing the mask that would actually be needed to generate the wavefront which forms the image.

We can identify two reasons for this advantage, one conceptual, the other practical.

First, the finite exit-pupil NA is the basic "bottleneck" that actually limits the resolution of lithographic images. (Resist diffusion has a non-negligible impact, but resist resolution is almost always finer than that of the exposure tool.) Here NA stands for Numerical Aperture, which is defined as the product of two quantities, namely the sine of the half-angular range of the light that is converged to form the image, and the refractive index of the medium in which the image is formed. The highest frequency modulation that the image can contain is given by ½ the NA divided by the wavelength. Many practical challenges must be considered in state-of-the-art lithography, but the core problem is that imposed by the limited lens resolution. In order to manage that core challenge one would like to "push" the most effective wavefront possible through the available NA. (As used herein we will use the term "wavefront" as shorthand for the set of mask spatial frequencies that are actually collected by a projection lens, e.g. a photolithographic lens, considering all illumination directions present in the source.) Thus, it can be advantageous to work in the pupil domain when trying to obtain the best possible image, particularly in the case of small critical cells where intensive optimization is appropriate.

A second advantage of working in the pupil domain is that mask variables are somewhat inflexible to work with, compared to wavefront variables. For example, shape constraints come into play during direct optimization of mask variables that are extraneous to the fundamental issue of maximizing image quality. These constraints involve the basic topology of the mask patterns used, along with issues of feasible mask fabrication (e.g. "when edge A is moved out, it cannot be moved closer than distance d to edge B"). Wavefront variables, on the other hand, are continuously adjustable, without mutual constraint. Wavefront variables are a convenient way to reformulate solutions that are derived from mask patterns whose shapes are costly to fabricate directly, such as gray-level masks formed with multiple transmission levels to produce multi-level images. Wavefront variables have another convenient aspect when periodic boundary conditions are imposed on the object, because in such cases wavefronts can be completely represented by a specific discrete set of diffraction orders, or equivalently by the discrete Fourier transform of these orders, and it is these specific orders that form the image of interest. (Periodic boundary conditions are very frequently imposed in lithographic design simulations, either directly because the object is truly periodic, or indirectly because the numerical simulation code uses a discrete grid in the frequency domain.) In contrast, one may not be able to address all intrinsic degrees of freedom in an image by adjusting the positions of available edges in the mask, except when the mask edges are so heavily fragmented as to produce far more nominal mask variables than there are true degrees of freedom in the image. That outcome is not assured, and even when all orders can in principle be independently addressed, certain orders may only be coupled very weakly to available edges, depending on the topology of the mask design chosen, and this increases the likelihood that extraneous shape constraints will unnecessarily limit the quality of the solution obtained.

Unfortunately, despite its inherent advantages, lithographic design in the pupil plane has one significant disadvantage—The known technology does not provide a practical method for actually realizing the optimal wavefront, i.e. there is no known method for actually constructing a mask using standard photomask technology that will provide a specified wavefront as its diffraction pattern. The issue of practicality is key here—One can, of course, find a mathematically valid mask solution by taking the Fourier transform of the desired wavefront (after choosing some nominally arbitrary [but actually consequential] shape for the uncollected portion of the wavefront); however, this will produce a "mask" that is continuously varying, and so not manufacturable. Producing a specified wavefront with a manufacturable mask is a nontrivial problem.

Manufacturable mask features must take the form of openings in a background film, and these openings must be fairly coarse in size (though they can be smaller [when scaled to "1×"] than the minimum-sized features that can actually be developed in resist; also, the perimeters of mask features can contain fine jogs that are smaller than the smallest mask features). Another limitation is that the transmission of each mask opening is, in the simplest instance, fixed at the transmission level of the substrate. Modern masks allow slightly more flexibility than this, but in general feature transmission should be chosen from one or two allowed values (in addition to the background transmission, which may be nonzero), i.e. masks must generally be binary or trinary in order to meet production-grade feature placement specifications, and to contain fabrication cost. For example, in a so-called Levenson mask, the intensity transmission in any region can only be 0 or 100%, and the transmitted phase can only be 0° or 180°. In general, restriction of the phase shift to 0° or 180° causes the transmission to be real-valued, and the resulting pure-real character of the transmitted wavefront causes critical dimensions in the image to have better stability through focus. For this reason practical mask films conventionally have a transmission phase of either 0° or 180°. So-called grey-level masks whose features have more than two different intensity transmissions generally cannot meet practical feature placement requirements.

Critical features in manufacturable masks must nominally be polygonal, i.e. they must be designed with straight edges (though the limited resolution of mask writing technology will cause significant corner rounding). Also, critical features must usually be "Manhattan", i.e. their edges can only take right-angle turns, with the edges of all different features being parallel or perpendicular to one another. (However a limited number of features with non-Manhattan edge orientation is sometimes acceptable, such as features with 45° orientation.)

The finite thickness of the patterned mask films poses another practical problem for mask design, since it causes the transmission to locally deviate from its nominal value, particularly in the vicinity of the feature edge. More specifically, the light transmitted through mask apertures will only match the transmission of the mask blank at positions that are somewhat removed from the aperture edge, and likewise the transmission in unopened regions will deviate from the transmission of the background films at positions that are adjacent to aperture edges. The transmission discontinuity arising at the vertical topographic edges of features will therefore not match the nominal discontinuity as defined by the separation between the basic transmission values supported by the mask technology. Such deviations from the nominal behavior are due to the interaction of the Electromagnetic fields with the complex topography of the patterned mask films; these deviations are referred to as "EMF" (for Electro Magnetic Field) effects. Roughly speaking, we can regard EMF effects as being a consequence of the finite thickness of the physical films or trenches that are etched out to form the features that are written on the mask. EMF effects usually become more significant as the film thickness becomes relatively larger in comparison to the feature widths and wavelength. Mask films are very roughly of order 70-100 nm in thickness, and printed features have until recently been larger than the exposing wavelength (which today is typically 193 nm). Since lithographic masks are usually 4× enlarged, it has thus been reasonably accurate to neglect their topography, and treat them as ideal two dimensional (2D) masks (the so-called Thin-Mask Approximation, or "TMA"). Even today, it remains true that the basic lowest order behavior of lithographic masks is generally captured by the TMA approximation. However, while EMF effects can usually be regarded as a perturbation on the TMA behavior, the significance of their impact can be quite substantial in the context of the stringent tolerances of photolithography.

As shown in FIG. 1, the finite thickness of mask topography causes perturbations in the transmitted field. The transmission from points that are appreciably distant from the topographic edge is little changed, but the perturbation can become non-negligible near the perimeter of mask apertures, particularly at the small feature sizes characteristic of modern masks. To lowest order, the in-phase (real valued) transmission change is roughly that produced by a small extension or retraction of the associated edge.

As shown in FIG. 2, the thin mask model is usually able to capture the gross behavior of lithographic images; in this example the printed image size is predicted within ~11.5%. (Feature size is 50 nm at all plotted periodicities.) The prediction error becomes less than 2% if the absorber edges in the Thin Mask Approximation (TMA) model are extended (biased) from the edge in a way that mimics the topography-induced transmission change.

The projection lens is incapable of resolving the fine structure of the EMF-induced discontinuity in the fields, and it is known (J. Tirapu-Azpiroz and E. Yablonovitch, "Incorporating mask topography edge diffraction in photolithography simulations," J. Opt. Soc. Am. A 23,4 (2006): p. 821) that EMF effects can be approximately reproduced using a TMA model in which the edge fields are rendered as small strip-like features of essentially fixed transmission (generally a complex transmission) that are assumed for simulation purposes to lie along the aperture boundaries. More precisely, since these perturbing strips (known as boundary layers) are considerably narrower than the lens resolution, their width can (in first approximation) be modestly re-adjusted as long as a compensating adjustment is made in their transmission, holding the width-transmission product effectively constant. (We qualify this as "effectively" constant because we require that the width-transmission product include the thin-mask transmission that would otherwise have been present in the strip of mask-area that the boundary layer displaces.) When the boundary layer is scaled to have a transmission of order unity in magnitude, its width will usually be very roughly of order $\lambda/20$, i.e. boundary layers are usually strongly sub-resolution.

Since boundary layers are unresolved, the in-phase part of their image contribution is very similar to that which would be obtained by recessing the aperture edge by a distance that would deliver a matching amplitude contribution (or extending the edge to appropriately occlude the illumination, depending on the sign) in the form of a simple bias.

It is known that the impact on transmitted amplitude EMF effects can to first order approximation be corrected by simple biasing, in order to carry out mask design in the basic mode known as Optical Proximity Correction ("OPC"); see FIGS. 1 and 2. OPC involves adjusting the position of the topographic edges of mask features in such a way that the contour of the printed image falls at a specified position. Essentially, the EMF-induced incremental change in delivered intensity at the feature edge causes a change in the contour position, and the mask aperture must be biased in the opposite direction to undo the shift. In many cases the simple opaque bias model allows the intensity change to be calculated both accurately and rapidly, making OPC correction with topographic masks possible.

However, advanced forms of lithographic optimization that aim to print at the extreme limits of resolution must worry about the process robustness of the printed image, and focus sensitivity is a critical aspect of process robustness. Focus sensitivity is impacted by the phase of the transmitted light, and the in-quadrature component of the vertical edge field perturbation cannot be compensated by a shift in edge position (as shown in FIG. 6). As a result, it is only possible to compensate the degradation in focus robustness that EMF induces in an averaged way when shape adjustment is employed as the compensation method. The in-quadrature (or imaginary) component of the EMF perturbation can therefore be considered more critical than the in-phase (or real) part, and the magnitude of the in-quadrature component is largely a function of the mask topography, which in turn depends on the phase and transmission that are chosen for the mask aperture and background regions.

As shown in FIGS. 3A, 3B and 5, the main impact of the in-quadrature (imaginary valued) component of EMF-induced image changes is a pitch dependent focus shift. The shift of plane of best focus with feature size degrades the common window of the process or "common process window". The term "Common PW" is short for common process window, and refers to the range of fluctuations in dose and focus over which the fluctuations in a lithographic image remain within tolerance.

As shown in FIGS. 4A-4B, the approximate boundary layer model of EMF effects provides a reasonably accurate calculation of the feature-dependent shifts in focus that are produced by mask topography, with broadly accurate results being obtained down to quite small feature sizes.

In many cases the wavefronts which produce the best-performing images can only be created from masks which have transmitting regions of both 0° and 180° phase, since the availability of both polarities makes it easier to form adjacent bright areas of the image with fields of opposite sign, creating a high contrast dark fringe between the bright features where the field passes through zero amplitude as it changes sign. Such opposite phases can also be produced using the tilt-phase that is generated with off-axis illumination, but this is less flexible than deploying phase-shift on the mask when complex patterns are involved. Unfortunately, topography effects make it hard to maintain the benefits of phase shift imaging as the dimensions of mask features shrink. EMF effects increase as topographic-edge-regions occupy an increasingly large portion of the mask area, and the three-dimensional (3D) topographic step that is present between regions that are phase-shifted tends to be relatively large. As noted above, the field in the vicinity of the step exhibits a phase that is different from the 0° and 180° phases that are attained in the extended open areas on either side of the step. These latter nominal transmittances are pure real (in-phase) even though phase shifters have been employed, but the magnitude of the imaginary (in-quadrature) component that EMF effects induce at vertical topographic edges will tend to be larger with the relatively thick films that phase-shift masks typically employ. This localized quadrature component can cause focus shifts even for opaque binary masks, and in general the miss-phased field will occupy a larger fraction of the transmitted beam when features are small. And as we have seen, this quadrature error also makes it impossible to fully correct the impact of EMF by pure shape adjustment alone.

FIG. 5 shows focal behavior of printed features when a known mask of finite thickness topography is used. Images from TMA masks have a desirable zone of focal stability that is centered at z=0, since the derivative of image intensity with respect to z will be zero at that focus (assuming the usual symmetric source). However, when the thickness of mask topography is non-negligible, one sees from plots like these of feature size vs focus (so-called Bossung curves) that the positions of best focus (center of the regions of focal stability) are shifted away from z=0 in a non-uniform, feature-dependent way.

As shown in FIGS. 3A-3B, biasing cannot correct focal shifts that are caused by the quadrature component of the EMF perturbation. At a fixed focus position, a TMA calculation using a biased mask is incapable of reproducing the true topographic EMF behavior through the full dose range.

The known technology provides only limited means for dealing with these practical difficulties of wavefront engineering. Consider first the limited flexibility that adjustment of conventional mask shapes provides, and the inability of such adjustments to easily address all degrees of freedom in the image. If one is willing to set aside issues of mask manufacturability, there is a known method for optimization of lithographic images that operates in the mask plane, while managing to capture much of the flexibility of wavefront design; this is the method of image optimization using high density bitmap masks, in which every pixel is independently adjustable, and where the pixels are so small as to provide effectively continuous addressability of the mask. Bitmap masks provide the flexibility needed to achieve optimal images, but they contain far more variables than necessary (which severely slows most optimization algorithms). Also, bitmap masks are not practically manufacturable. State-of-the-art mask technology typically requires that isolated mask openings (e.g. bitmap pixels in the case of bitmap masks) be sized larger than perhaps ¼ the width of the smallest feature that can actually be resolved (i.e. printed) in a single wafer image (except scaled up by the lens magnification). The edges of mask features can contain jogs that are much finer than this, but small jog-like serifs do not remove the practical difficulty in fabricating bitmap masks, for the following reason: Since bitmap pixels represent a large number of independent variables, they will be highly redundant, hence many of the pixel adjustments that improve the objective function are likely to be spatially isolated from other pixels of the same polarity as the particular pixel that is actually adjusted at any given step, and the resulting small isolated pixel apertures are not manufacturable.

This lack of contiguity can be circumvented when the problem is linear, but mask optimization problems are inherently quadratic (at best), since the exposing intensity is a quadratic function of diffracted amplitude. Shape constraints can be included in the optimization procedure to inhibit the use of isolated pixels, but then the algorithm becomes bound once again by topological constraints that are irrelevant to the imaging process itself (where the working solution should be able to represent any imaging wavefront that can be propagated through the bandlimiting lens NA), and in addition the working solution can fall into extraneous local minima that involve non-essential topological constraints arising from happenstance clustering. Often these manufacturability requirements are addressed by adding penalty terms to the objective function, but performance is then penalized when the objective is re-weighted to emphasize manufacturability, and in addition the manufacturability requirements are often incompletely satisfied.

Though lithographic design in the pupil plane has been known for many years (e.g. under the rubric of "wavefront engineering"), the above disconnect from mask fabrication has generally restricted wavefront engineering to the role of conceptual aid, rather than full working procedure. One-dimensional patterns are a partial exception to this; known methods for laying out one dimensional (1D) assist features provide a fairly complete link between the desired 1D diffraction patterns and feasible masks. Smith (B. W. Smith, "Mutually Optimizing Resolution Enhancement Techniques: Illumination, APSM, Assist Feature OPC, and Gray Bars", SPIE v.4346—Optical Microlithography XIV, (2001): p. 471) provides a discussion of pupil-plane optimization and the associated determination of suitable 1D masks.

However, it would be desirable to have a method for producing an arbitrary wavefront within the lens exit pupil, without being restricted to 1D. Such a method could in principle be used to produce any image that a given litho exposure tool is theoretically capable of. This includes images that have been designed using wavefront variables, as well as images which known lithographic methods could only produce using idealized masks whose fabrication would be impractical, such as images from non-manufacturable gray-level masks that employ more than two intensity transmission levels, or images from masks that contain non-manufacturable aperture shapes. Such a method could in addition produce images that are initially designed using impractical idealized mask solutions, and then further refined using wavefront variables. In general, problems of practical mask fabrication would be separated from the core problem of determining the best possible image.

Rosenbluth et al. took an important step towards such a capability with an algorithm described in A. E. Rosenbluth et al., "Optimum Mask and Source Patterns to Print a Given Shape," JM3, 1, 1 (2002), p. 13. This reference shows how to devise a binary or trinary mask that will reproduce a specified diffraction pattern by solving a single linear programming (LP) problem. Mask features provided by this LP will usually take the form of reasonably large contiguous mask openings, rather than the tiny isolated halftones of bitmap masks. (It should be noted that while the features in the LP solution are usually of practical size, they can also include unrealistically fine "tendrils", which in the Rosenbluth et al. method are essentially removed by manual intervention.)

However, a drawback to this known method is that the features provided are very far from Manhattan—Feature edges not only have arbitrary orientation, but are actually curved in complex ways. FIG. 7 shows an example, namely a binary mask (transmission=±1) that produces an optimized diffraction pattern for a dynamic random access memory (DRAM) isolation level (see FIG. 8), generated using a known method. Width of cell is about 3λ/NA, height about 1.5λ/NA, with λ=248 nm, NA=0.68. Unfortunately, these curved mask geometries are not manufacturable, due both to lack of Manhattan (or even polygonal) apertures, and the presence of a few overly fine connections between the generally contiguous apertures.

It is possible with some trial and error to semi-manually derive a Manhattan layout from masks produced by this algorithm (e.g. the above paper by Rosenbluth et al. shows a Manhattan mask that is semi-manually derived from the FIG. 7 solution). To do so one draws on the plotted mask a staircased line that approximately follows the perimeter of each mask region. One then reads the coordinates of the staircase corners from the plot, and enters them into an optimization program which attempts to reproduce the desired diffraction orders by adjusting the corner positions. Convergence is very fast if the staircasing is fine, but the masks then become more difficult to fabricate. On the other hand, the corner optimizer typically fails to converge when the staircasing is coarse. Usually one can find an acceptable compromise after a bit of trial and error.

However, this method is far from ideal. First, the final mask features usually contain a large number of difficult-to-fabricate jogs and serifs, i.e. protruding features with aspect ratio of order 1 that have two or more edges with length near the limit of fabricability. Fragments that protrude only slightly from a long edge (i.e. having aspect ratios far from 1) are not a significant concern, nor are near-unit-aspect-ratio structures that are relatively large. A limited number of more difficult jogs (of small but acceptable size, and compact aspect ratio) can be handled, and these jogs can be quite a bit smaller than the minimum allowable isolated mask feature (i.e. it is acceptable to have small jogs that merely adjust the perimeter of a larger, fully resolved feature.)

FIG. 8 shows a DRAM isolation pattern used as an example to explain the present method. Rectangles should be printed as dark. Periodicity of rectangular optical unit cell is 1120 nm in the x direction, 560 nm in the y direction.

Unfortunately, a hand-staircased solution often contains more such jogs than is desirable, and also more jogs than are fundamentally necessary to reproduce the diffraction pattern. Another disadvantage to the hand-staircasing method is simply that it is a manual procedure, and so is time-consuming and prone to error. Also, very similar patterns may be staircased in appreciably different ways if the human engineer involved does not recognize or recall previously handled cases. Ideally this would not matter since all solutions will nominally produce the same image; however in practice this would tend to increase variation in Critical Dimensions (CD's) across the printed chip level.

SUMMARY OF THE INVENTION

There is disclosed a method for forming arbitrary lithographic wavefronts using standard mask technology. Optimization can be used to obtain a manufacturable mask that will diffract a specified wavefront, but the criteria for manufacturability are sufficiently complex and nonlinear as to require local optimization. It is then necessary to find a starting design that provides very nearly the correct wavefront using shapes that can be made manufacturable without breaking the initial topology, since local optimization involves smooth and continuous adjustments. It is this starting design that allows the local optimization to avoid being compromised by extraneous topological constraints. Such an approximately manufacturable starting mask can be designed using a Manhattan grid that has variable spacings. The mean grid spacing is chosen to correspond roughly to a typical fragment size; more specifically, the mean grid spacing is chosen (using formulas supplied below) to be sufficiently fine that the specified wavefront can be reproduced, yet sufficiently coarse that the mask is approximately manufacturable. The specific gridline positions can depart from the average spacing, and these positions are adjusted in a way that converges to manufacturability; more specifically, the gridlines are positioned to permit as large a nominal discontinuity in mask transmission as possible across gridlines (using the method of the next paragraph), eventually being adjusted to the point that every nominal discontinuity is as large as one of the allowed discontinuities defined by the differences between the binary or trinary set of allowed transmission values supported in the mask manufacturing process. The present method makes additional adjustments to account for the discontinuities arising from finite thickness topography, but the gridline adjustments involve only the nominal discontinuities in the thin-mask transmission. Additional shape adjustments are made to compensate the real (in-phase) part of the EMF discontinuity, and additional adjustments to the mask topography are made to compensate the quadrature discontinuity.

The gridline adjustment can be accomplished in two basic ways, each of which increases the average (non-zero) nominal discontinuity across gridlines, with the important qualification that gridline sections across which there is no discontinuity are not counted, i.e. discontinuities are either flattened down to zero, or increased to a level consistent with the mask technology, thereby removing intermediate transitional transmissions. In a preferred embodiment, the present method begins by applying the first of these methods, which is to set the transmission of the blocks (i.e. rectangles) between adjacent gridlines to those particular values which maximize diffracted intensity (some of these initial transmission values not being manufacturable, since the required wavefront should be achieved precisely). It will be shown below that this drives a majority of the rectangles to one of the extreme transmission values allowed by the mask technology, and that, among the rectangles in this category, those having the same transmission tend to cluster together. These clustered rectangles have no transmission discontinuity where they join within the interior of the clusters; however, somewhat larger discontinuities are present along the borders of the clusters. Next, the present method employs the second method for increasing the average (non-zero) discontinuity across gridlines, which is to insert new gridlines through the particular rows or columns of blocks in which the transmission of a large number of blocks had to be kept far from the transmission extremes supported by the mask technology in order to reproduce the specified wavefront (i.e. gridlines are inserted through rows and columns with a large number of "graylevel blocks", which are present because of the need to precisely tune the diffracted spectrum to the correct amplitudes). Gridline insertion in effect replaces each such graylevel block by a pair of blocks. The initial gridline separation is chosen to be smaller than the lens resolution, which means that each newly formed pair of blocks can have almost the same optical impact as the original graylevel parent block even when the daughter blocks are given (opposing) non-graylevel transmissions, as long as the relative area of the daughter blocks is set in the proper proportion. Both daughter blocks can then be given manufacturable transmittances. However, in a preferred embodiment, this relative area adjustment is not made right away. Instead, the diffracted intensity is re-maximized with the new gridlines in place, and the transmission of all blocks that remain at unsupported values are rounded to the nearest supported transmission level, and finally the positions of all gridlines are adjusted to remove any inaccuracies that were introduced in the desired spectrum by the rounding step. The steps of this procedure are summarized in FIG. 10.

For example, FIG. 9 shows a diffraction pattern that has been optimized to print the FIG. 8 isolation pattern. To explain the present method the text shows how a practical mask can be designed to produce this wavefront.

FIG. 10 shows a flowchart summarizing a preferred embodiment of the mask design algorithm. EMF correction is applied in a later step.

FIG. 11 shows an optimized source for mask that produces the FIG. 9 wavefront. The pupil fill parameter $\sigma_M$ is 0.84.

In another aspect, there is described a memory storing a program of computer readable instructions executable by a processor to perform actions directed to generating a desired set of diffracted waves using features of a lithographic mask for which a set of supported transmissions are chosen from a set of supported values, the actions comprising: creating a representation of the mask as a set of polygonal elements, defining constraints which require that the ratio of the spatial frequencies in the representation take on the amplitude ratios of the desired set of diffracted waves, using an optimization algorithm to adjust the transmission discontinuities at edges of the polygonal elements to substantial equality with the discontinuity values allowed by the set of supported transmissions while maintaining the constraints.

In one aspect of the memory, the optimization algorithm comprises iterated steps, the iterated steps comprising: forming a 3D topographical representation from the polygonal elements, and simulating it with a full-3D Maxwell solver to calculate the Fourier transform of the edge discontinuities.

In another aspect of the memory, the iterated steps further comprise: calculating a compensating adjustment that cancels the deviations of the Fourier transforms of the edge discontinuities from the required spatial frequency ratios.

In a further aspect of the memory the iterated steps further comprise: forming an adjusted set of Fourier orders using the compensated edge Fourier transforms calculated in the previous step and use them to generate with thin-mask wavefront engineering a new set of iterated polygonal elements.

In another aspect of the memory, the optimization algorithm further comprises determining the iterations when the Fourier transform of the 3D topographical representation of the iterated polygonal elements substantially reproduces the amplitude ratios of the desired set of diffracted waves.

In a yet further aspect of the memory, one or more transmission discontinuities are driven to substantial equality with an allowed value by: forming the 3D topographical representation of the polygonal elements, calculating the transmission discontinuity at the edges of the polygonal elements, and adding features to the mask whose in-quadrature transmission component substantially cancels the in-quadrature component of the transmission discontinuities at edges of the polygonal elements.

In still yet another aspect of the memory, one or more transmission discontinuities are driven to substantial equality with an allowed value by: giving the desired ratios of spatial frequencies complex values that provide the image with a desired behavior through focus, forming the 3D topographical representation of the polygon elements, calculating the transmission discontinuity at the edges of the polygonal elements, and adding features to the mask whose quadrature transmission component combined with the quadrature component of the transmission discontinuities at the edges of the polygonal elements provides the in-quadrature part of the complex values of the desired spatial frequency ratios.

BRIEF DESCRIPTION OF THE DRAWINGS

The foregoing and other aspects of these teachings are made more evident in the following Detailed Description, when read in conjunction with the attached Drawing Figures, wherein.

DETAILED DESCRIPTION

Figure 7:
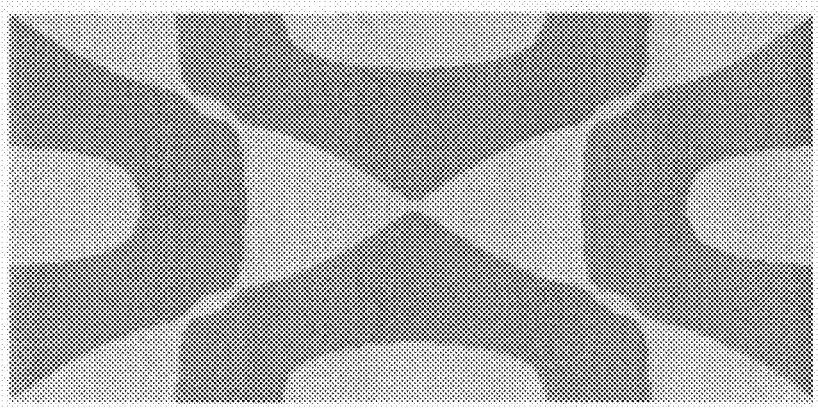
FIG. 7 shows a binary mask that produces an optimized diffraction pattern for a DRAM isolation level.
Figures 8, 9:
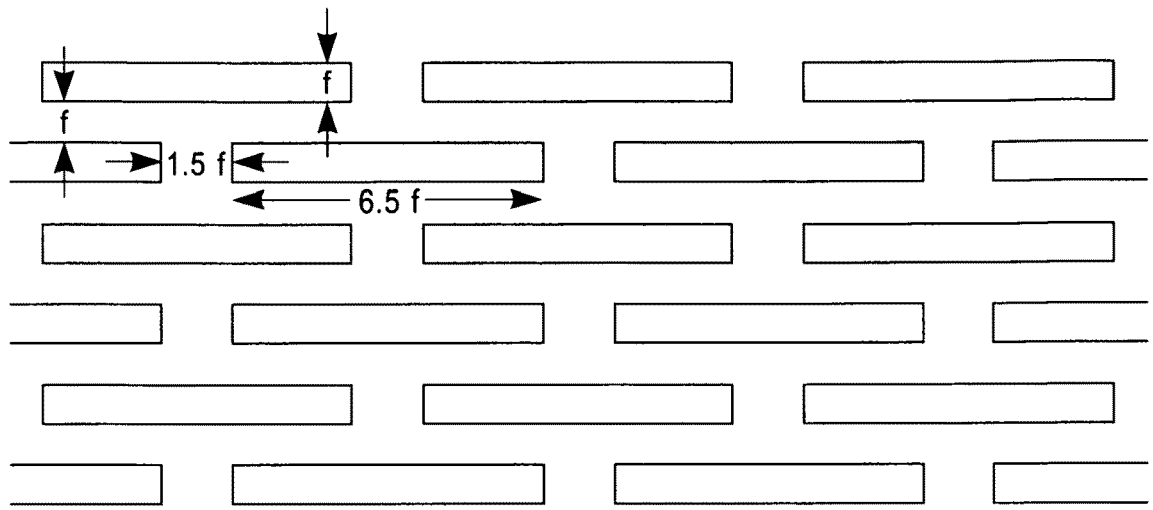
FIG. 8 shows a DRAM isolation pattern used as an example to explain the present method.
FIG. 9 shows a diffraction pattern that has been optimized to print the FIG. 8 isolation pattern.
Figure 11:
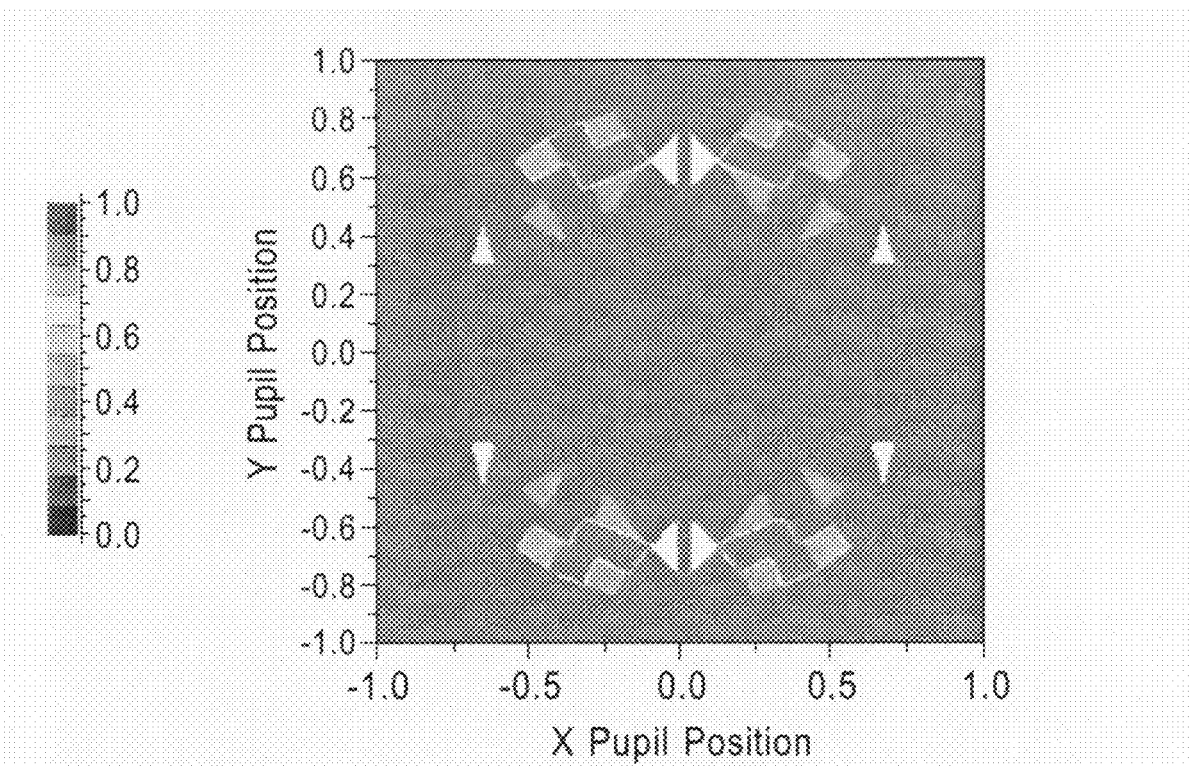
FIG. 11 shows an optimized source for mask that produces the FIG. 9 wavefront.

We now explain the procedure summarized above in more detail, using as an example a DRAM pattern that is to be printed at NA=0.68 nm and λ=248 nm (FIG. 8). The methods of Rosenbluth et al. show that this pattern is printed with optimum process window if the optimized source of FIG. 11 is used together with the optimized mask wavefront of FIG. 9. The known (non-manufacturable) FIG. 7 mask successfully produces this optimized wavefront; we now show how the present method can produce the same wavefront using a mask that is manufacturable.

The first step of the method is to lay out a set of Manhattan gridlines with a uniform (coarse) spacing. (Later the spacings are made to vary.) The initial spacing should very roughly match that expected for typical fragment-lengths in the final mask, and should be at least 2 or 4 times the minimum allowable fragmentation length. The symbol α is used to denote the average separation between gridlines, expressed in units of λ/NA. Appropriate choices will vary with the mask technology being practiced; reasonable values are e.g. 30 nm or 0.15λ/NA, as we now explain in more detail.

It is convenient, though not essential, to round the initial α in such a way that the initial gridline separation evenly divides the mask region under consideration. The grid size must be chosen smaller than 0.25λ/NA to ensure that the desired diffraction pattern can be created, but use of excessively small fragments will make the mask harder to fabricate, e.g. one should usually choose α greater than or not appreciably smaller than 0.1.

On the other hand, choosing α very close to the sampling-theorem limit will slow convergence, particularly when the illumination has a significant spread off-axis, i.e. one should usually choose e.g. α is typically less than or not appreciably larger than 0.2.

We will return below to the considerations involved in choosing the initial value of α, where we show that α values in this range are suitable for efficiently forcing (after just one iteration) a majority of transmission discontinuities across gridlines in the working mask to take on supported values (including zero). For our demonstration problem we will choose an initial grid spacing of 0.15λ/NA ≅55 nm.

It should also be noted that our preferred embodiment, which is based on gridlines that span the entire field, is not ideally suited to very large cells. The method can be modified to use e.g. four separate blocks of gridlines each covering one quadrant of the field. This might be appropriate if 100λ/NA is typically less than or not appreciably larger than $P_x P_y$.

For good understanding, PxPy is the product of the cell size along the x axis and the cell size along the y axis. For such large fields the nonlinearities of the method will also slow down the solution, and it can be preferable to solve the problem separately in each of a number of subdivisions of the original field, and then stitch the different solutions together. This can be done whenever the original field size is appreciably larger than the lens resolution (see below).

For symmetric patterns like our demonstration DRAM cell, each rectangle contributes to the {n,m} Fourier order an amplitude proportional to:

$$\Delta A_{i,j}(n, m) \propto [x_{i+1} - x_i][y_{j+1} - y_j]\operatorname{sinc}\left(\frac{\pi n[x_{i+1} - x_i]}{P_x}\right)\operatorname{sinc} \quad [1]$$
$$\left(\frac{\pi n[y_{j+1} - y_j]}{P_y}\right) \times \cos\left(\frac{\pi n[x_{i+1} + x_i]}{P_x}\right)\cos\left(\frac{\pi n[y_{j+1} + y_j]}{P_y}\right),$$

where the rectangle falls between x gridlines i and i+1, and y gridlines j and j+1 (referred to as "rectangle [i,j]"). General nonsymmetric patterns can be handled using the polygon Fourier transform formulas given in C. P. Ausschnitt, R. L. Gordon, C. J. Progler, and A. E. Rosenbluth, "Integrated lithographic print and detection model for optical CD," U.S. Pat. No. 6,869,739 (2005); see also R. L. Gordon and A. E. Rosenbluth, "Lithographic simulations for the 21st century with 19th Century Tools," in SPE v.5182: Wave-Optical Systems Engineering II, ed. Frank Wyrowski (2003), p. 73.

$P_x$ and $P_y$ are the x and y periodicities of the overall field. Note that under the staggered symmetry of this DRAM layout, the rectangular optical unit cell has twice the area of the true diamond-shaped "crystallographic" period, which is stepped out along diagonal basis vectors. This doubling, together with the pattern's bilateral symmetry across the x and y axes, means that one octant of the optical cell is sufficient to define the remainder of the pattern. Note that in treating the field as periodic we are implicitly making an assumption here that the exit pupil wavefront has been specified by tabulating its value at a discrete set of points (on a 2D grid). Such a discrete tabulation amounts to an automatic assumption of nominal periodicity, and is commonly made in lithographic simulations. On the other hand, if the wavefront is continuous, the scale of its most rapid variations will define a maximum image field size (which would usually be known independently from the nature of the problem). The mask region can then be made periodic by adding a small buffer zone (guard band) to this bounded field (scaled to the object plane) and then digitally sampling the wavefront; such a step is equivalent to sampling the wavefront on a grid that is finer than the most rapid wavefront variations. When the true circuit pattern is not periodic one must ensure that the guard band is larger than the lens resolution.

In cases where the wavefront is specified for a very large field it may be faster to divide the mask field into separate sections whose features are solved for separately, and then stitched together. To isolate a small mask region in the wavefront one convolves the full wavefront with an appropriate sinc function (to blank out the image field outside the region of interest, allowing for a small buffer zone), and then resamples the wavefront with the appropriate coarse grid. A point to consider here is that the FIG. 10 algorithm in its standard form will maximize the intensity of each mask region, opening up the possibility of a dose mismatch after stitching. One way to handle this is to add a postprocessing step in which the gridlines or feature edges in each segment are readjusted to match the intensity (e.g. in the reference order) of the dimmest mask section obtained. If this is contemplated one might reduce parameter α slightly to provide additional degrees of freedom. Another way to match doses during stitching is to include fixed anchoring patterns at the boundaries of the variable grid when the algorithm is started on a particular section. This is done after an initial run to determine the dimmest mask section. The other mask sections are then rerun (with slightly larger buffer zones) beginning with sections adjacent to the dimmest section. Border features from the dimmest section, of size larger than the lens resolution, are included as anchoring features when the adjacent sections are solved, but these anchor features are not adjusted. Since the FIG. 10 algorithm will then provide the correct wavefront shape from regions that include anchored areas (of fixed contents) that are larger than the lens resolution, the algorithm must also provide the correct intensity in the wavefront, since the adjustable part of the mask field is too far away to provide additional light to the entire anchored area of the image, whose intensity is thus fixed, assuming that an exact match is made to the diffraction orders of the full field.

These stitching methods (gridline adjustment, edge adjustment, or anchoring features) can also be used to match doses from mask regions that are not adjacent. In such cases the anchoring features must be spaced away from other features by a distance larger than the lens resolution.

Eq. [1] is written as a proportionality because it does not include the actual transmission assigned to the rectangle. The total amplitude in a particular order $\{n,m\}$ is given by the sum of the transmissions assigned to each rectangle when weighted by the eq. [1] coefficients:

$$A(n, m) - A_{back}(n, m) = \sum_{i,j} (t_{i,j} - t_{back}) \Delta A_{i,j}(n, m), \quad [2]$$

where $t_{i,j}$ is the amplitude of rectangle [i,j], $t_{back}$ is the background transmission, and $A_{back}$ is the fixed background amplitude. Thus, the Fourier amplitude is given by an expression that is linear in the mask amplitudes.

The FIG. 9 prescription defines the desired diffraction pattern for our sample problem using the $\{n=2, m=0\}$ diffraction order as a normalizing reference. Thus, when the linear Fourier amplitude expression for the $\{2,0\}$ order is multiplied by any numerical entry from the right column of FIG. 9, the result must match the Fourier amplitude expression for the corresponding order in the left column, i.e.

$$A(n, m) = N_{n, m} A(r_x, r_y), \quad [3]$$

where $N_{n,m}$ is the normalized target amplitude for order $\{n,m\}$, and $\{r_x, r_y\}$ designates the reference order, $\{2,0\}$ in our example.

According to eqs. [2] and [3] our requirement that the mask produce the required diffraction pattern can be expressed as a list of constraints that are linear in the rectangle transmission values. The rectangle transmissions must also be constrained to lie within the range available in the mask technology of interest. One cannot expect, however, that with our initial choice of gridline positions it will be possible to achieve the desired order amplitudes using only the discrete transmission values that are allowed.

We can force as many rectangles as possible to the extreme allowed transmission values by maximizing the intensity of the diffraction pattern (while preserving its shape as specified in FIG. 9). Though intensity is quadratic in the mask variables, we are fixing the shape of the diffracted wavefront, hence intensity is maximized whenever a positive-specified order amplitude is maximized, or when a negative-specified amplitude is minimized. (Complex amplitudes can be handled by e.g. maximizing the real part of an order amplitude when the real part is specified to be a positive number relative to the reference order, with similar rules for negative or imaginary parts.) Thus, in the FIG. 9 example, the intensity of the diffracted wavefront can be maximized by minimizing the amplitudes of the $\{0,0\}$, $\{1,1\}$, $\{3,1\}$, or $\{4,0\}$ orders, or by maximizing the amplitudes of the $\{0,2\}$, $\{2,0\}$, $\{2,2\}$ or $\{5,1\}$ orders.

Thus, if we had the luxury of being allowed to individually set the transmission of mask rectangles to arbitrary gray levels between the supported extremes (e.g. between $-1$ and $+1$ in a chromeless or Levenson mask, or between $-(0.06)^{0.5}$ and $+1$ in an attenuated phase-shift mask), the problem of maximizing diffracted intensity while achieving the desired wavefront shape would be a linear one. In other words, because our constraints on wavefront shape allow a linear amplitude objective to be substituted for our quadratic intensity objective, and since these constraints are themselves linear (as are the constraints limiting transmission to the range supported by the mask technology), we could treat the entire problem as linear if graylevel blocks were allowed. This in turn would mean that the problem could be solved globally (and rapidly) by standard linear programming routines (and a feasible solution can be obtained by simple Fourier transform if continuous variation were manufacturable). Unfortunately, arbitrary transmittances aren't supported in practical lithographic mask technologies, where each transmittance level other than that of background requires the patterning of a separate film which must dedicated to that gray level.

However, we can force the majority of the rectangles to have transmittance matching one of the supported limits by properly choosing a when we maximize the amplitude of one of the orders (i.e. as explained above, an order whose normalized amplitude is positive relative to the reference, or when we minimize the amplitude of a negative-specified order). The underlying reason for this forced conformance is that the amplitude is in itself an unbounded function of the rectangle transmissions—So long as each rectangle has finite area, increasing or decreasing its transmission will monotonically either increase or decrease the amplitude of the chosen diffraction order. It is only the constraints of the problem that prevent further increases after a solution is reached.

Thus, when we find a solution to our problem of maximizing diffracted intensity by maximizing or minimizing a particular order chosen as objective, the finite amplitude that we actually achieve for the order will be bound entirely by the constraints of the problem, which means that the number of constraints that are made binding ("activated constraints") must equal the number of transmission variables that can be adjusted. We will now show how to ensure that most of these binding constraints are constraints on maximum and minimum rectangle transmittance, thus forcing most rectangles to one of the bounding (and supported) transmission limits when these constraints are activated.

Figure 12:
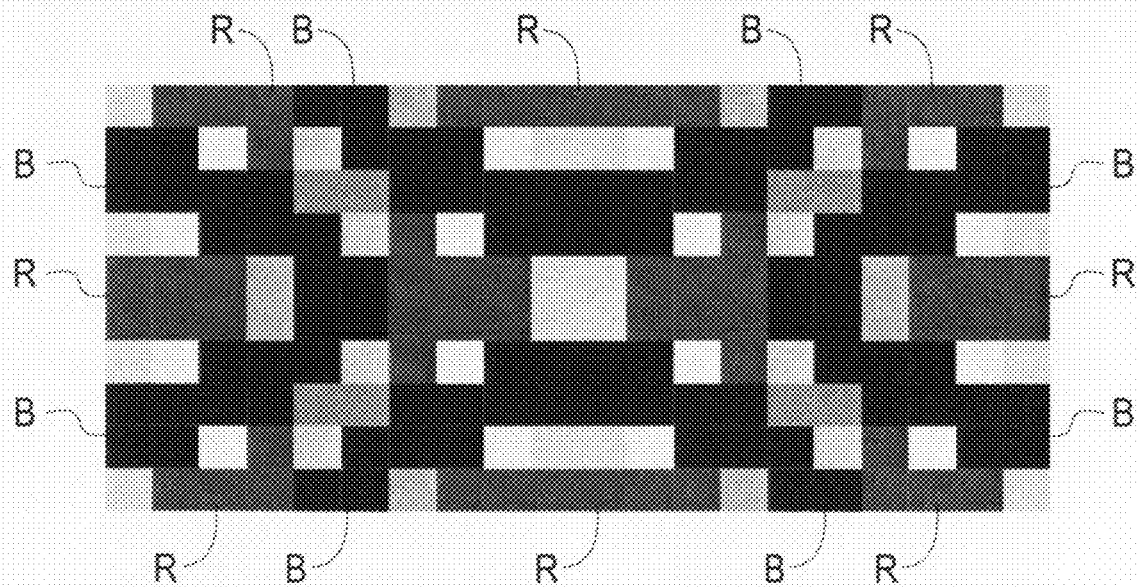
FIG. 12 shows a working graylevel mask design for FIG. 8 isolation pattern.

FIG. 12 shows a working graylevel mask design for FIG. 8 isolation pattern; this (non-manufacturable) mask will maximize diffracted intensity. A grid spacing of $\alpha=0.15$ has been chosen. Note the rough similarity to FIG. 7. The target mask technology is binary, with allowed transmissions of $+1$ and $-1$. Rectangles that have been successfully driven to a transmittance of $+1$ are shown as full red (indicated in FIG. 12 as "R"), while $-1$ rectangles are shown as full blue (indicated in FIG. 12 as "B"). A minority of rectangles must be adjusted to intermediate graylevel transmittances in order to achieve the wavefront shape specified in FIG. 9; these are shown in intermediate shades. The minority of blocks cannot be fabricated with the specified mask technology, and don't show the full transmission discontinuity $\Delta t=2$ against adjacent rectangles. However, the above working mask design is developed into a successful solution during later steps of our mask design algorithm, see text. Even after the first step shown above, 63% of the transmission discontinuities across gridline sections have been made consistent with the fabrication technology, i.e., Δt across 63% of the sections is 0 or 2.

Figure 13:
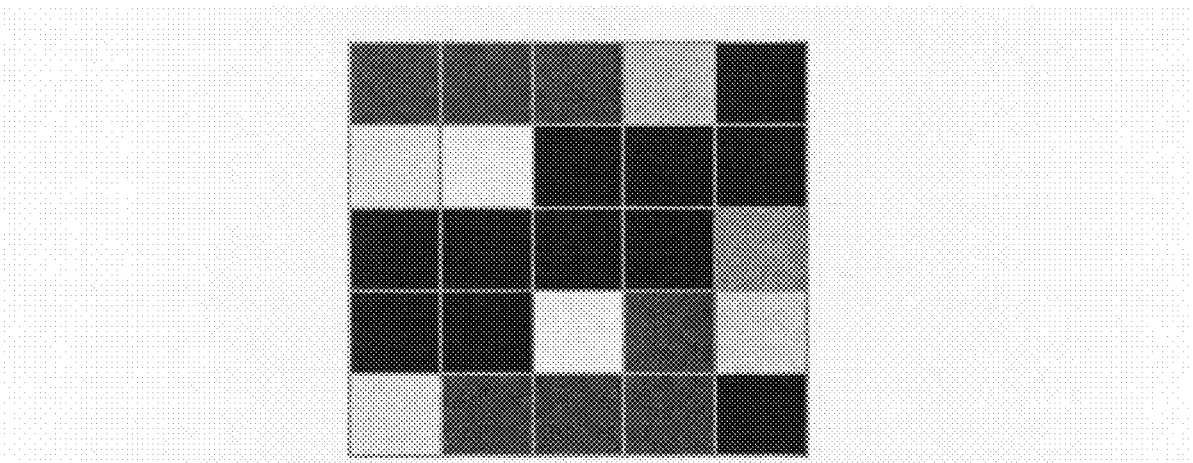
FIG. 13 shows one octant of the FIG. 12 mask, along the top edge, to the right of the centerline.

FIG. 13 shows one octant of the FIG. 12 mask, along the top edge, to the right of the centerline. Rectangular gridlines are shown explicitly. The optical period of this DRAM level is quite large in λ/NA units (see text), corresponding in area to two circuit features; however pattern symmetry strongly limits the independently adjustable area. Corresponding behavior is seen in the pupil domain, where half the orders have zero amplitude, and the others exhibit fourfold symmetry. (FIG. 9 lists the independent set.)

The directional separation between diffraction orders will be $\lambda/P_x$ or $\lambda/P_y$. The number M of collected orders will then satisfy (approximately):

$$M \cong \frac{\pi NA^2 (1+\sigma_M)^2 P_x P_y}{\lambda^2}, \quad [4]$$

where $\sigma_M$ is the maximum relative obliquity of the illumination within the pupil ("maximum pupil fill"). The number of transmission variables L will equal the number of mask rectangles formed by the gridlines. Since the average grid separation is αλ/NA, we have $$L \cong \frac{NA^2 P_x P_y}{\alpha^2 \lambda^2} \quad [5]$$

When we maximize intensity we require that all orders stand in a specified ratio against the reference order; this requirement represents M−1 constraints. We have seen that a total of L constraints must be activated (i.e. made binding) by the maximization. All M−1 amplitude constraints must be binding when the correct wavefront shape is achieved; the remaining L−M+1 binding constraints must come from the remaining constraints of the problem, namely those requiring that the rectangle transmittances fall within the range supported by the mask technology. Thus, the fraction f of the rectangles that is successfully driven to supported transmission limits is $$f = \frac{L-M+1}{L} \cong 1 - \frac{M}{L} = 1 - \pi\alpha^2(1+\sigma_M)^2 \quad [6]$$

according to eqs. [4] and [5]. (One qualification here; for a Levenson trinary mask we would add a constraint that the sum of the absolute values of the transmittances be limited, in order to force a separation between some +1 and −1 regions. [Such a constraint can be linearized.] The number of binding transmission constraints is changed slightly in this case, but the basic point that most rectangles achieve supported transmissions remains valid.) If α is chosen according to the criteria described above, f will be greater than 0.5, so that most of the rectangle transmittances will take on supported values. Eq. [6] indicates that smaller values of o should preferably be chosen when $\sigma_M$ is large, though the appropriate shrinkage is actually less than quadratic.

Thus, the initial intensity maximization step generates a mask whose transmittance over the majority of its area is supported by the nominal mask technology. (Note that at this point some aspects of the pattern may be invalid for other reasons; see below. Transmission discontinuities due to EMF are likewise not yet corrected.) This can be seen for our sample problem in FIG. 12.

Note that the eq. [6] ratio can be maintained even if symmetry reduces the number of independent collected orders, since under conditions of symmetry one would reduce the mask field to include only the portion that can be set independently under the symmetry. For example, in our DRAM example one octant of the (large) optical period constitutes such a portion (with the bilateral symmetries about x and y and the staggered symmetry each contributing a factor of 2); see FIG. 13.

One other point should be mentioned here—It may not be possible to generate a particular arbitrary wavefront unless the mask technology supports some form of phase-shifting (e.g. Levenson, attenuated-PSM [attenuated "phase-shift-mask"], chromeless). For example, a specified diffraction pattern cannot be generated with a classical non-phase-shifting chrome mask unless the zero order is brighter than all the other orders. The linear programming step in our procedure would flag this when presented with such a case (i.e. it would indicate that no solution can meet the constraints). However, whenever the wavefront is feasible for non-phaseshifting masks our procedure will be able to carry out the design.

The rectangles in the FIG. 12 solution that achieve the binding +1 transmission are all contiguous, likewise for the rectangles that have reached the −1 transmission limit. The reason for this can be understood by considering a hypothetical contour plot over the cell area of the "intensity" penalty involved in switching the polarity of a single bound rectangle at each mask position within the cell (in each case optimally re-adjusting the other rectangle transmittances to maintain wavefront shape). We expect this penalty to typically be largest at local maxima (in absolute value) of the bandlimited mask transmission as filtered by the lens (including the NAs of both the illumination and collection pupils). Alternatively, we can discuss the behavior of the algorithm by supposing that we have prepared a plot of the penalty imposed on the order amplitude that has been chosen as the objective function during intensity maximization, expressed per unit of impulsive amplitude change at any point (the penalty being negative when the amplitude change is negative, making the penalty a signed quantity). The positions at which our intensity maximization routine will place those rectangles whose transmission must be detuned from a binding limit will all lie on the contour of minimum sensitivity in such a plot, since this allows wavefront shape to be achieved with minimum impact on intensity. The scale at which this sensitivity function varies is determined by the scale lengths at which the collected diffraction orders oscillate across the mask plane, and the most rapidly varying of these essentially determines the lens resolution. Thus, each "lobe" of the sensitivity function that lies within a single loop of the minimum sensitivity contour will have a size of ~½ the lens resolution (to order of magnitude). [The individual features of the known FIG. 7 solution can be thought of as the pedestals of these lobes.] Rectangles that lie mostly within the interior of a lobe will have a transmission at one of the extreme supported limits, while the M−1 rectangles with unsupported transmissions will be distributed around the boundaries of the lobes. The rectangles clustered within the interior of a lobe will show no discontinuity across the gridlines between them, whereas larger discontinuities will be present at the boundaries of the lobes, in many cases reaching one of the discontinuities allowed in the mask technology.

We now consider the next (key) step of the method. Because of our initial choice of α, the M−1 rectangles whose transmission remains unsupported will be subresolution in size. This means that if we split one of these rectangles into two rectangles whose average transmission matches that of the parent, the diffracted wavefront will be almost unchanged in the collected orders. Recall that during the initial intensity maximization the transmission of the parent rectangle (which we will denote $t_0$) has been forced to lie between two supported transmissions, for example $t_{max}$ and $t_{min}$; this means that we can set the transmission of the two daughter rectangles to $t_{max}$ and $t_{min}$ while providing the desired average transmission of $t_0$ if we divide the parent rectangle into areas having ratio $(t_{max}-t_0)/(t_0-t_{min})$. Such an area division represents one strategy for (almost) completing the determination of a feasible mask—Every remaining rectangle of intermediate transmittance could simply be subdivided in this way. The result would come quite close to providing the correct diffraction pattern. However, such a solution would contain a larger number of fragments than necessary, and in some cases the small fragments could have a completely unsupportable topology, i.e. as very small gaps separating two features of the same polarity.

Figure 14:
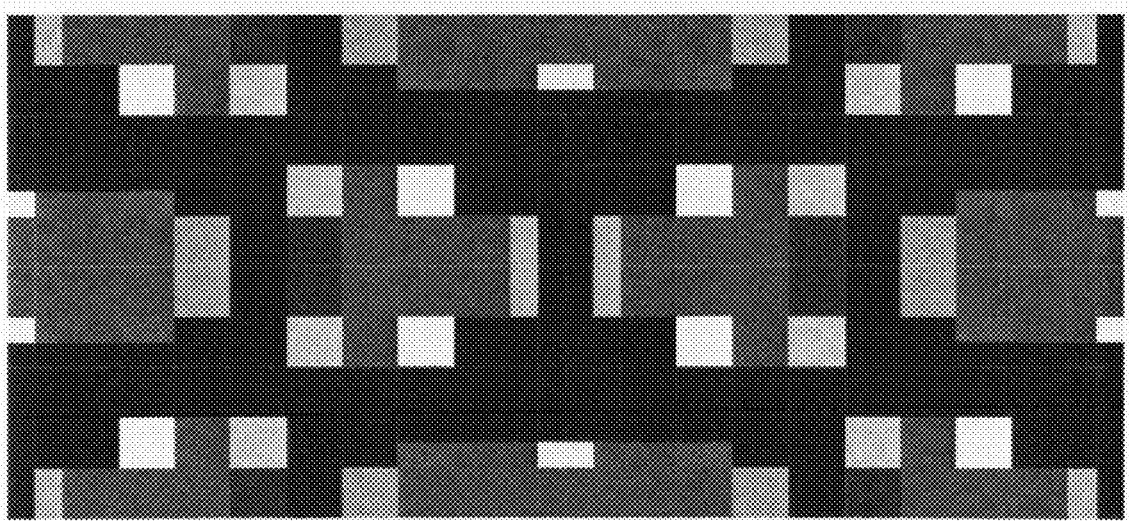
FIGS. 14-22 show various results of sample solutions that illustrate various aspects of the present method.

To prevent such problems we choose the more robust approach of evenly bisecting the blocks of unsupported transmission that lie within the same row or column by inserting a single new gridline through the row or column in question (thus adding this gridline to the variable grid). The gridlines are inserted to evenly split all rectangles within the row or column. The newly created rectangles do not have their transmissions immediately reset at this point; instead, the rectangle transmissions for the entire revised grid are recalculated by re-running the intensity maximization algorithm. FIG. 14 shows the result of re-maximizing intensity in the FIG. 12 mask after bisecting those rows and columns which contain many rectangles having unsupported transmission values. In this case one row and one column in each octant have been bisected. Note that, compared to the FIG. 12 mask, a much greater fraction of the mask now has transmission values that are supported in the fabrication technology, and that the transmission of most other rectangles comes somewhat closer to supported values.

To avoid undue fragmentation of the mask patterns it is preferable that one only inserts new bisecting gridlines down a carefully selected minority of the rows and columns of the array, namely those rows and columns which contain the largest number of rectangles having unsupported transmission values. Our even bisection of the row or column makes the smallest of the resulting daughter rectangles as large as possible; nonetheless, if the algorithm has been run for more than one iteration (see below), it is possible that certain rows or columns would be left with unacceptably small daughter rectangles after bisection. This would usually depend on whether or not the row or column contains very narrow rectangles whose transmission has already been set to a supported value, and which lie between rectangles of opposite polarity. Such rows and columns should not be considered for bisection. On the other hand, rows containing rectangles with "touching corners" (e.g. rectangles touched at a corner by a rectangle of the same polarity but adjacent along the two gridlines that cross at the corner to rectangles having another polarity) should be given extra priority for bisection. Otherwise, rows and columns should be considered for bisection on the basis of whether or not they contain more rectangles with unsupported transmissions than other rows and columns. As a rough rule of thumb, the total number of graylevel rectangles in the rows and columns selected for bisection by the newly inserted gridlines (allowing rectangles to be counted twice) should preferably be between about M/2 or M; this can be used as a criterion for choosing the number of rows and columns to be bisected. Our method is most efficient when rectangles having unsupported transmissions are distributed in such a way that a small number of inserted gridlines can bisect a large number of rectangles. Fortunately, such distributions tend naturally to occur because the patterns involved are non-random, causing the rectangles in question to be non-uniformly distributed, i.e. clustered to some degree into a few rows and columns. To help ensure such an outcome one would want to avoid choices for $\alpha$ that cause the number of graylevel rectangles to be far lower than the number of available rows or columns. According to eqs. [4] and [5], taking into account the strong clustering of unsupported rectangles that is found in practice, we would prefer to avoid conditions where $$\alpha << \frac{\lambda/NA}{\pi\sqrt{P_xP_y}\,(1+\sigma_M)^2} \quad [7]$$

Even with small fields $\sim\lambda$/NA, such a situation could only be the result of choosing an overly fine initial fragmentation (and for such small fields and fine fragmentations it would not even be particularly important that the algorithm be efficient).

After bisection, the intensity maximization algorithm is run again, which causes many of the newly formed rectangles to be set to allowed transmission values. In addition, the M−1 rectangles that need to be adjusted away from these values in order to meet wavefront constraints will now tend to have transmissions that at least come closer to supported values, because during the second intensity maximization there are more adjustments available to the algorithm in the specific regions where shape-adjusting transmission changes are most effective. Moreover, the rectangles that are adjusted away from allowed values will often have half the area as in the previous maximization.

The result of the re-maximization for our sample problem is shown in FIG. 14.

At this point it is sometimes possible to complete the solution by rounding all rectangle transmissions to the nearest supported value, and then adjusting all grid separations (gridline positions) using a local optimizer. Since the gridlines span the full length or width of the independent field, the shape-handling constraints for this optimization can be quite simple. For example, two gridlines that contain between them a feature of one polarity which separates rectangles of another polarity should not be brought closer together than the minimum linewidth or spacewidth permitted by mask groundrules, though some violation may be permitted prior to the step of edge optimization. Rectangles that are attached to another feature along a single narrow edge (i.e. rectangles that are essentially serifs) cannot have too long an aspect ratio across the other dimension; such situations imply a constraint on the separation of the associated gridlines.

However, there is one kind of shape constraint that cannot be dealt with using simple gridline constraints, namely a requirement that the mask not contain rectangles with "touching corners" (see above).

To eliminate touching corners we need to modify the rounding step. We continue to round-off all rectangles whose transmissions are close to supported values; for example, all rectangles whose deviation from the nearest supported value is less than half the deviation from the next closest supported value. Touching corners involving any of the rounded rectangles are removed by rounding one of the rectangles to a different allowed value (revising whichever one produces the least increase in wavefront error). If this preliminary rounding of graylevel rectangles having near-valid transmissions leaves more than, for example, 10 unrounded rectangles, the rounding criterion is broadened to reduce the number of unrounded rectangles.

Next, all combinations of polarity choices for these unrounded rectangles are considered. Each combination can be evaluated very rapidly, so that for e.g. a binary mask $2^{10}=1024$ combinations are easily handled. Combinations that include rectangles which touch at corners are excluded from the evaluated set. Rounding combinations that provide relatively poor matching to the wavefront shape are excluded; for example the least accurate 50% of the possible combinations. From among the remaining combinations one can select the particular combination that has the fewest right-angle polygon corners; this option is aimed at achieving the simplest possible mask shapes. The assessment criterion here is essentially the total number of shape corners, considering that internal gridline intersections within the larger shapes formed by the rectangles should be ignored, along with gridline intersections that lie along the straight edges of the larger shapes; only true corners are counted.

Once the optimal rounding combination is chosen, the algorithm optimizes the gridline separations as described above. This gridline optimization step may fully solve the problem; in such cases it can completely cancel the effect of rounding error and thus achieve the desired wavefront using a manufacturable mask pattern. That is the case with out test problem, as shown in FIG. 15.

Figure 15:
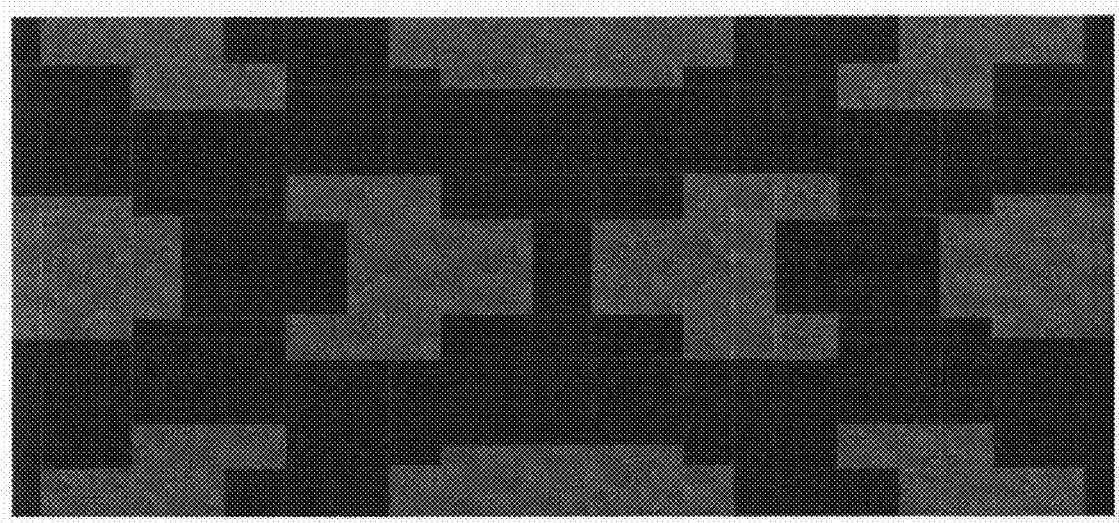

FIG. 15 shows the final chromeless mask solution obtained by applying rounding steps and optimization of gridline placement to the FIG. 14 working solution, as described in the text. Amplitudes prescribed in FIG. 9 are achieved exactly.

Other methods for rounding can be adopted, such as error diffusion, in which any error (area-weighted) that arises when a rectangle's transmission is rounded gets subdivided and distributed among adjacent rectangles that have not yet been rounded. Since the rectangles are subresolution this allows rectangles to partially compensate each other's rounding error.

When an exact solution is not achieved by gridline optimization, our procedure follows one of two paths. If the maximum error in any of the orders is less than about 0.3 (on a scale where the average order amplitude is about 1), the algorithm attempts an exact solution by optimizing each edge location independently, no longer requiring the edges to lie on common gridlines. This optimization can be attempted with constraints that enforce manufacturability. The remaining error in the wavefront is now so small that we have a reasonable chance of rapid convergence using only very small movements of the edges off the former gridlines.

Figure 10:
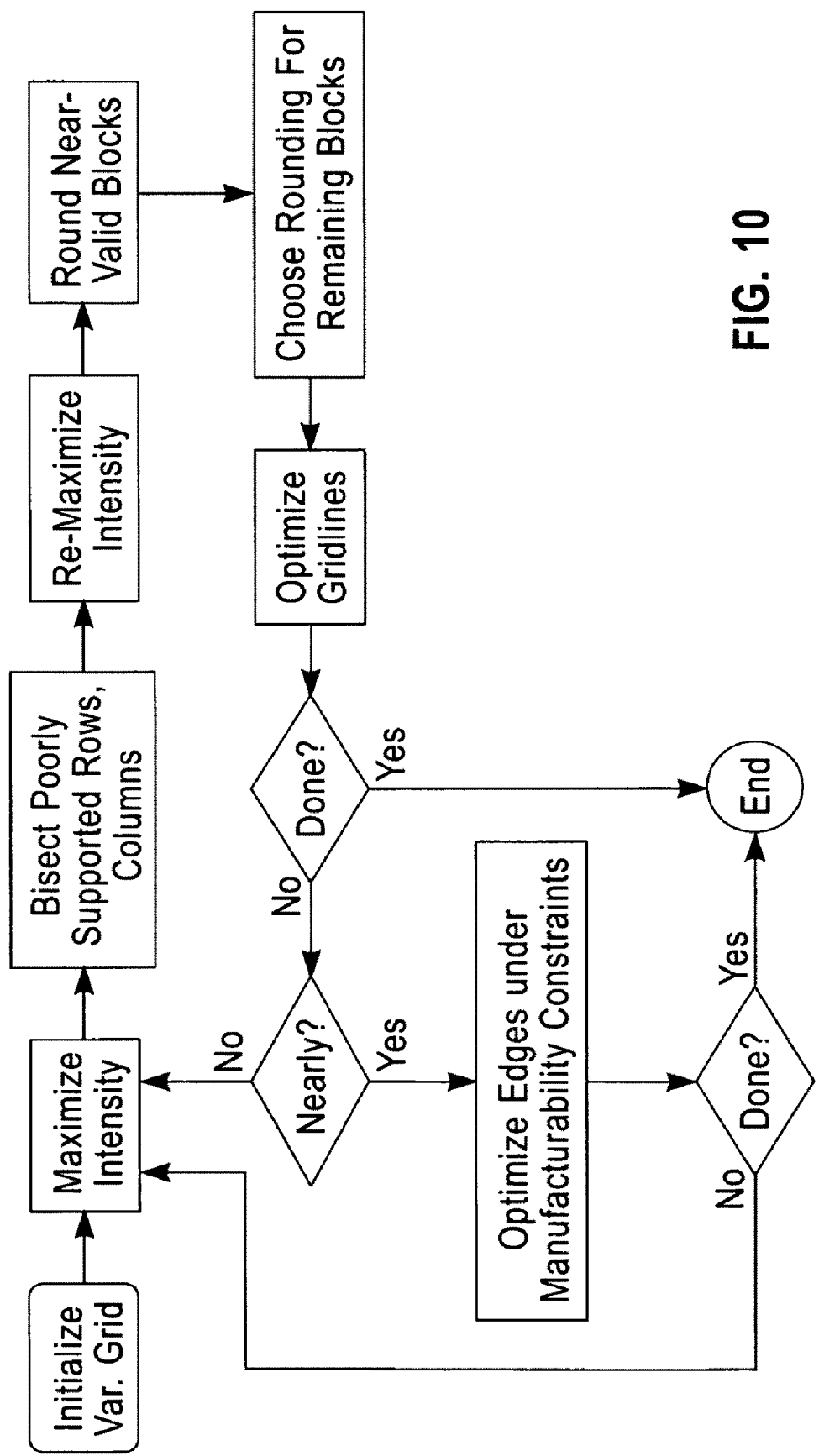
FIG. 10 shows a flowchart summarizing a preferred embodiment of the mask design algorithm.

If the residual wavefront error is larger than about 0.3, or if the optimization against edges does not converge (or does not converge rapidly), then the algorithm simply runs through another iteration of the above variable grid steps (i.e. intensity maximization, bisection, re-maximization, rounding, and gridline optimization); see the FIG. 10 flowchart. Another alternative, though not the preferred embodiment, is to optimally divide each unrounded rectangle arising during the second iteration with an independent edge, as opposed to evenly bisecting all such rectangles in particular rows or columns using field-spanning gridlines. As noted earlier, such an approach could lead to excessive fragmentation if employed during the first iteration, but is more reasonable in later iterations.

We can use our test problem to illustrate these two alternative algorithm paths by deliberately operating the earlier stages of the algorithm using inappropriate parameters. We will choose an overly coarse initial gridline spacing (of $\alpha=0.26$), and we will insert too few new bisecting gridlines, so that fewer than M/2 of the rectangles having unsupported transmissions will be intercepted. (To be specific, we will add only one bisecting gridline instead of two.) When the algorithm is run in this way we obtain the working solution shown in FIG. 16.

Figure 16:
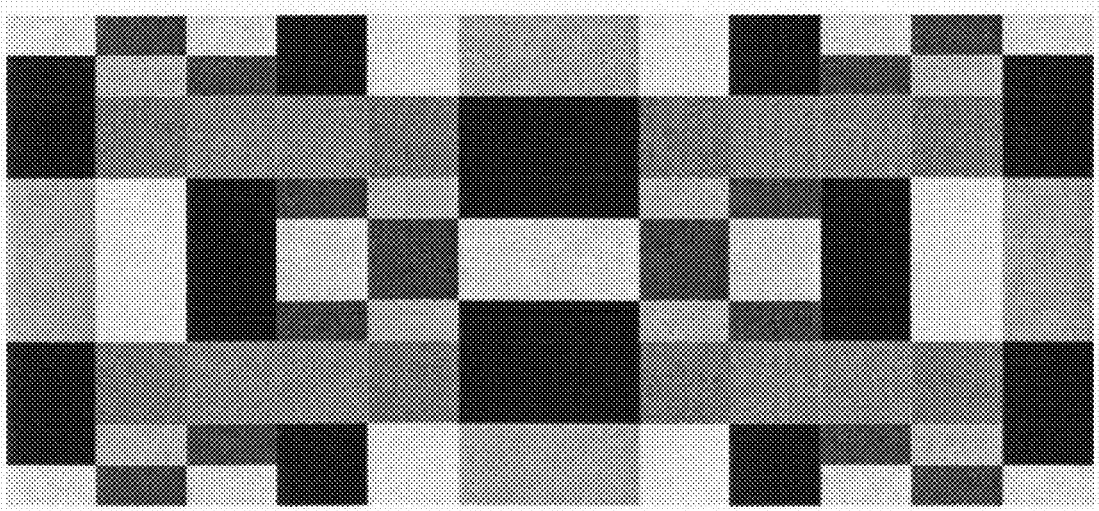

FIG. 16 shows intermediate results for the FIG. 8 problem when the algorithm is deliberately run with inappropriate parameters. This is done to explore algorithm performance when convergence is slow, see text. Algorithm has been run with overly coarse initial grid spacing, and with too few row, column bisections. Working mask is shown after second intensity maximization, same stage as FIG. 14.

Figure 17:
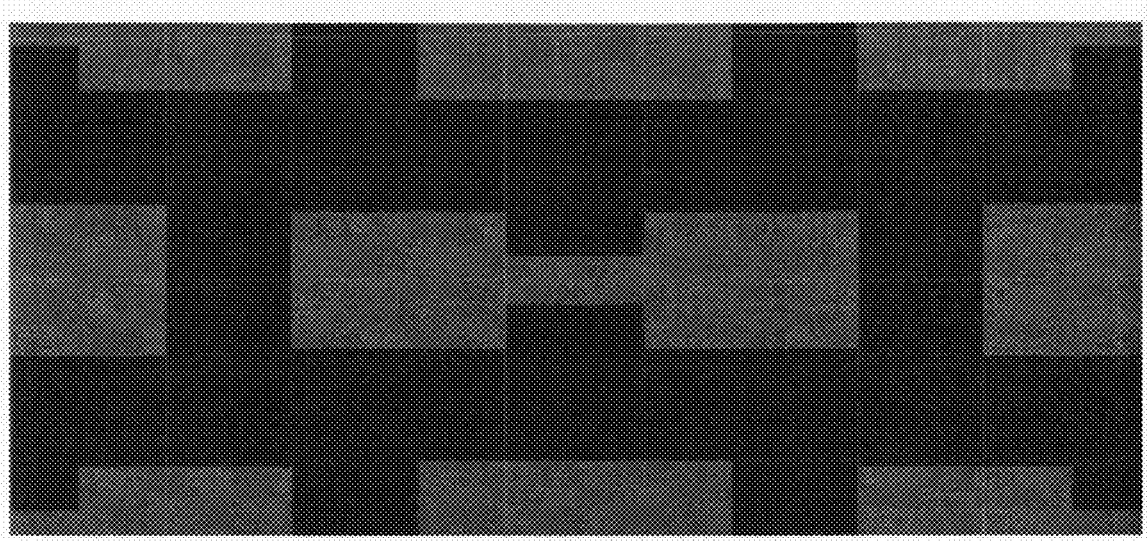

Continuing through the steps of the method, we next round the transmissions of the FIG. 16 rectangles using the combinatorial procedure described above, and then optimize the gridline positions; this provides the intermediate solution shown in FIG. 17.

FIG. 17 shows the result after one stage of main loops when running the FIG. 8 problem using inappropriate parameters (to test the algorithm when convergence is slow). The FIG. 16 solution has now been further developed to the stage where gridline separations (but not corners) have been optimized. This immediate solution has not yet achieved the wavefront prescribed in FIG. 9; the maximum amplitude error is about 0.9.

Figure 18:
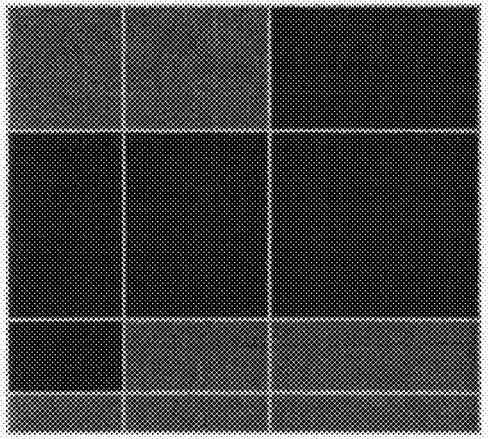

FIG. 18 shows one octant of the FIG. 17 mask, along the top edge, to the right of the centerline. Rectangular gridlines are shown.

The FIG. 17 intermediate solution fails to achieve the FIG. 9 target amplitudes; the maximum error is about 0.9, and the Root Mean Square (RMS) error about 0.5. When the residual error from an intermediate solution is as large as this, the algorithm of the preferred embodiment will cycle the intermediate solution in a second pass through the earlier steps of the procedure of FIG. 10. However, we can explore the robustness of the method by instead attempting an optimization of individual feature edges. The solution obtained by this choice FIG. 19 actually succeeds in achieving the prescribed amplitudes. However, the edge positions have had to shift very substantially during the optimization, and have reached a configuration that would be somewhat difficult to fabricate, because the "vertical bars" on the "T" features have a long aspect ratio yet are quite narrow.

Figure 20:
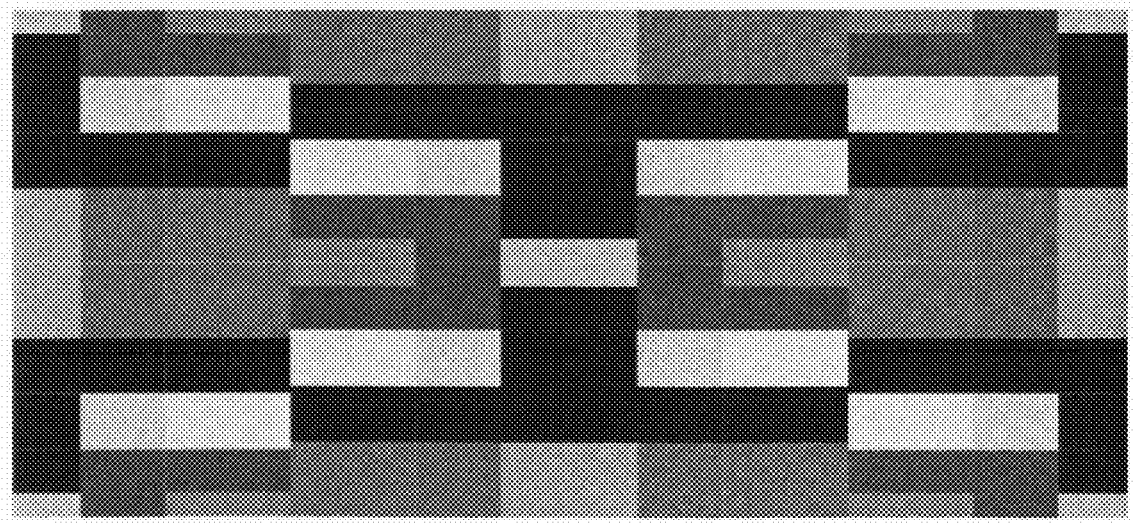

Given the large errors in the FIG. 17 solution, the algorithm should properly have taken another iteration through the maximization and bisection steps, rather than carrying out an optimization of the feature edges. FIG. 20 shows the result of this 2nd iteration, which remains non-standard due to earlier steps in the example. Further, to maintain consistency with FIG. 10, the iteration has again been carried out using an inappropriately small level of bisection, i.e. as before only one row or column has been bisected. Next, the algorithm applies rounding and optimization of gridlines and edges to the FIG. 20 solution, achieving the successful result shown in FIG. 21. Even though the procedure has been run with non-optimal parameters, a reasonable solution has been obtained.

Figure 19:
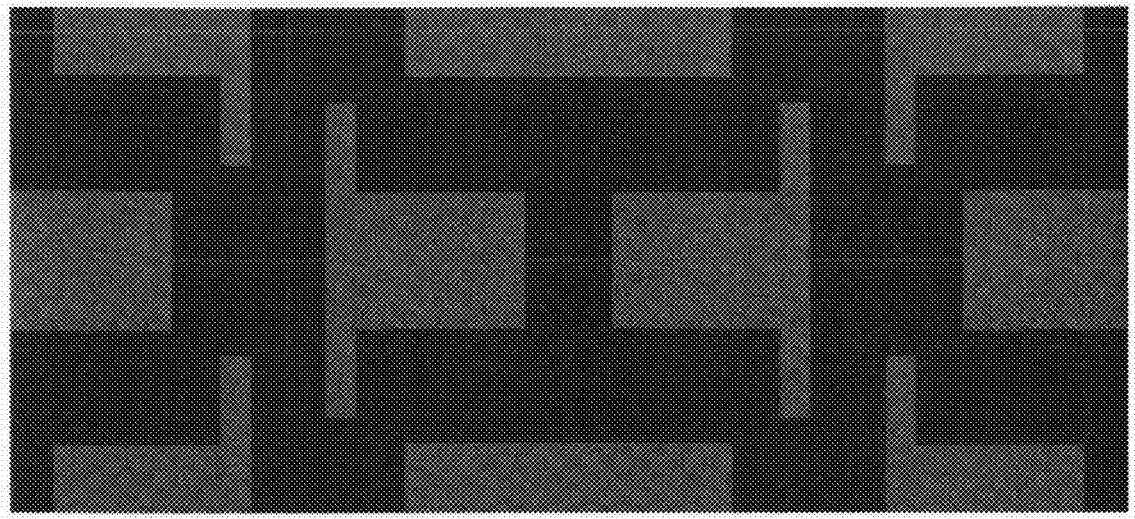

Referring now to FIG. 19, the poor convergence of the FIG. 17 solution would normally call for a second stage of intensity maximization and grid bisection, but to explore algorithm behavior we have attempted an optimization of individual feature edges, as shown here. This solution succeeds in achieving the FIG. 9 amplitudes; however the feature edges have moved quite far from their FIG. 17 initial positions, into a configuration that would be somewhat difficult to fabricate, due to the narrow (31 nm) vertical bars.

FIG. 20 shows the working mask solution obtained after cycling the FIG. 18 gridlines through another iteration of intensity maximization, bisection, and re-maximization. This second iteration is the appropriate path for the algorithm, given the poor performance of the FIG. 17 gridline optimization. However, during the steps of this second iteration we continued, for testing purposes, to employ the same inappropriate algorithm parameters as were used during the first iteration, which produced FIG. 16.

Figure 21:
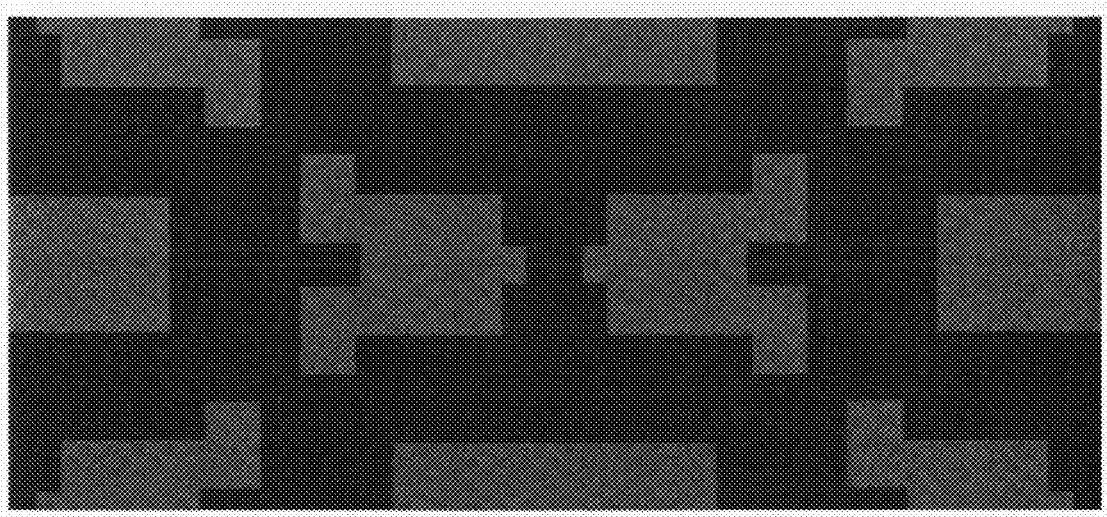

FIG. 21 shows the solution obtained from the FIG. 20 intermediate result after rounding and optimization of gridlines and edges. The FIG. 9 wavefront prescription is achieved using reasonable features, even though the algorithm has been operated in a non-optimal way.

Figure 22:
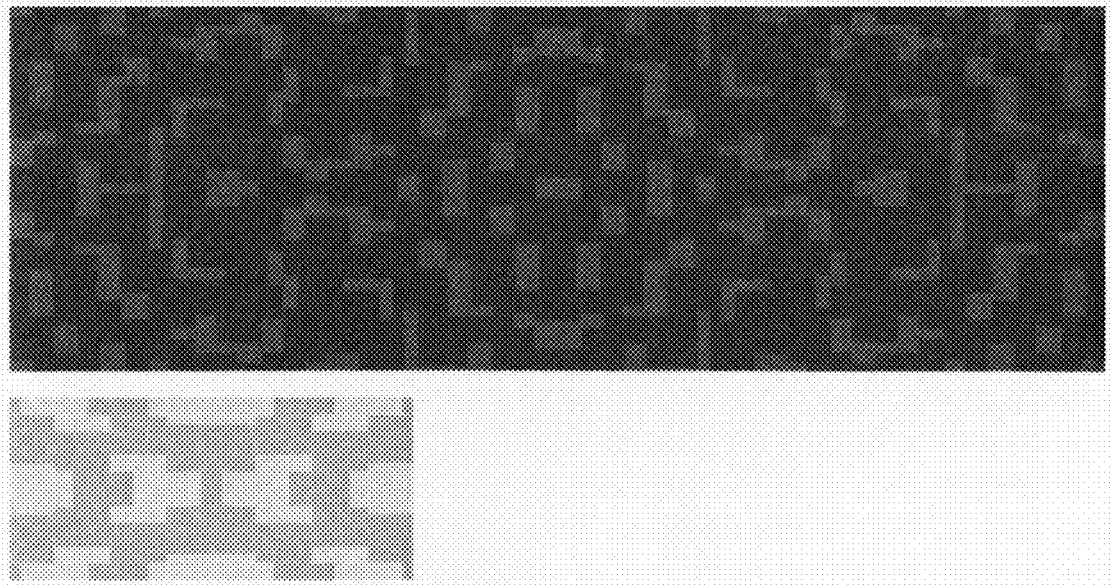

We conclude the discussion of optimization of the thin mask edge discontinuities by showing a mask example FIG. 22 that is calculated for a larger field, namely an SRAM (Static Random Access Memory) CA level, with optical pitch 2.16 μm×0.8 μm, to be exposed at λ=193 nm and NA=0.75. The mask is atten-PSM with 10% background transmission. 41 orders are collected by the lens. For comparison the figure shows the FIG. 15 DRAM solution as a black-and-white insert, scaled to the correct relative size in λ/NA units.

In FIG. 22, the upper color plot shows another example of the invention, namely a relatively large-field mask for a (Static Random Access Memory) SRAM contact hole level, see text, designed by our method for 10% atten-PSM. The black-and-white lower insert reproduces the FIG. 15 DRAM solution at a scale commensurate with the large-field cell when measured in dimensionless λ/NA units.

Figure 23:
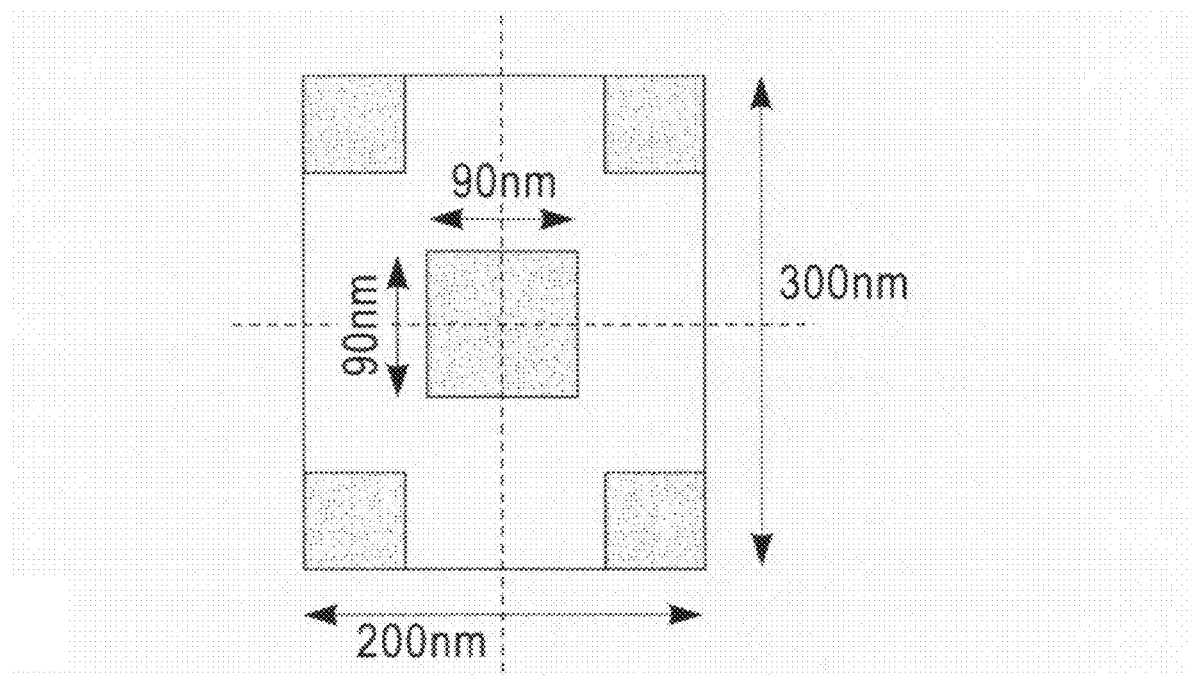
FIG. 23 shows a brick pattern used to illustrate the process of EMF correction according to an embodiment of the present method.

FIG. 23 shows a brick pattern used to illustrate the process of EMF correction according to an embodiment of the present method.

EMF effects are not handled under the procedure as described to this point, since we have thus far assumed that the discontinuities at the topographic edges separating features of different polarity are equal to the difference in the nominal transmissions of the two regions involved (with these nominal transmissions being supported by the mask technology when the above procedure completes). This impact from lack of EMF correction is illustrated in FIG. 24.

Figure 24:
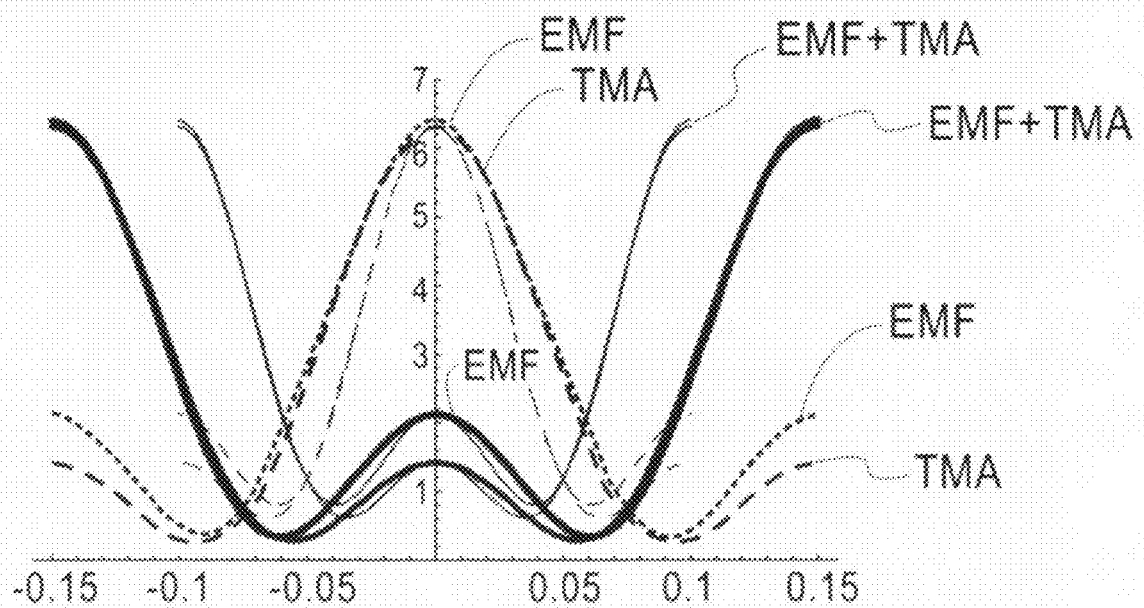
FIG. 24 shows EMF and TMA images of the FIG. 23 mask.

FIG. 24 shows EMF and TMA images of the FIG. 23 mask. The "EMF"-labeled curves are calculated using an accurate Maxwell simulator. Maxwell simulator refers here to software of a well-known kind that numerically or analytically solves Maxwell's equations in order to determine the most accurate possible electromagnetic field that is produced when an input optical field, such as a plane wave, interacts with a structure. Despite being optimally refocused and renormalized, they differ appreciably from the target "TMA"-labeled curves. (The thick curves are vertical cutlines, the thin curves horizontal. Solid curves plot the intensity across the centerlines of the image, while the dashed curves plot the intensity along the period boundaries.) Here λ=193 nm and NA=1.2.

To introduce control of EMF we can employ two different approaches: In the first approach we adjust the target diffraction orders in such a way as to render the feature discontinuities in as closely equivalent a form as is possible to those of the nominal thin mask, under the limitation that the mask topography remain fixed, and that only the 2D shapes of the patterns are subject to adjustment. This is effective in controlling the in-phase part of the EMF-induced edge discontinuity. Our second approach employs phase shifters (of new polarity) on the mask in order to suppress the in-quadrature part of the EMF-induced edge discontinuity.

We now consider the first of these approaches, in which we find shapes that (when rendered in a physically realistic topographic mask) will have edge discontinuities that are brought as closely as possible to those of the nominal thin mask target. (Here the nominal thin mask target is one which, per the procedure described above, successfully provides the desired wavefront, but only under the simplified assumption of a TMA model.) To carry out this procedure we need a metric for judging the closeness of the real-valued TMA discontinuities of the nominal mask to the complex discontinuities that the topographic mask will produce.

Treated collectively, the set of feature discontinuities in the topographic mask will be brought as closely as possible to those of the thin mask target when the images produced by the two masks have as closely matched intensity as possible. Thus, we could in principle define the EMF-corrected mask as being the output of a slightly cumbersome optimization procedure, in which (beginning with the TMA mask solution) we iteratively calculate the EMF image, and make adjustments in the mask shapes, in such a way as to minimize the deviation of the image from the target image. Such an optimization problem becomes computationally quite tractable if approximate methods like boundary layers are employed, but the required computation of a partially coherent image at each iteration is more cumbersome than necessary.

Figure 25:
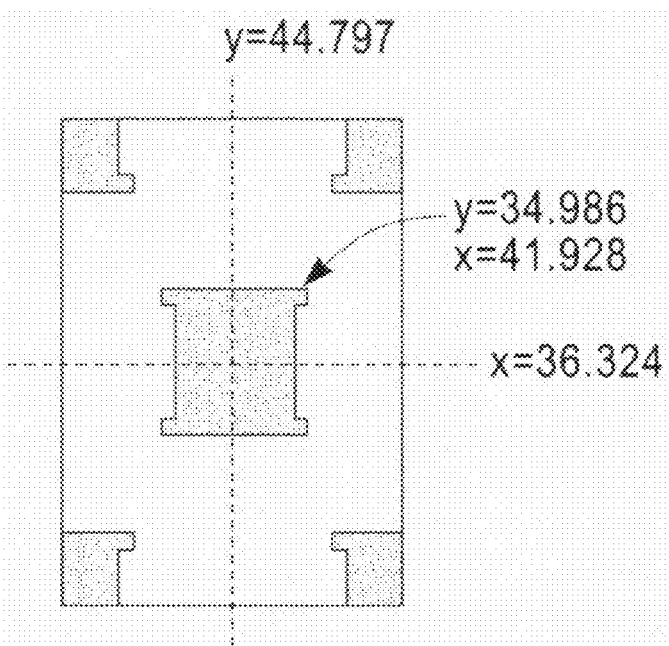
FIG. 25 shows an EMF-corrected version of the FIG. 23 mask.

FIG. 25 shows an EMF-corrected version of the FIG. 23 mask.

However, we now show that by using a frequency domain method we can obtain the EMF-corrected mask shapes in a simpler way. Using a 1D coherent example to simplify the notation, we can write the vector image of a periodic object (period P) as $$I(x) = \sum_m \sum_n \left[ \begin{array}{l} F_{m,n}^{X-Pol} M_n^{X-Pol} M_m^{X-Pol*} + \\ F_{m,n}^{Y-Pol} M_n^{Y-Pol} M_m^{Y-Pol*} \end{array} \right] e^{2\pi i x(m-n)/P} \quad [8]$$

assuming unpolarized illumination as an example. Here M designates the pupil-plane amplitude of the electric field vectors, and superscripts X–Pol and Y–Pol indicate which of the two independent polarization components of the illumination is being considered. The $F_{m,n}$ coefficients include obliquity factors, polarization aberrations from the lens and resist stack, and a dot product between the image-plane unit vectors of the interfering orders. Defining $$G_{m,n}^{X-Pol} \equiv F_{m,n}^{X-Pol} M_n^{X-Pol} M_m^{X-Pol*} \quad [9]$$

and similarly for Y–Pol, we can write the difference between two images $I(x)$ and $I_0(x)$ as $$I(x) - I_0(x) = \sum_m \sum_n D_{m,n} e^{2\pi i x(m-n)/P} \quad [10]$$

where $$D_{m,n} \equiv G_{m,n}^{X-Pol} - {}^0G_{m,n}^{X-Pol} + G_{m,n}^{Y-Pol} - {}^0G_{m,n}^{Y-Pol}. \quad [11]$$

Using the Fourier transform of a delta-function, we find after some algebra that $$\int dx |I(x) - I_0(x)|^2 = \sum_N \left| \sum_{\substack{L \\ L+N \text{ even}}} D_{\frac{L+N}{2}, \frac{L-N}{2}} \right|^2 \quad [12]$$

Though the focus and source dependence has been suppressed for brevity, it is straightforward to average eq. [12] through focus, and likewise eq. [9] can be averaged over the source. The M coefficients for the topographic mask need not be assumed independent of source direction; however this independence obtains by definition for a TMA mask. Fast simulations of topographic masks usually reduce them to approximate TMA equivalents (e.g. using boundary layers), but one can optionally calculate the G coefficients for the topographic mask using a rigorous Maxwell solver. Here G represents the strength of the intensity oscillation that is produced in the image when a projection lens causes two particular waves from a mask to interfere. Also, "Maxwell solver" is a synonym for "Maxwell simulator".

To apply eq. [12], we first set $I_0$ equal to the image produced by the target wavefront. The TMA design provided by the FIG. 10 procedure will produce this $I_0$ image under the TMA approximation. In one embodiment of the present method, these same shapes are next rendered as a topographic mask. A local optimizer then adjusts the shapes of the topographic mask features to minimize eq. [12] while maintaining mask manufacturability using nonlinear constraints on the shape variables. In cases where all patterns of interest are being handled simultaneously by the optimizer, one should preferably treat focus as an additional variable during this optimization.

When the EMF mask is simulated using an accurate Maxwell solver, it can be efficient to stage the (usually time-intensive) EMF calculation. One way to do this is to use scalar Fourier offsets as optimization variables (one per collected diffraction order), and then to use eq. [12] to calculate the specific values of these offsets which, when added to the diffraction orders collected from the topographic mask, cause the image to resemble as closely as possible the $I_0$ image from the target wavefront. No new EMF calculations are needed to evaluate eq. [12] during this calculation, making its minimization quite rapid. More specifically, in this embodiment eq. [12] takes the form of a 4th order polynomial in the offset variables, and because EMF effects typically amount to a modest perturbation on the TMA solution, eq. [12] can be rapidly minimized by iterating towards the particular local minimum of this polynomial that is closest to the origin (in the space of the offset variables).

Once the optimum offsets are found, we next apply them to the wavefront targets used in the FIG. 10 wavefront engineering procedure. Since EMF effects tend to be perturbational, it is appropriate to only rerun the final "Optimize Edges" step of this procedure. The resulting revised mask patterns will generally not be greatly different from those of the TMA solution, and as a result the EMF effects generated by the revised patterns (after realistic topography is considered) will not be greatly different from those generated by the original solution (which neglected realistic topography). Of course, if the change in EMF were so small as to be literally negligible, our revised patterns would constitute the desired EMF-corrected solution to the wavefront engineering problem, i.e. the revised patterns would provide optimal edge discontinuities.

Figure 26:
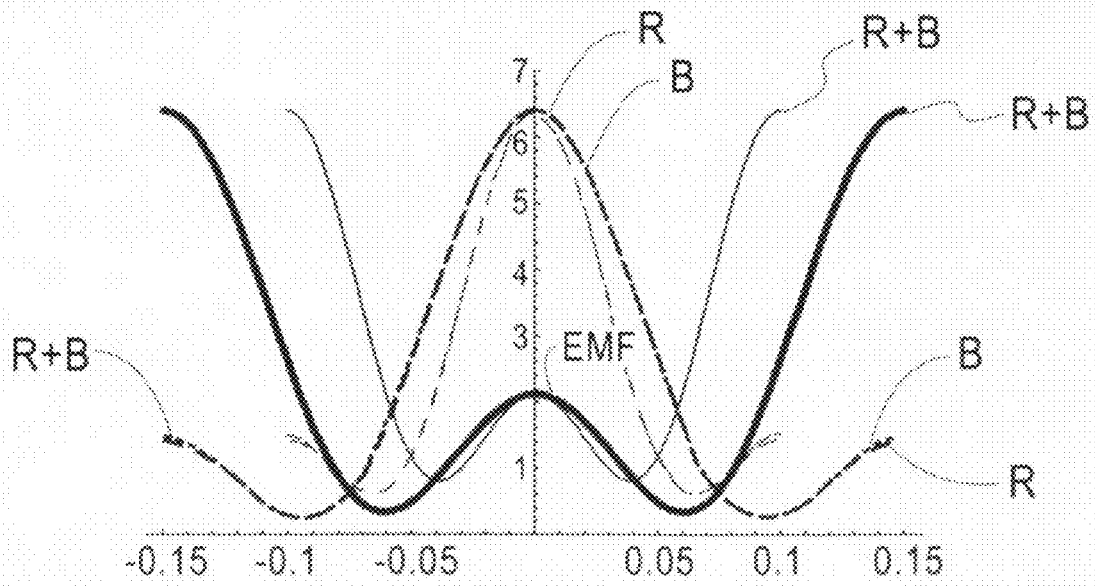
FIG. 26 plots the image of the FIG. 25 mask as calculated using a rigorous Maxwell solver.

As shown in FIG. 26, the blue (indicated as "B" in FIG. 26) curve plots the image of the FIG. 25 mask as calculated using a rigorous Maxwell solver. This image matches almost exactly the target image shown in red (indicated as "R" in FIG. 26), which is produced by the FIG. 20 mask under a TMA model. A very accurate correction is achieved after only a single iteration of the procedure described in the text.

However, in many cases the change in EMF effects, though small, is large enough to matter, and in such cases it is desirable to iterate the above procedure, i.e. to determine optimal values of a new set of offset variables that re-minimize eq. [12], and then to rerun the final stage of the FIG. 10 procedure in an additional iteration, yielding re-revised mask shapes that successfully provide the new offsets. This process can be iterated until the changes in EMF induced by the latest round of shape revisions are negligible.

In cases where all patterns of interest are simultaneously EMF-corrected using this procedure, it may be desirable to optimally readjust the focus that is assumed for the topographic versions of the patterns (relative to the focus at which $I_0$ is calculated). This maybe done by applying a least squares fit to the phase difference of each order relative to those of the real-valued TMA mask. If the time origin for the fields is not maintained consistently between the TMA and EMF calculations, one should include a constant (piston) term in the phase fit.

The above method can also account for other mask non-idealities besides EMF effects, such as corner rounding and dimensional distortions in the polygons that the maskwriter actually fabricates in the mask (when nominally Manhattan design shapes are specified). As with EMF correction, it is necessary that one be able to calculate or estimate the non-idealities of interest.

When used to correct EMF, the procedure just described can provide the best possible adjustment of the (2D) positions of the feature edges on the mask, in order to minimize the deviation of the mask image from the image produced by the desired wavefront. In most cases the match will not be perfect. EMF effects distort the transmission of the mask in the vicinity of feature edges, and the distorted transmission is typically a complex-valued quantity (even though the TMA transmission is pure real). At distance scales that the projection lens can resolve (which are the scales that matter as far as the projected image is concerned), the in-phase component of the edge discontinuities of the repositioned edges essentially matches those of the TMA mask designed by the FIG. 10 procedure (if averaged through focus). However, the quadrature component of the EMF-induced transmission distortion is not corrected (or affected) by the edge-position adjustment.

As noted above, the present method includes a second method for effecting EMF correction, namely to adjust the topographic structure of each 3D edge itself in order to eliminate the in-quadrature component of the EMF-induced distortion. Note that while it might appear more straightforward to contemplate complete removal of all EMF-induced distortion, such a brute-force correction would appear to be extremely complicated and difficult; indeed, no specific structure is know to effect such an EMF suppression. However, the present method is able to implement two significant relaxations to this brute-force suppression while still achieving substantial correction of the image. First, our method only requires a correction which causes the edge-structure to match that of the TMA edge when viewed under the very limited resolution of the projection lens (which might roughly be ±0.3 µm at the mask conjugate, i.e. the lens resolution patch encompasses a considerable region in the neighborhood of the physical edge). Second, this aspect of the present method only needs to correct the in-quadrature component of the EMF-induced distortion; we use the above shape-based adjustment method to correct the in-phase component.

Because it can exploit these two relaxations, the present method is able to effect the correction using standard fabrication processes. Consider, for example, a mask that is fabricated by etching polygonal apertures into a film that covers an SiO2 substrate, so that patterns are formed where the opened film apertures expose the transparent SiO2 substrate. By using a second patterning step to leave a narrow pedestal region in (or to etch a narrow trench region into) the SiO2 at a position very close to an existing vertical edge, we are able to give the near-field transmission a value that is phase-shifted, i.e. that has a transmission with non-zero in-quadrature part. If the narrow feature does not extend far enough from the aperture edge for the lens to resolve it, the edge will effectively have the same null in-quadrature component in its transmission discontinuity as would a nominal TMA edge. In effect, the narrow region is functioning as an anti-boundary-layer (anti-BL), though as noted it need only cancel the EMF-induced boundary layer in its quadrature component, and only in those spatial frequencies which the lens can resolve.

Figure 27:
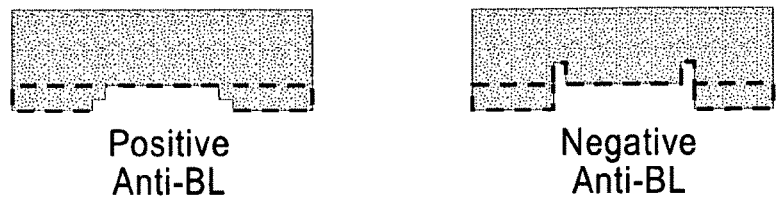
FIG. 27 shows basic anti-Boundary Layer ("BL") configurations.

FIG. 27 shows basic anti-BL configurations.

Of course, there is no rigid dividing line between the dimensions that a lens can resolve and those that it cannot, and typically the transmission correction will be imperfect since the new narrow region extends a finite distance away from the edge. However, as will be shown in examples below, anti-boundary-layers (anti-BLs) of width 80 nm and more can effect a very substantial correction of EMF effects.

Moreover, perfect correction in each polarization can (within the Hopkins approximation) in principle be attained if the mask contains two new kinds of features whose different nominal phase shifts provide non-zero in-quadrature components of opposite sign. This conclusion is in no way invalidated by the fact that the variously-phased mask structures will interact with each other in a very complicated manner, nor by the fact that the boundaries between regions of each kind represent distinct topographic discontinuities. Of course, these complexities increase the computational burden, but fundamentally the correction process is simply that of the FIG. 10. TMA wavefront engineering procedure, except carried out for both the in-phase and in-quadrature components of the diffracted fields, and with the proviso that the adjustments be "over-shot" in such a way that the follow-on EMF effects which they themselves introduce are cancelled along with those from the primary aperture edges. In fact, in the absence of incidence angle dependencies, it is possible to carry out this correction using only three phase polarities in the mask, as long as the ratio of the phase shift from two of the regions to that of the third provides in-quadrature components of opposite sign.

Figure 28:
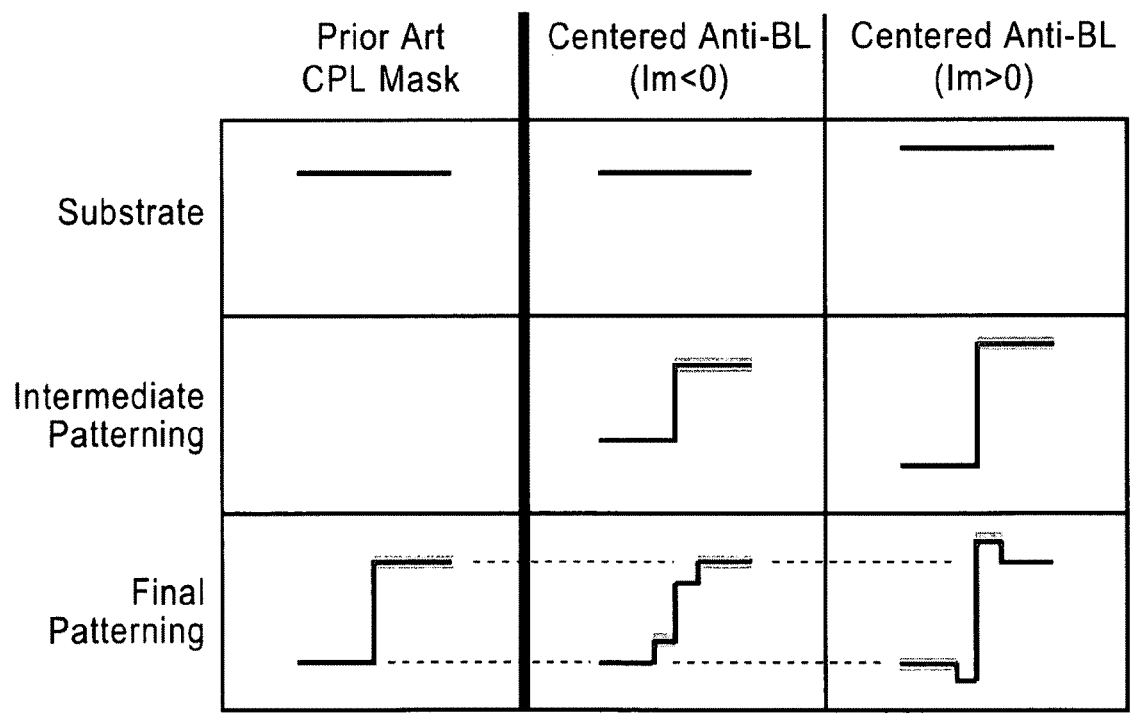
FIG. 28 shows that with a chromeless ("CPL") mask a single additional patterning step can create anti-BL's that are centered on the nominal edges.

However, as with the above shape-correction method, it is useful to exploit the fact that EMF effects are typically perturbational in character. This causes the etch depth or pedestal height required in the anti-BL to be small, meaning that the new topographic discontinuities that the anti-BL itself will introduce are only 2nd order (though if considered excessive they can optionally be corrected iteratively). As with the conventional boundary layers used in simulation, it is often acceptable to merely deploy a uniform anti-BL along every topographic edge. FIG. 28 shows that with chromeless masks (T=±1) a single extra patterning step suffices to create anti-BL's that are centered on the nominal edge.

Moreover, FIG. 28 shows that with a chromeless (CPL) mask a single additional patterning step can create anti-BL's that are centered on the nominal edges. (The in-quadrature parts of the anti-BLs share a common sign if only one extra patterning is used.) Gray shading is used to indicate areas that are not etched in each step.

An important additional consideration here is the so-called isofield. In a separate disclosure, the inventors have shown that even when the illumination is unpolarized, we can use a single iso-edgefield to account for the EMF effects induced by topography. Specifically, we use a coherent weighted sum of the edge-fields for TE and TM orientations, even though the illumination is unpolarized. This approach can be justified mathematically as long as EMF effects are small. An important implication is that a correction approach derived for polarized illumination can be made to work in the unpolarized case as well, if applied to the EMF-induced iso-field.

Since the anti-BL width is too small for the lens to resolve, it is only its net contributed quadrature component that is important for EMF correction. It is therefore usually not critical to choose precisely both the width and the height (or depth) of the anti-BL, but only their combination.

While the depth of the anti-BL may be set at a fixed quantity, the width of the anti-BL maybe more easily adjusted (if the anti-BL is created by a patterning step rather than a self-aligned process). This allows us to partially compensate such higher order effects as feature-to-feature interaction, the so-called "non-Hopkins" dependence of transmission on incidence angle, and changes in polarization introduced by rounded aperture corners or compound illumination angles. More complex structural changes may also be employed towards this end, such as variations in the thin film design of the mask blank, or deposition of additional films along the sidewalls, or changes in the sidewall profile. It is also possible to bring all transmission discontinuities into conformance with the nominal value supported by the mask technology by adjustment of both the phase shift of the mask blank film stack, and the density of patterns on the mask, including non-printing patterns in most cases. As discussed above, the transmission discontinuities will achieve the desired conformance if the bandlimited rendition of the mask (as filtered by the lens) achieves substantially the same shape as the inverse Fourier transform of the specified wavefront. This means, for example that in the special case where the features are uniformly spaced with a separation that happens to equal the width of two anti-BLs, the entire space between each feature pair would in fact take the form of an anti-BL. In such a mask the nominal background polarity would therefore be absent, meaning that the anti-BL polarity is essentially serving as the effective background polarity. Such masks are therefore essentially equivalent to masks whose nominal film stack transmission is detuned from a phase thickness of 180° (after suitably readjusting the fixed feature separation to account for the associated film stack topography change), but whose actual edge discontinuities achieve conformance with the desired 180° transition due to EMF effects.

Of course, the above scenario assumes that the features have a suitable uniform density. But since the transmission discontinuities need only achieve their target values after filtering by the bandlimited resolution of the lens (including the illumination NA), we can also include sub-resolution features to help achieve the necessary density. In many cases these assist-like features need to be accounted for during the initial design of the wavefront, but it is known that small sub-resolution features can benefit image quality.

We refer to this approach of adjusting both the background phase shift and the density and positions of deployed unresolved features as "cheese-and-fill boundary layers". Here we have borrowed the term "cheese-and-fill" from an unrelated technique in which electrically inert features are included in patterns for the purposes of achieving a desirable density uniformity during film etch processes. It should be noted that in the limit of large features the "non-Hopkins" dependence of transmission on illumination angle can be approximated by the angular dependence of the mask blank film stack. Suppose, for example, that a chromeless mask in which SiO2 of index n has been etched to a depth that provides 180° phase shift for incidence angle $\theta_0$, is instead illuminated at a different angle $\theta$. We can estimate that the phase shift will be given by $$\text{Phase} = 180° \frac{n\cos\theta' - \cos\theta}{n\cos\theta'_0 - \cos\theta_0} \cong 180° \left[ 1 + \frac{\theta^2 - \theta_0^2}{2n} \right] \quad [13]$$

where the primes indicate propagation angles inside the SiO2 as given by Snell's law. Note that this expression only applies to extended areas, and does not consider incidence angle dependencies or shadowing asymmetries at edges.

Figure 5:
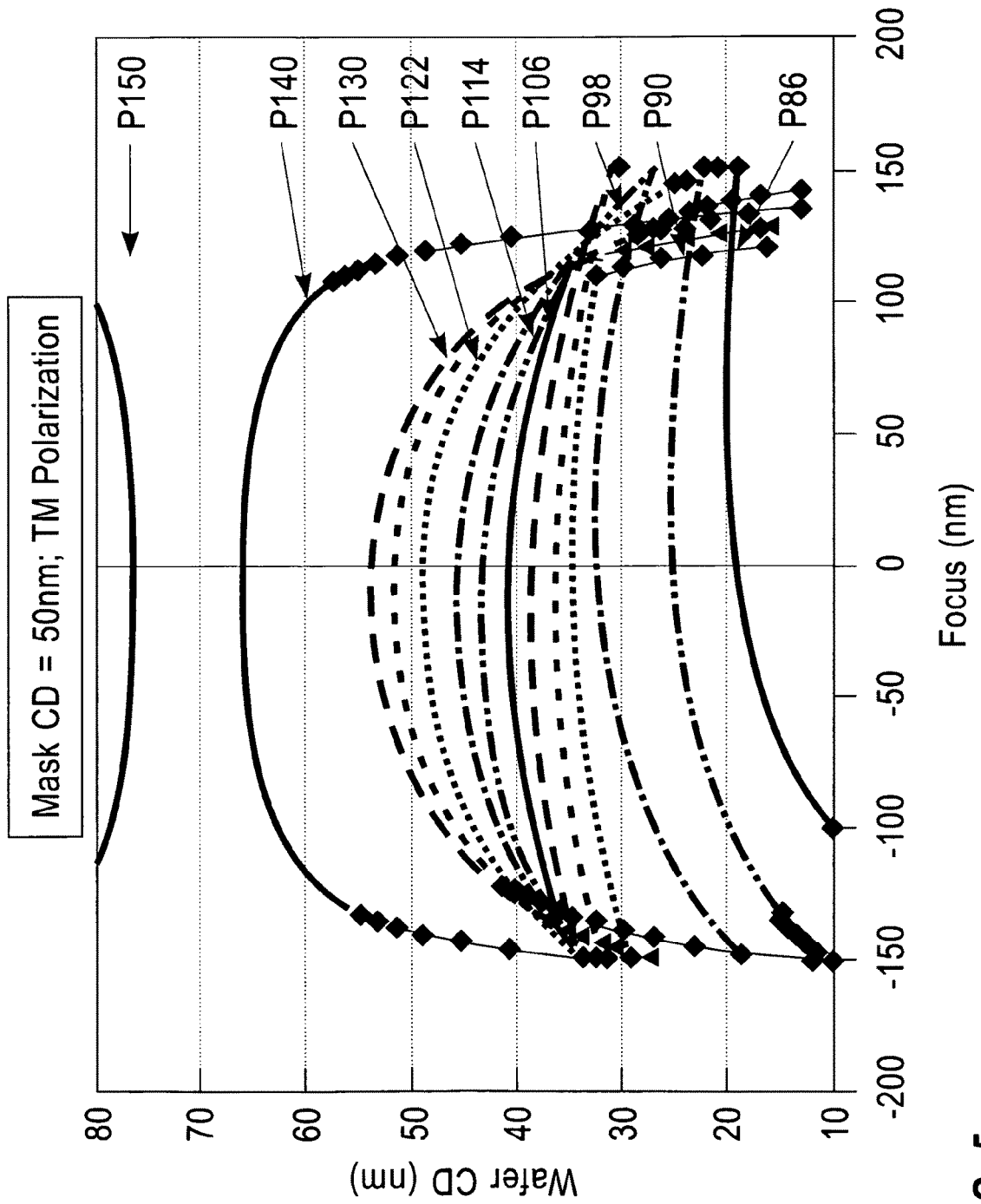
FIG. 5 shows focal behavior of printed features when a known mask of finite thickness topography is used.
Figure 29:
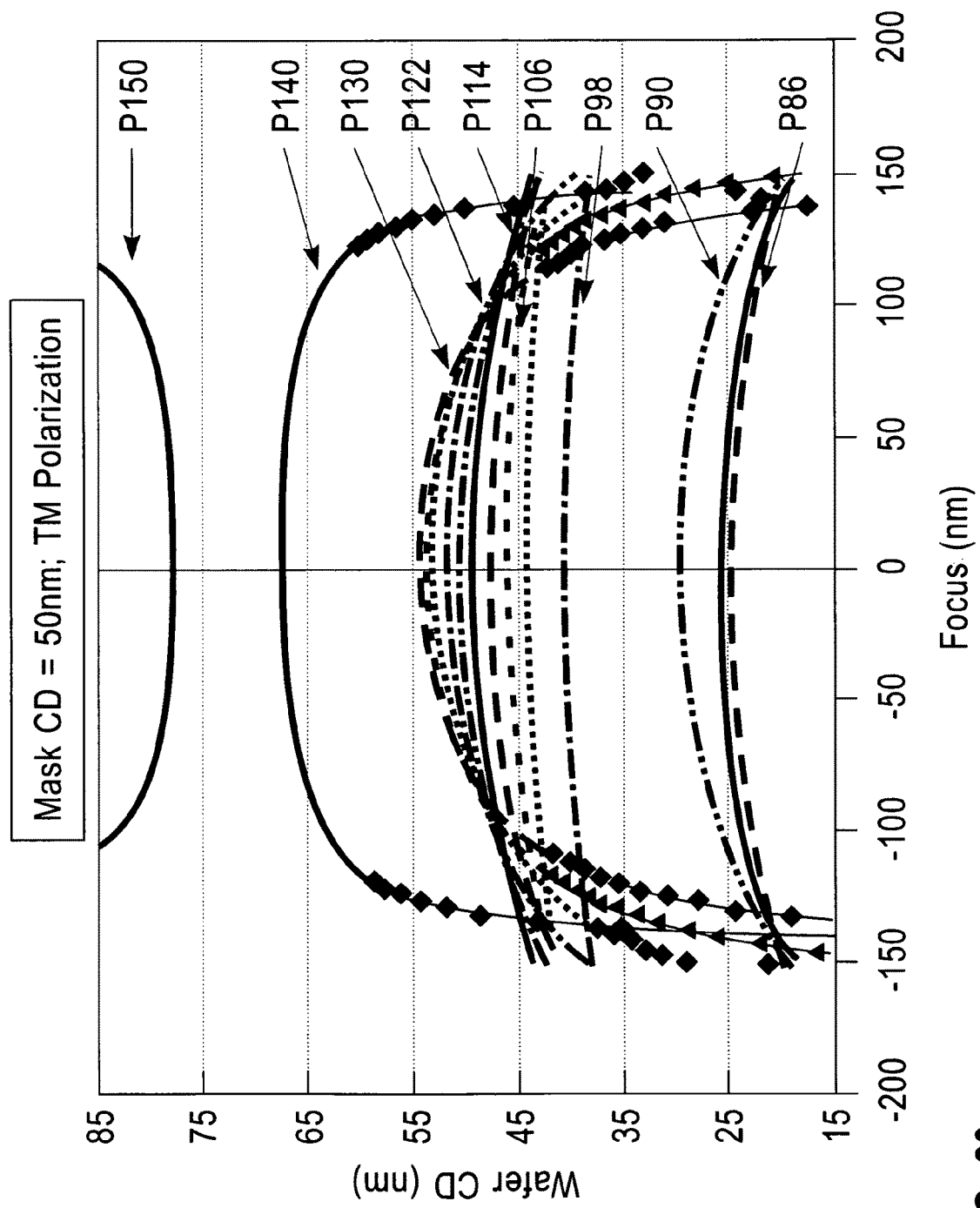
FIG. 29 shows correction of the EMF-induced feature-dependent focal shifts seen in FIG. 5 using anti-boundary-layers.

FIG. 29 shows correction of the EMF-induced feature-dependent focal shifts seen in FIG. 5 using anti-boundary-layers.

Figure 6:
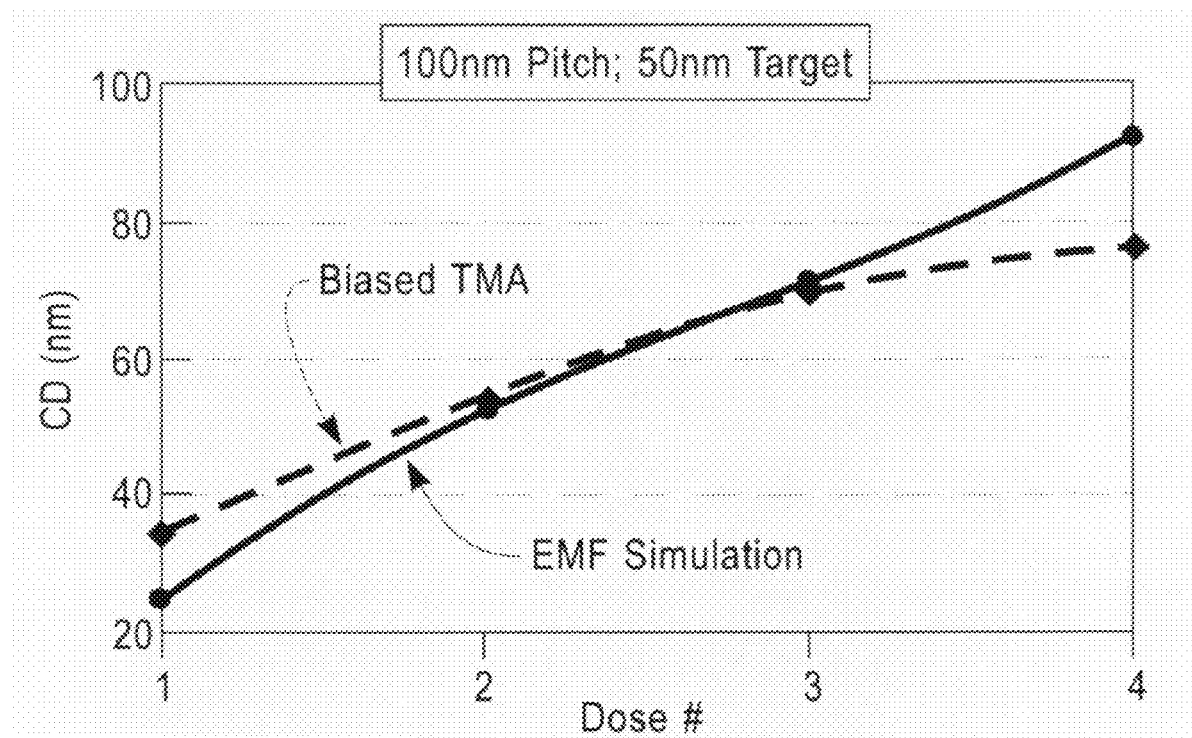
FIG. 6 depicts the inability of biasing to correct focal shifts that are caused by the quadrature component of the EMF perturbation.
Figure 6:
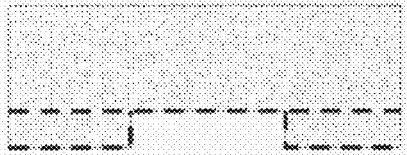
Figure 30:
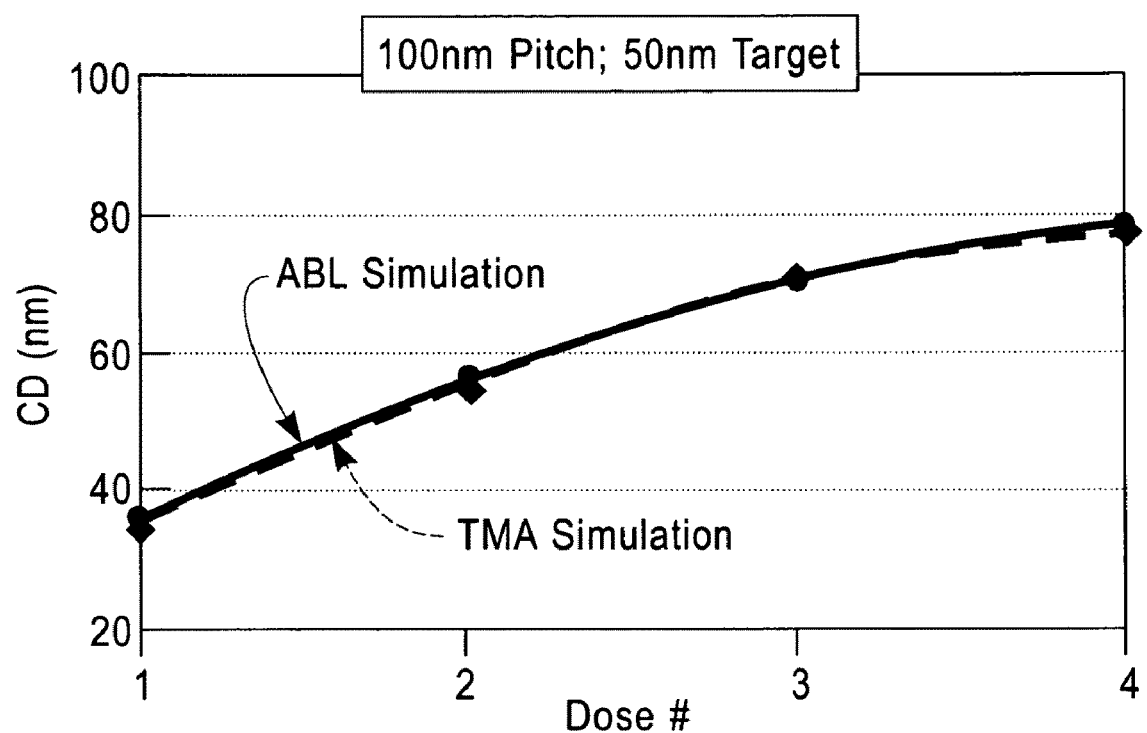
FIG. 30 shows correction of the EMF-induced focal shifts seen in FIG. 6 using a negative anti-boundary-layer.
Figure 30:

FIG. 30 shows correction of the EMF-induced focal shifts seen in FIG. 6 using a negative anti-boundary-layer. At a fixed focal plane, the anti-BL produces a behavior of the mask diffraction that closely matches that of the TMA model.

Figure 31A:
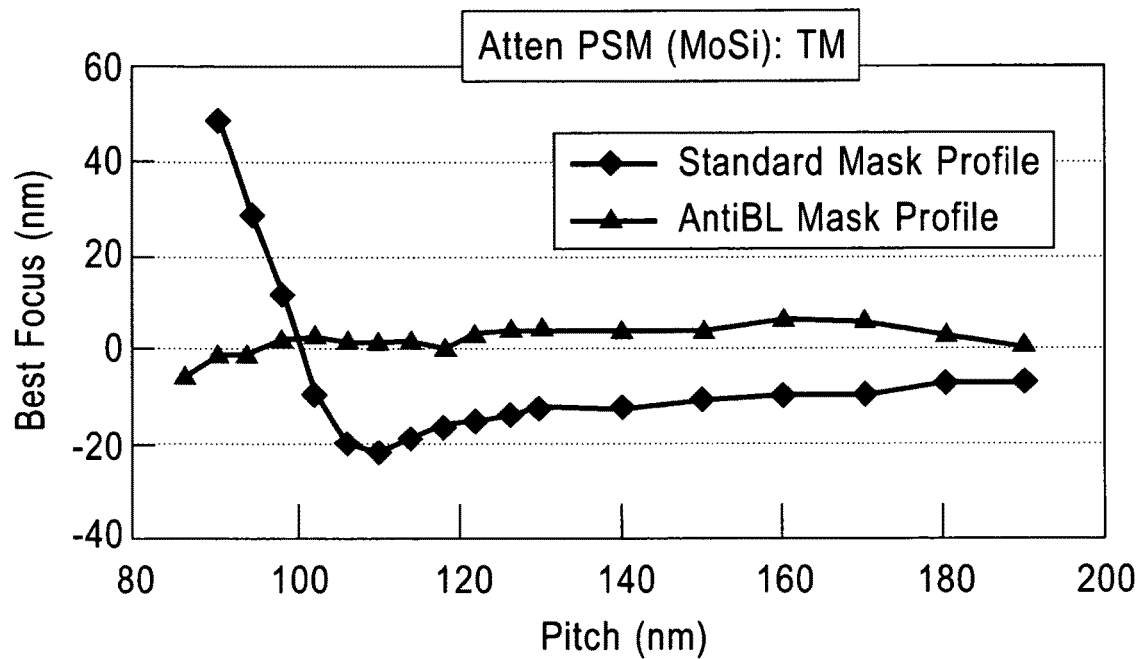
FIGS. 31A-31B show anti-BL's to correct focus variations in printing 50 nm lines at different pitches.
Figure 31B:
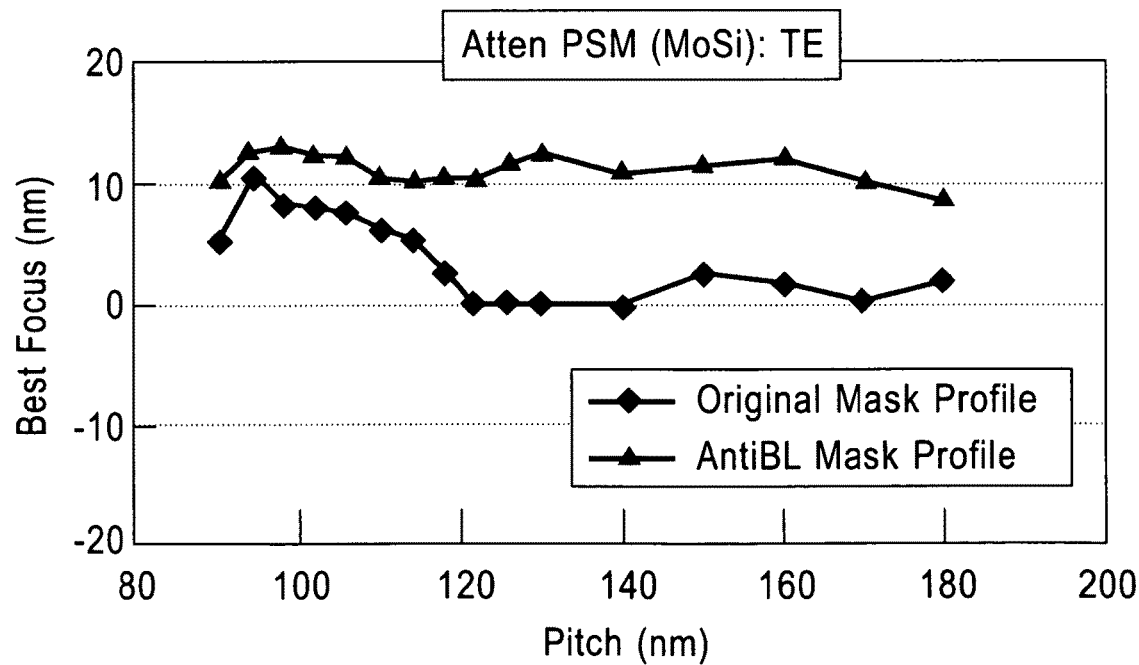
Figure 32A:
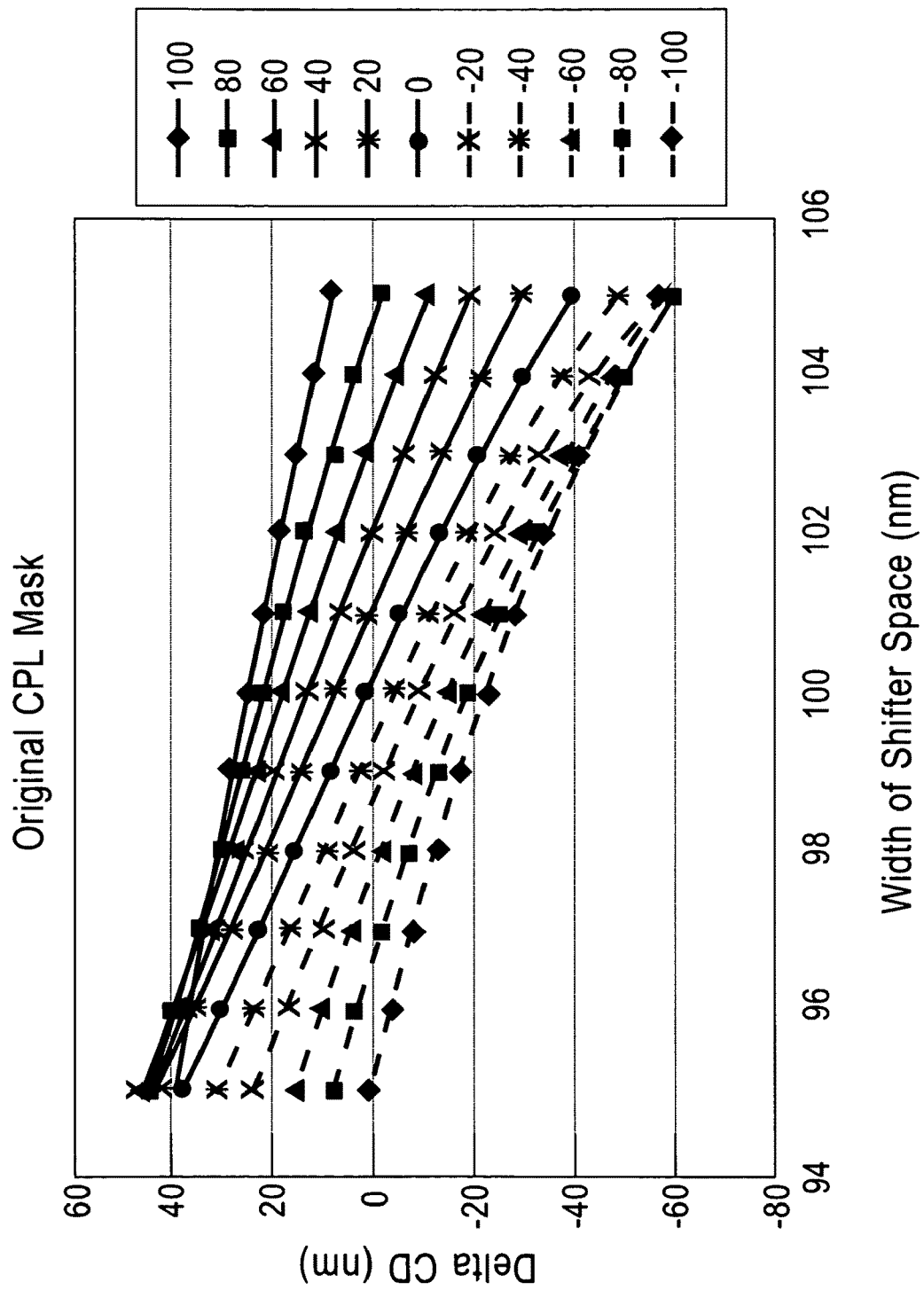
FIGS. 32A-32D show anti-BL correction of a chromeless phase-shift mask (a so-called CPL mask) for a test problem.
Figure 32B:
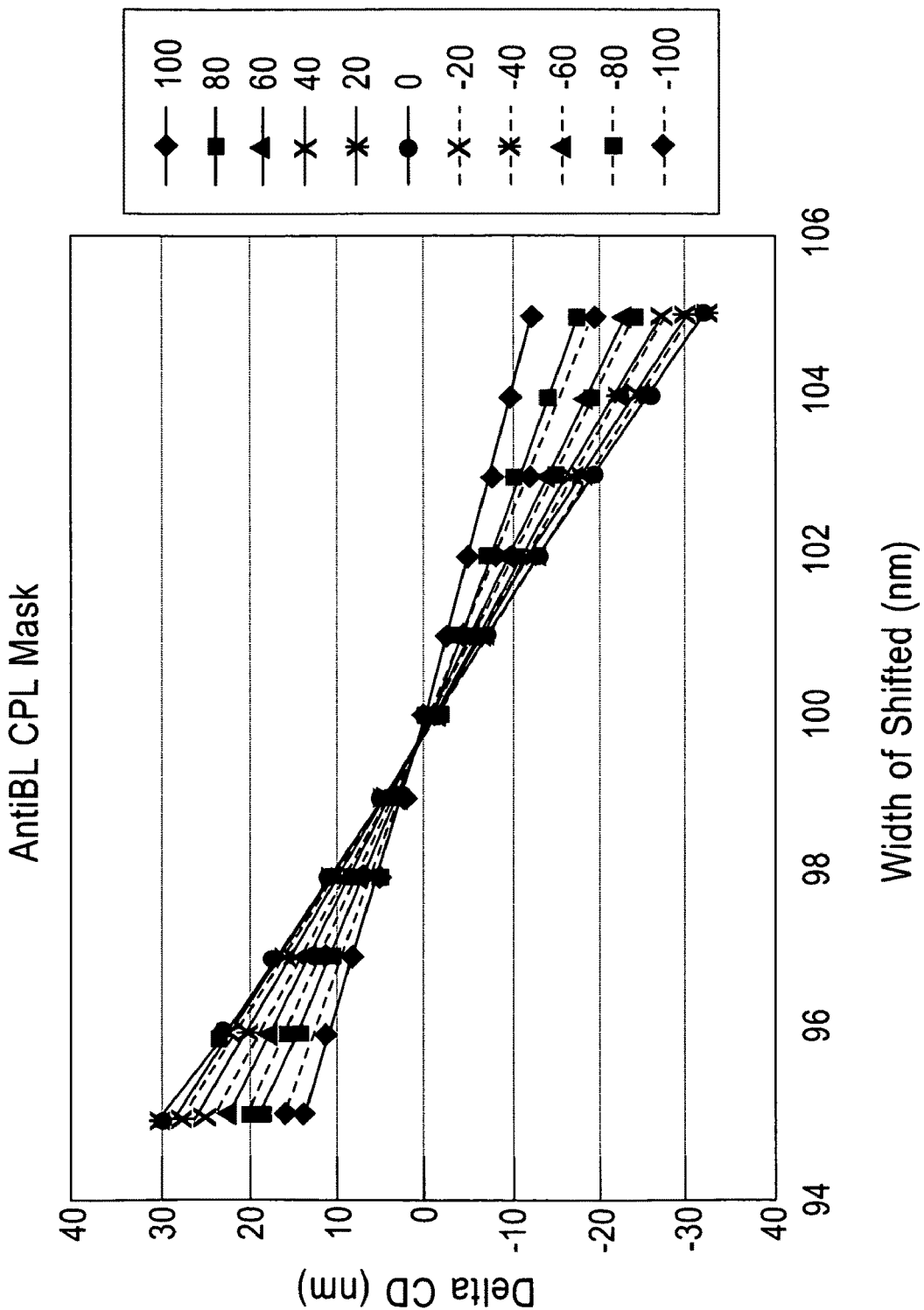
Figure 32C:
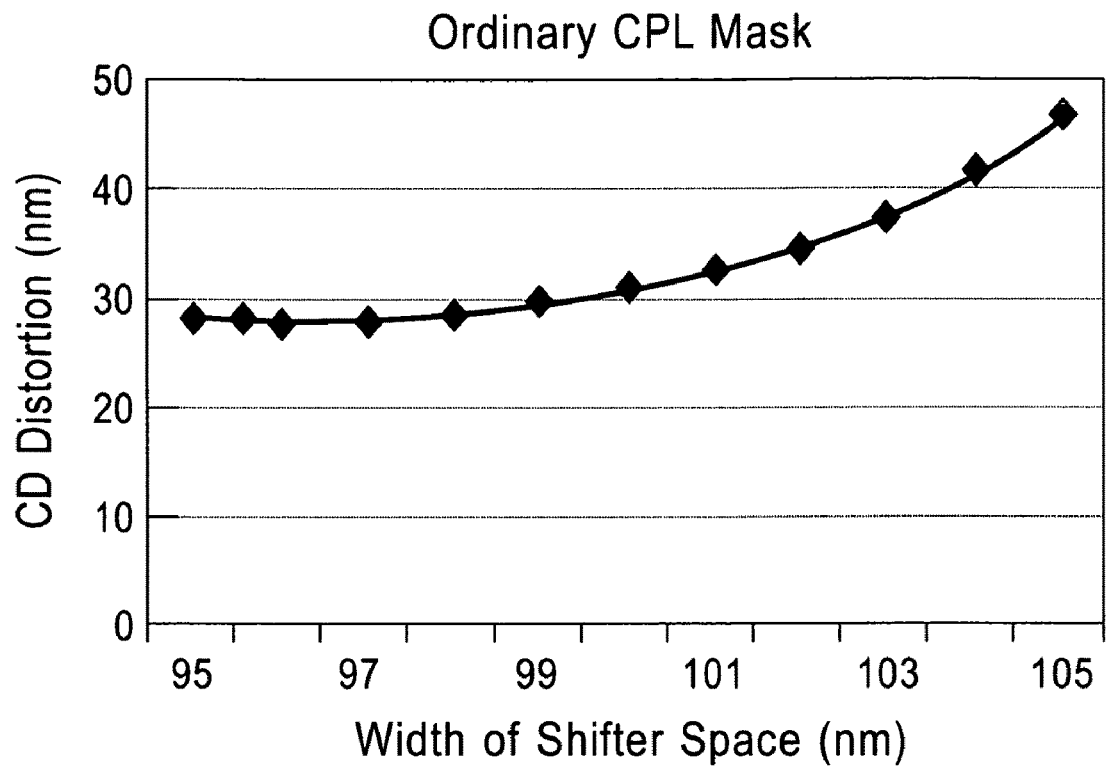
Figure 32D:
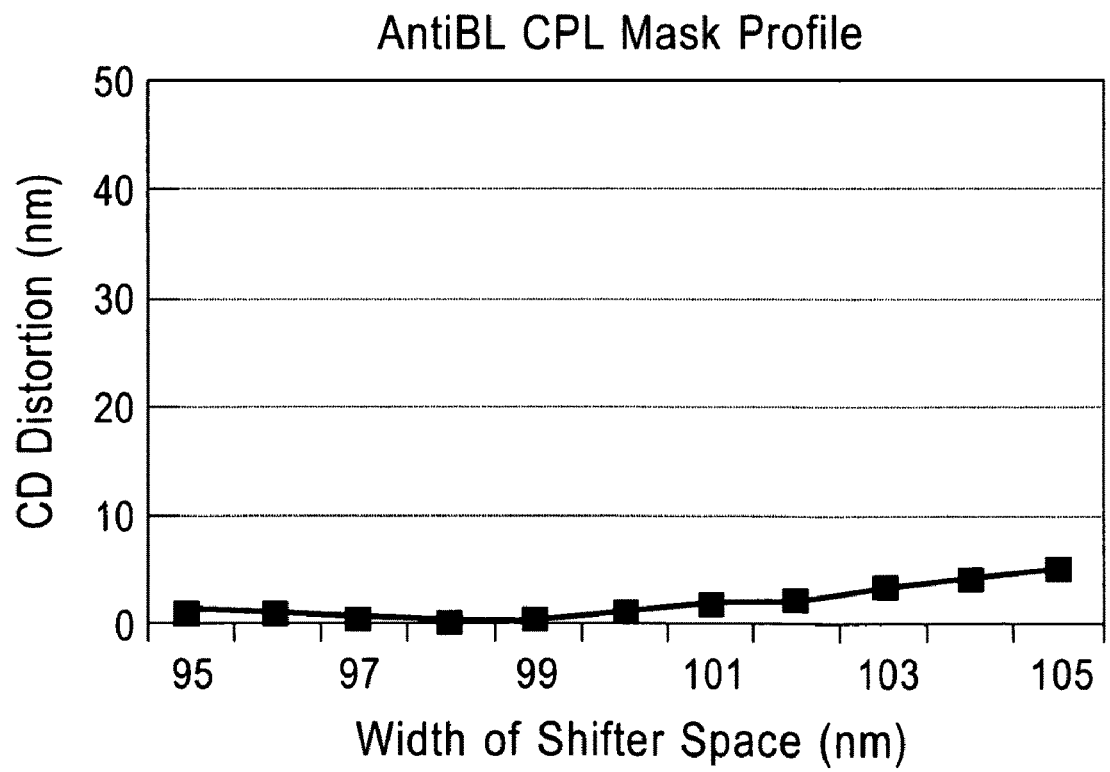

FIGS. 31A-31B show anti-BL's to correct focus variations in printing 50 nm lines at different pitches. In accordance with the simplest BL model the same anti-BL has been used at all pitches, which leads to inferior correction at the smallest pitches when the illumination contains a significant TE component.

FIGS. 32A-32D show anti-BL correction of a chromeless phase-shift mask (a so-called CPL mask), for a test problem. Printed CDs are shown for 180 nm pitch gratings, as the duty cycle and focus are varied. The left side shows results for the known mask, whose images suffer from strong focal asymmetries. The right side shows that a simple pitch-independent anti-BL provides distortion-free printing through focus. The illumination is unpolarized.

Figure 1:
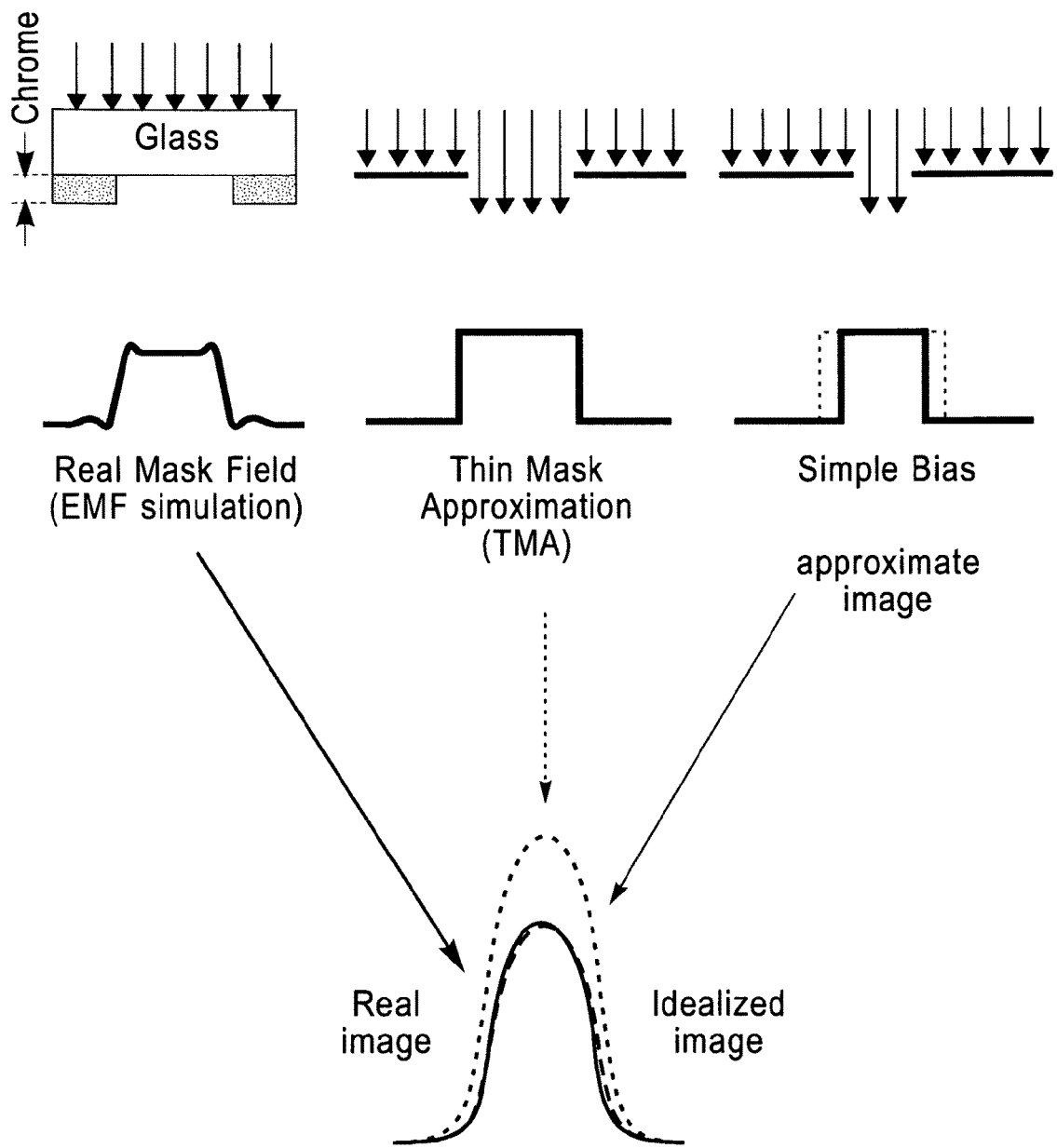
FIG. 1 depicts a finite thickness of mask topography causing perturbations in the transmitted field.
Figure 2:
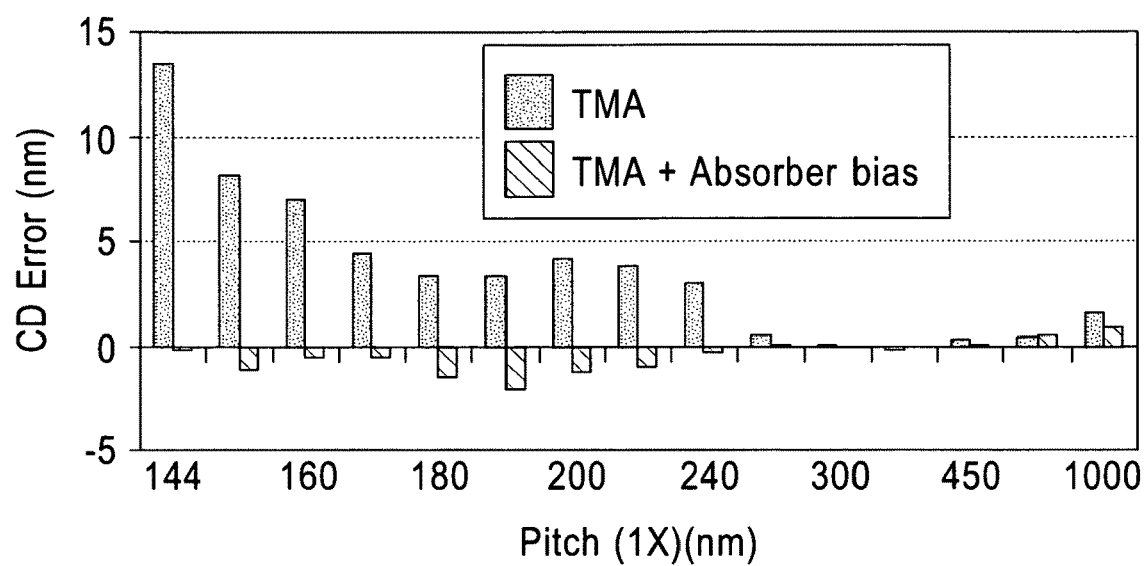
FIG. 2 depicts the impact of simple biasing in a thin mask model.
Figure 3A:
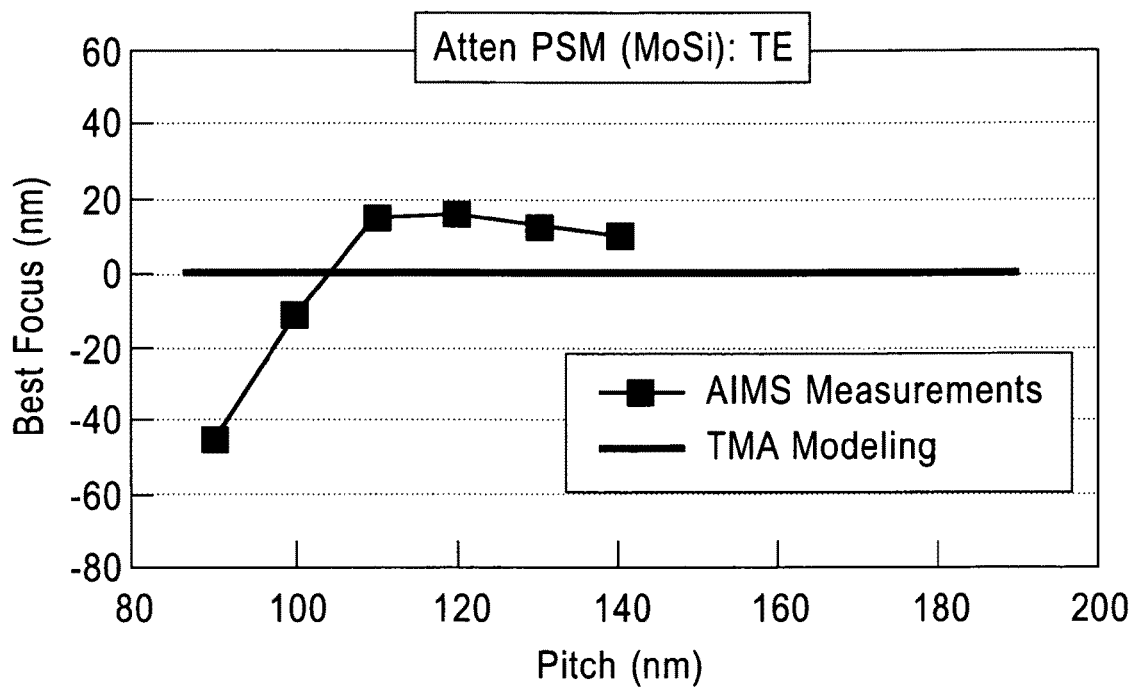
FIGS. 3A-3B depict the main impact of the in-quadrature component of EMF-induced image changes as being a pitch dependent focus shift.
Figure 3B:
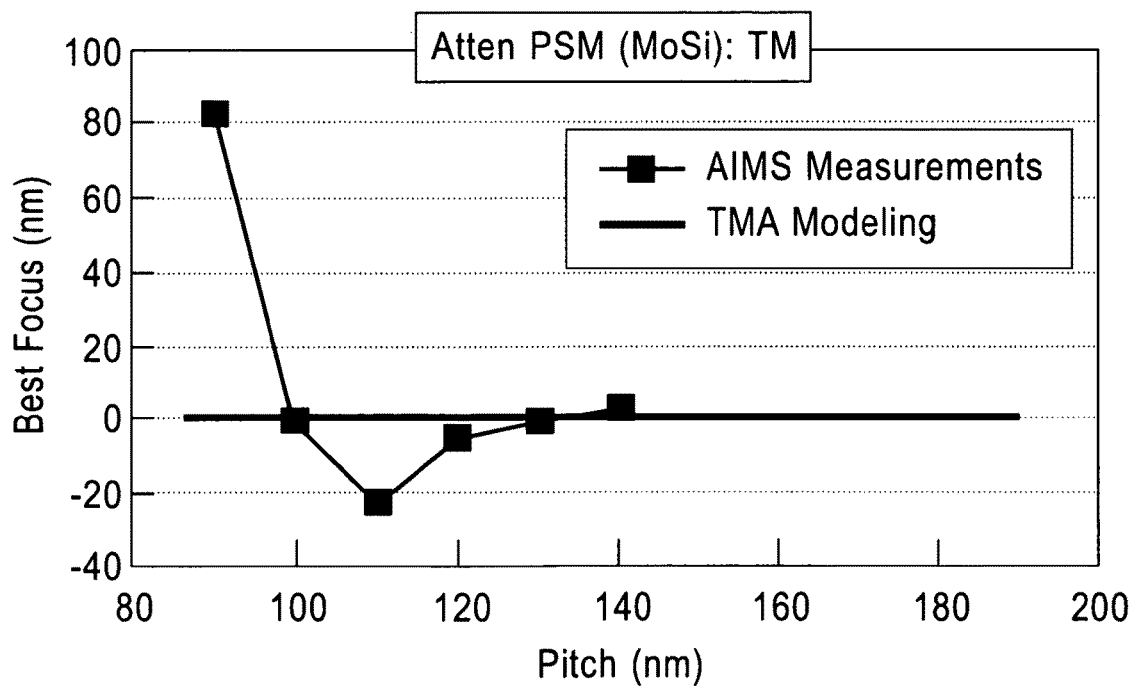
Figure 4A:
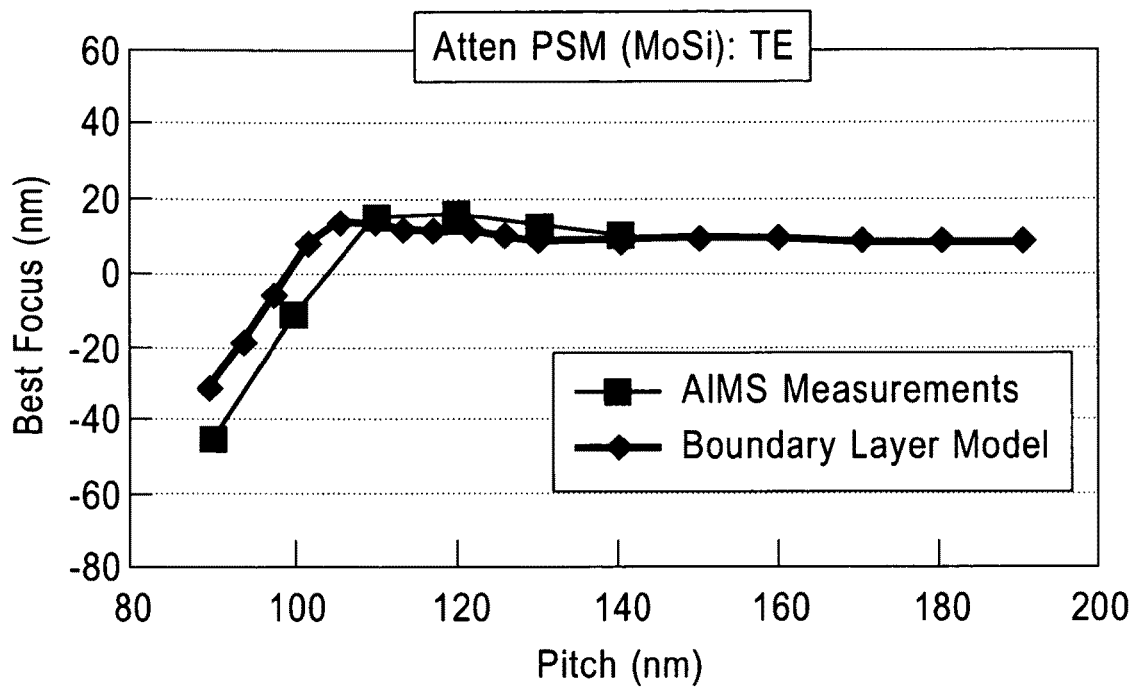
FIGS. 4A-4B depict the accuracy of an approximate boundary layer model of EMF effects to estimate focus shift produced by in-quadrature EMF effects on the mask topography.
Figure 4B:
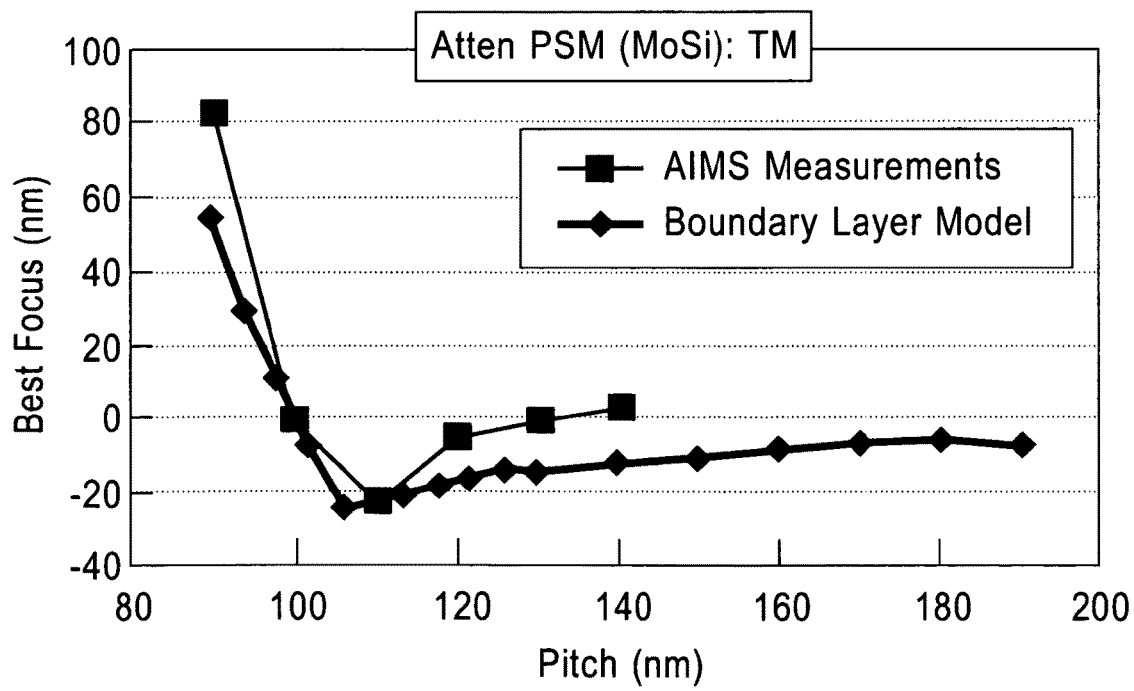

Moreover, FIG. 29 and FIG. 30 show examples of anti-BL masks that correct the focal shift distortions seen in FIG. 5 and As shown in FIGS. 3A-3B, respectively. FIGS. 31A-31B show another example of anti-BL correction. FIGS. 32A-32D show anti-BL correction of a chromeless mask.

The following is an Appendix of Orientation Independent Boundary Topography Correction of Electromagnetic Effects in Photomasks.

APPENDIX A

Figure 33:
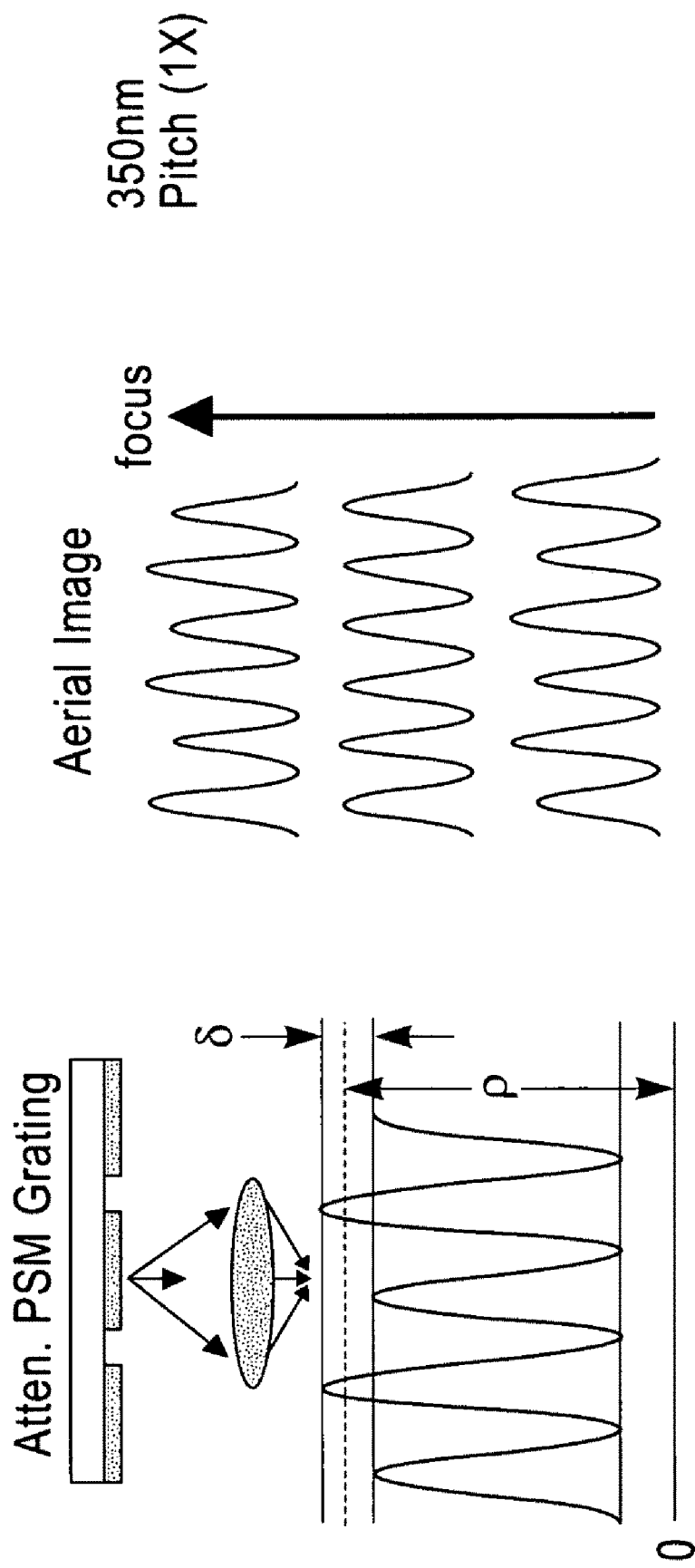
FIGS. 33 and FIGS. 34A-34B show evidence of electromagnetic phase errors causation.

A.1 AIMS Asymmetry Factor Measurements:
Evidence of Electromagnetic Phase Errors Cause FIG. 33 shows a sketch of the aerial image across several focal planes produced by a simple phase shifting grating of 350 nm pitch (as measured on the wafer plane). When the ratio between the grating space and line is equal to the amplitude transmission, then the TMA model of the mask predicts a two beam diffraction pattern where the direct beam diffraction order turns to zero. A deviation from this space to line ratio or perturbations like EMF variations induced by the mask topography introduces a non-negligible amount of zero-th diffracted order and, in consequence a focus-dependent asymmetry will produce in a nominally two-beam interference image. Specifically, the asymmetry parameter is the intensity difference that arises between adjacent peaks in the nominally sinusoidal fringe pattern (a pure harmonic when the asymmetry parameter is zero), δ, normalized by the DC intensity level (i.e. the average intensity in the image), ρ.

Figure 34A:
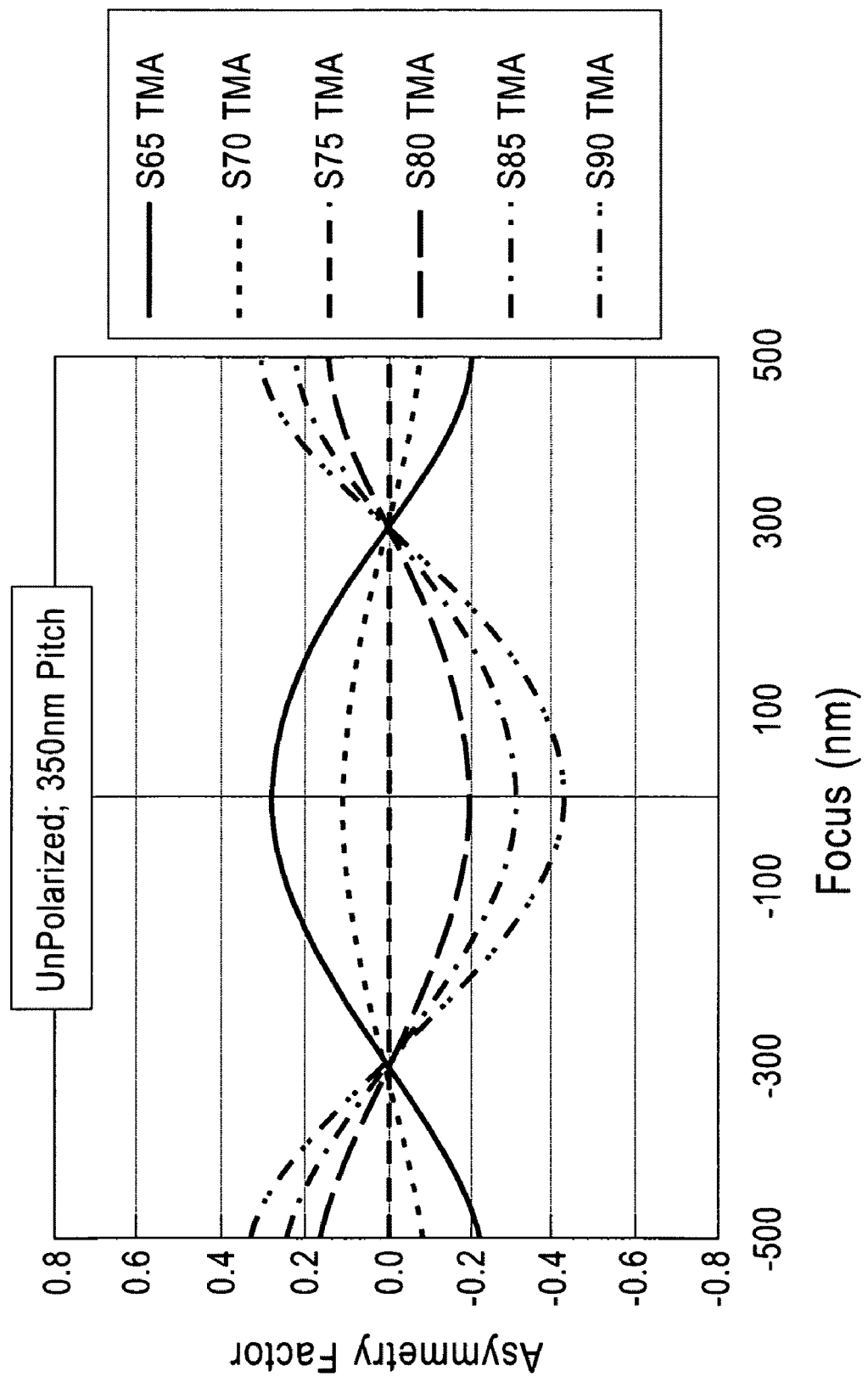

Simulations that ignore EMF induced phase errors, that is, TMA simulations, show symmetric plots through focus of the asymmetry factor as displayed in FIG. 34A.

Full EMF simulations and AIMS measurements [Mike Hibbs and Timothy Brunner, Proc. SPIE 06] show a distinctive linear dependence through focus (curve tilting) due to transmission EMF phase errors shown in FIG. 34B. The acronym "AIMS" stands for Aerial Image Measurement System. It refers to a microscope that measures the image produced by a mask.

Figure 34B:
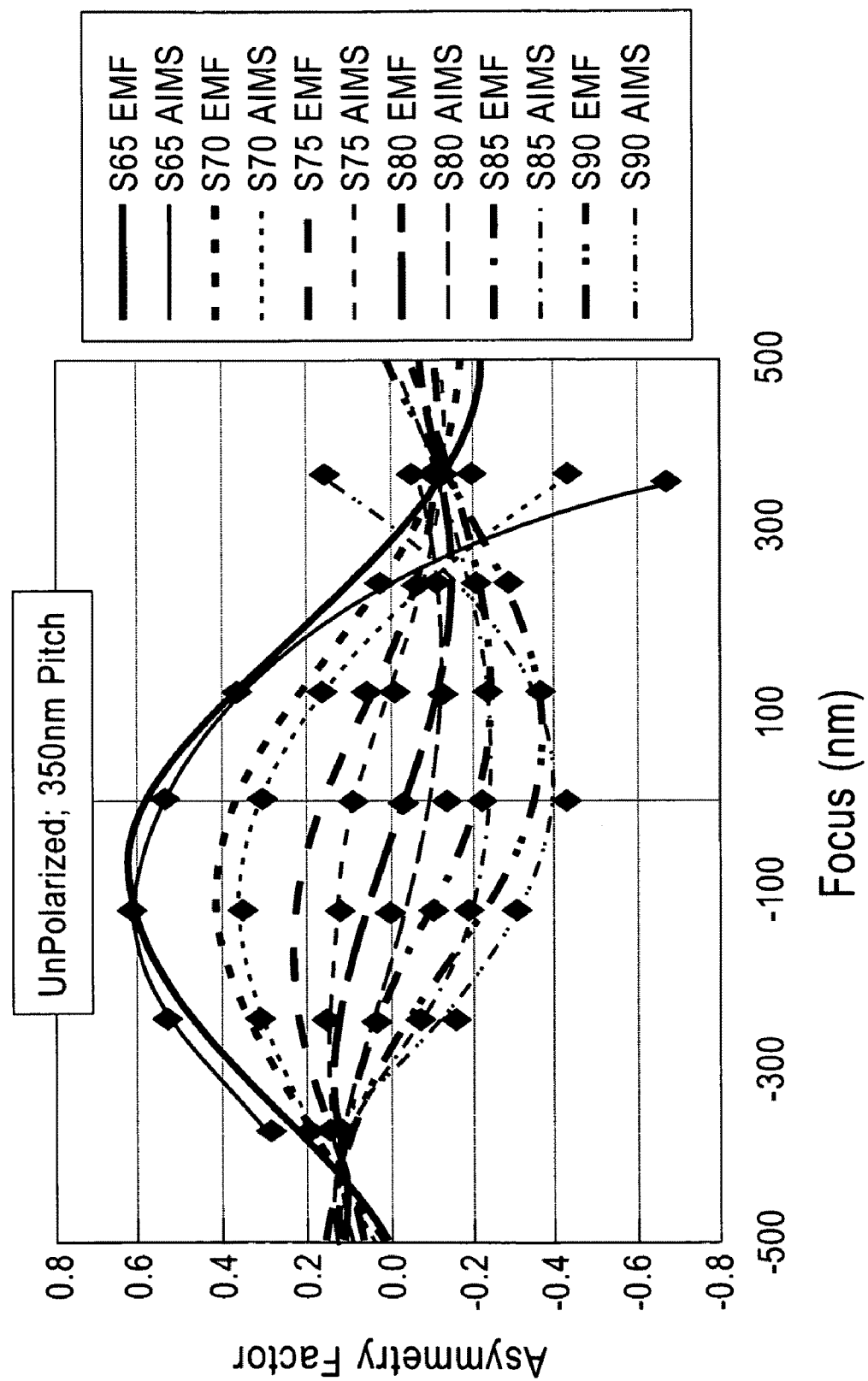

In FIGS. 34A-34B, the TMA fails to reproduce 3D mask effects (both amplitude and phase), a biased TMA can account for in-phase component errors but fails to model in-quadrature errors responsible for the asymmetry parameter curve tilting.

Figure 35:
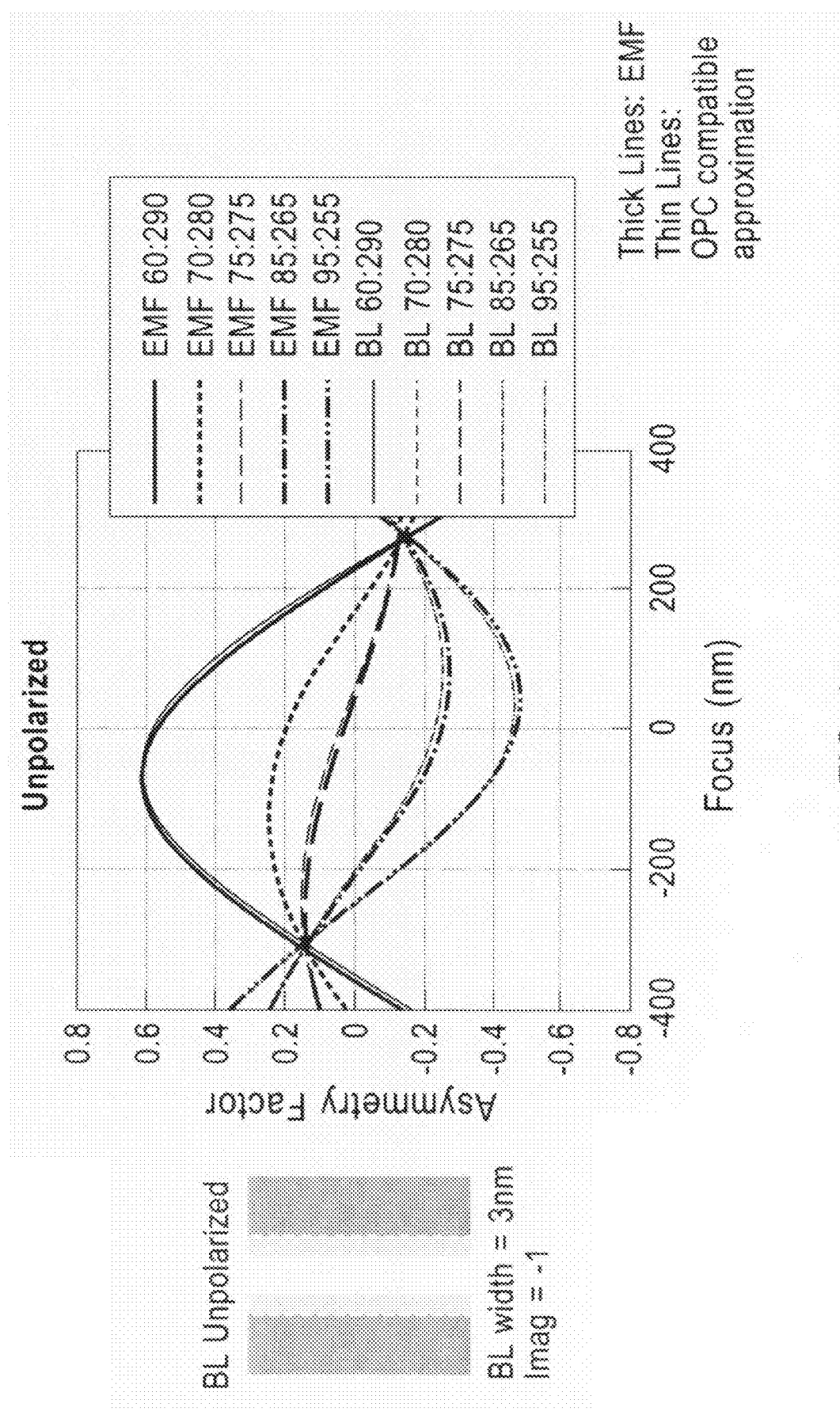
FIG. 35 shows an isotropic boundary layer.

A.2: Isotropic Boundary Layer:

As shown in FIG. 35, the dominant non-Kirchhoff effect can be shown to be localized near the bounding perimeter of mask apertures [J. Tirapu Azpiroz and E. Yablonovitch, J. Opt. Soc. Am. A 23, 821 (2006)]. A boundary layer can accurately model mask EMF effects due to topography (both in-phase and in-quadrature) through a strip of complex-valued transmission deployed during thin mask simulations in the vicinity of feature edges. The boundary layer model width and real component account for amplitude errors, and the boundary layer in-quadrature component accounts for phase errors. It can be seen that an isotropic boundary layer model ["Efficient Isotropic Modeling Approach to Incorporate Electromagnetic Effects into Lithographic Process Simulations". Tirapu-Azpiroz et. al. FIS8-2006-0379], formed through the weighted coherent combination of the boundary layers due to TE and TM polarization components of the incident illumination, can accurately approximate the EMF impact due to unpolarized illumination.

A.3: EMF Correction on the Reticle:

A boundary layer model can reproduce the effects of mask EMF during lithographic simulations, but cannot correct for the degradation on common process window induced by the fluctuation of plane of best focus induced by the in-quadrature component of the EMF effects.

Figure 36:
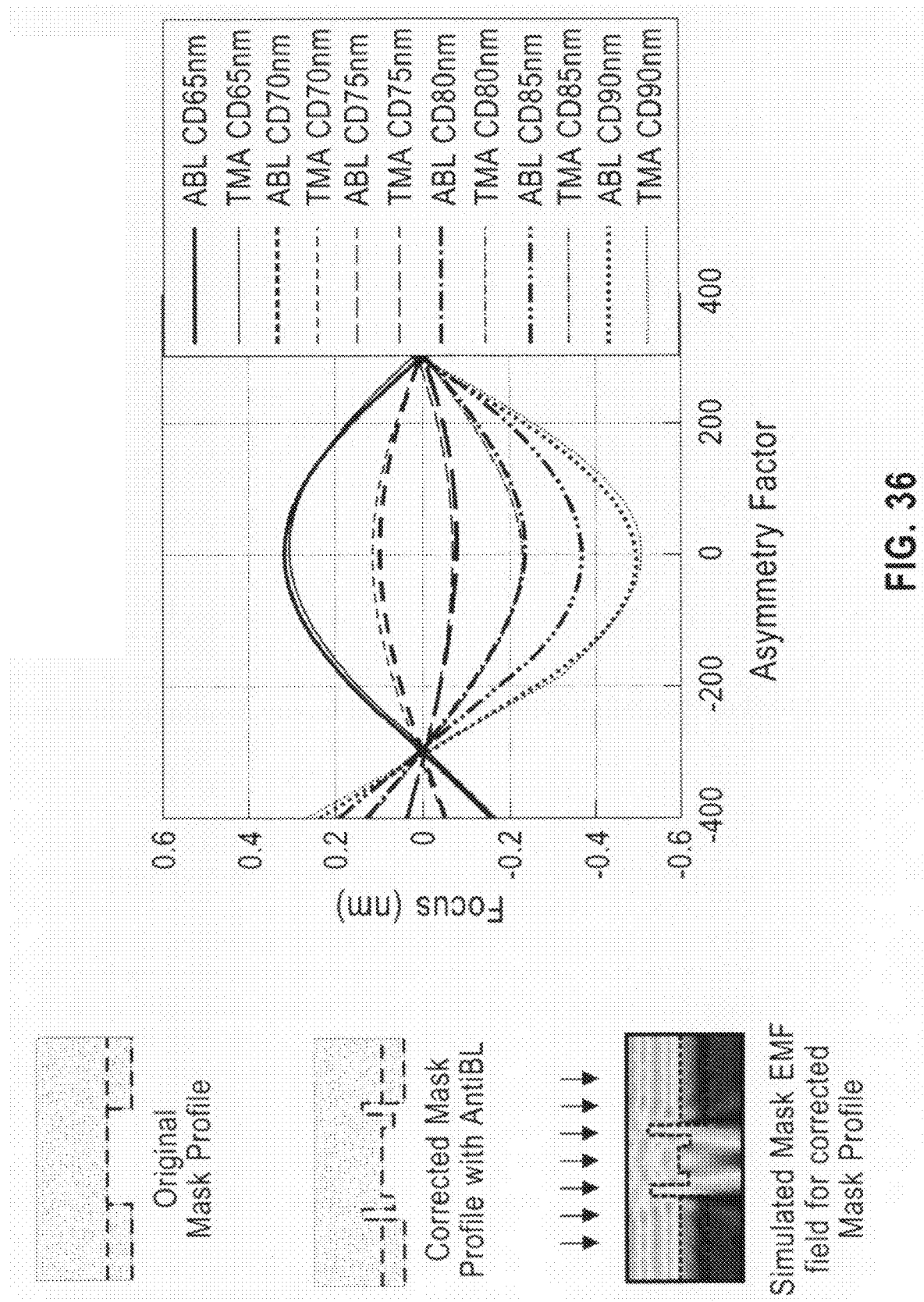
FIG. 36 shows EMF correction on the reticle.
Figure 37:
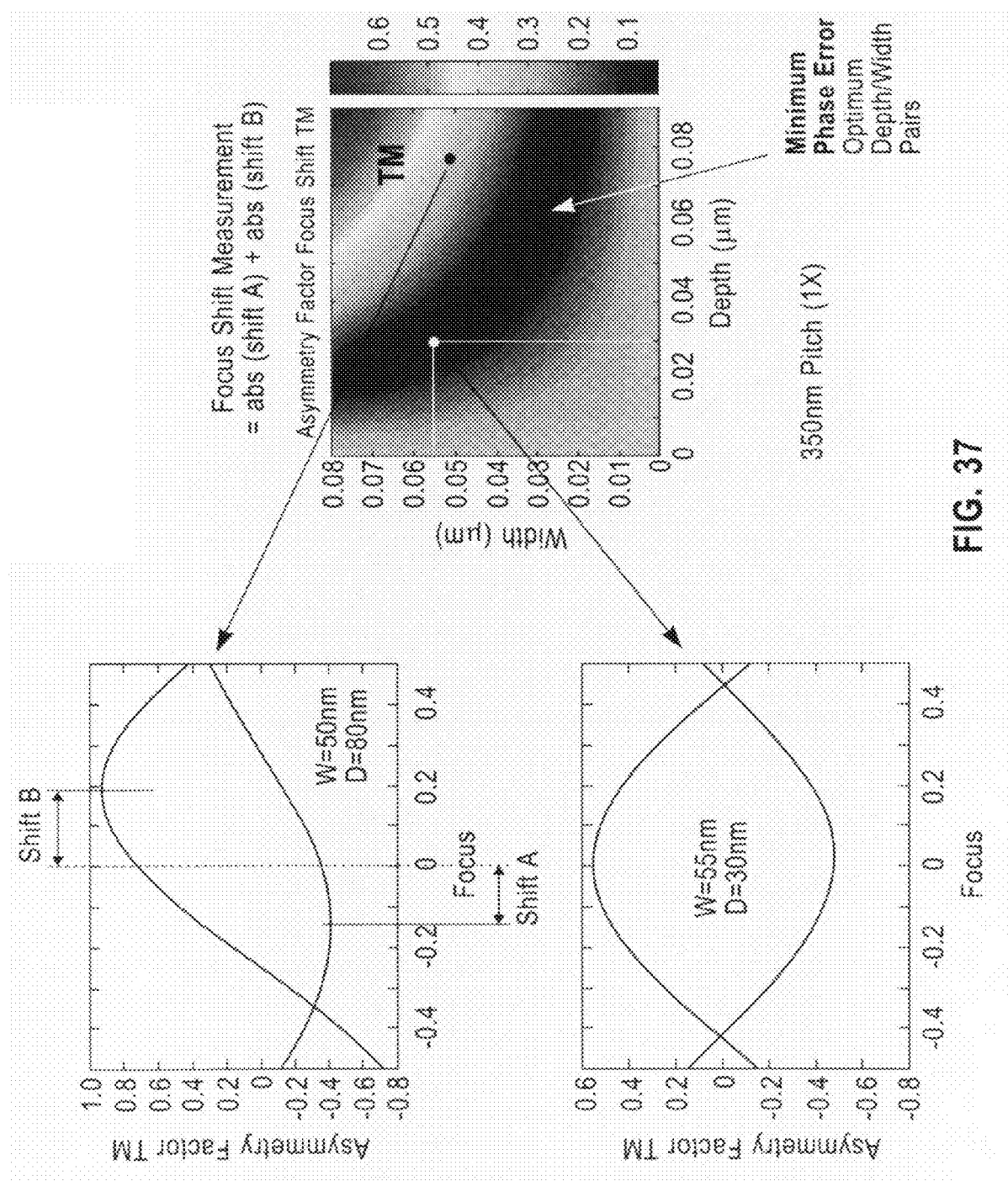
FIGS. 37-40 show antiBL optimization.

It is shown in FIG. 36 that application of the anti-BL correction to the mask edge produces a mask profile that reproduces ideal (TMA) response through focus in amplitude and phase and hence can restore the focus drift observed at tight pitches and restore CommonPW performance A.4: AntiBL Parameters Optimization FIG. 37 shows Measure 1: optimization through minimization of asymmetry factor focus shift. The parameters of width and depth of the anti-BL edge correction are optimized by searching for the values that produce the a symmetric curve of asymmetry factor measurement. It can be seen in FIG. 37 that a range of depth-width pairs exist that satisfy this condition.

Figure 38:
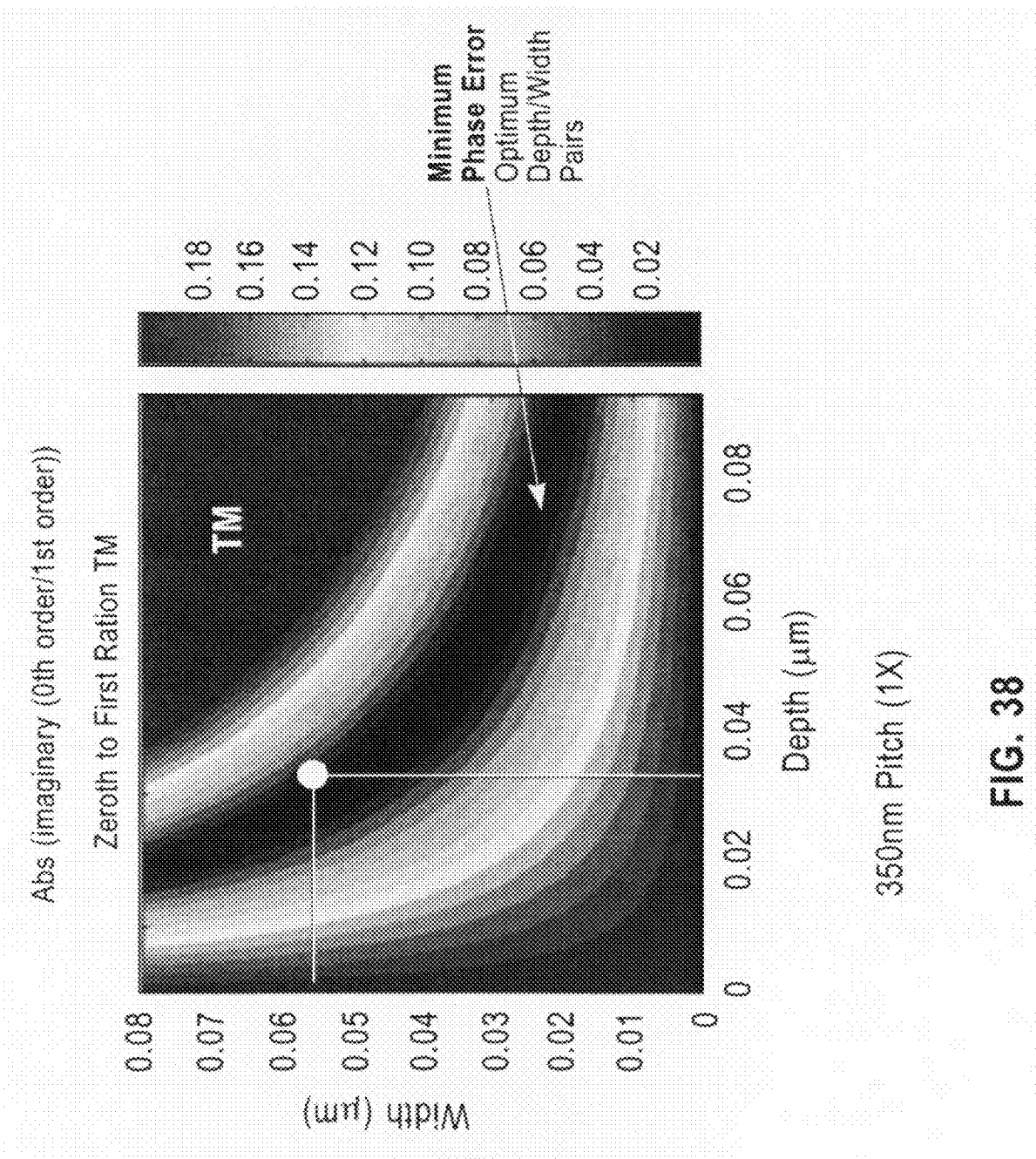

FIG. 38 shows Measure 2: optimization through minimization of Abs (imaginary (0th order/1st order)) The term "Abs." is short for "absolute value". In other words, the figure shows the absolute value of the imaginary part of the ratio of the 0th order to the 1st order. FIG. 38 shows that the range of depth-width pairs that satisfy this condition are essentially the same as those in FIG. 37 and, hence both approaches can be seen as equivalent.

Figure 39:
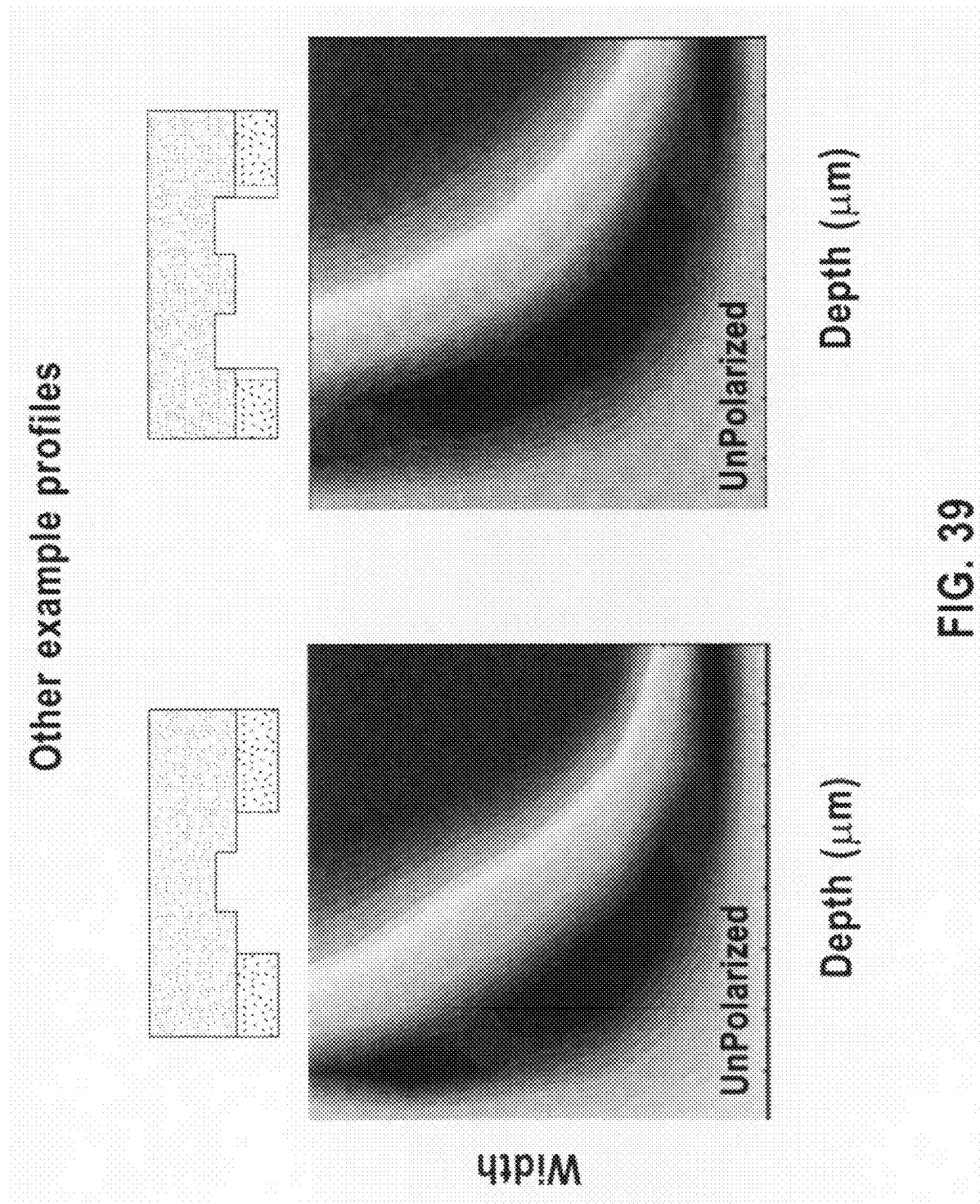

FIG. 39 shows other example profiles.

Figure 40:
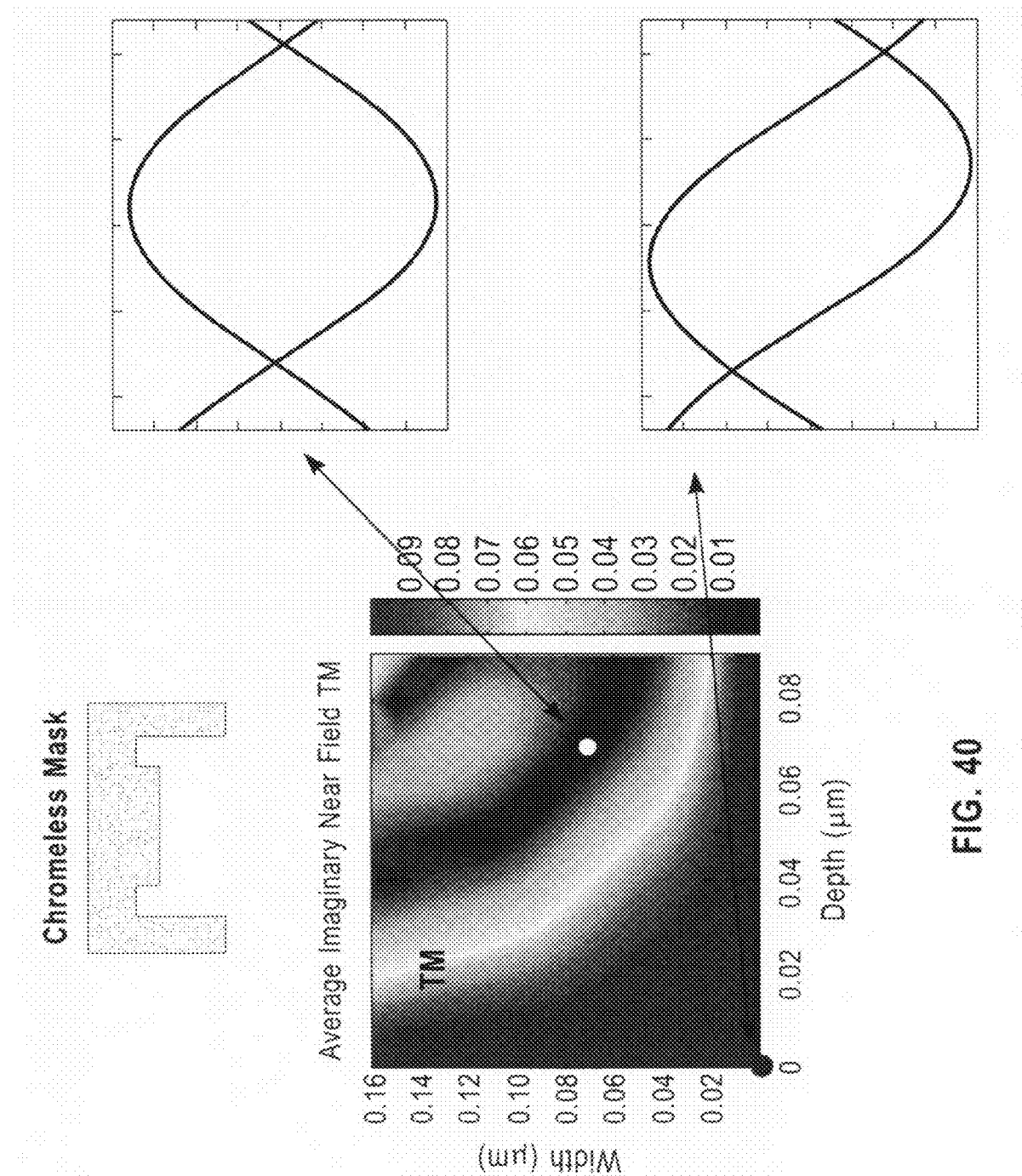

FIG. 40 shows Chromeless example.

APPENDIX B

Effect of Quadrature Component of the Diffracted Field on Wafer Focal Plane

Figure 41:
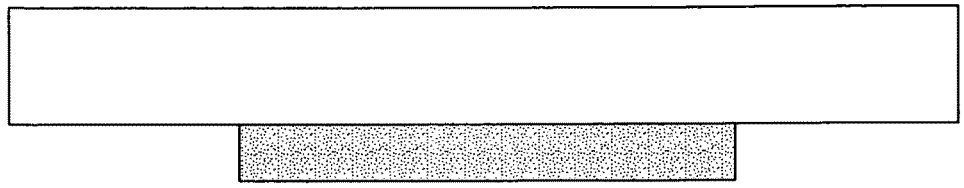
FIG. 41 shows Thin Mask Approximation results for the photomask.
Figure 41:
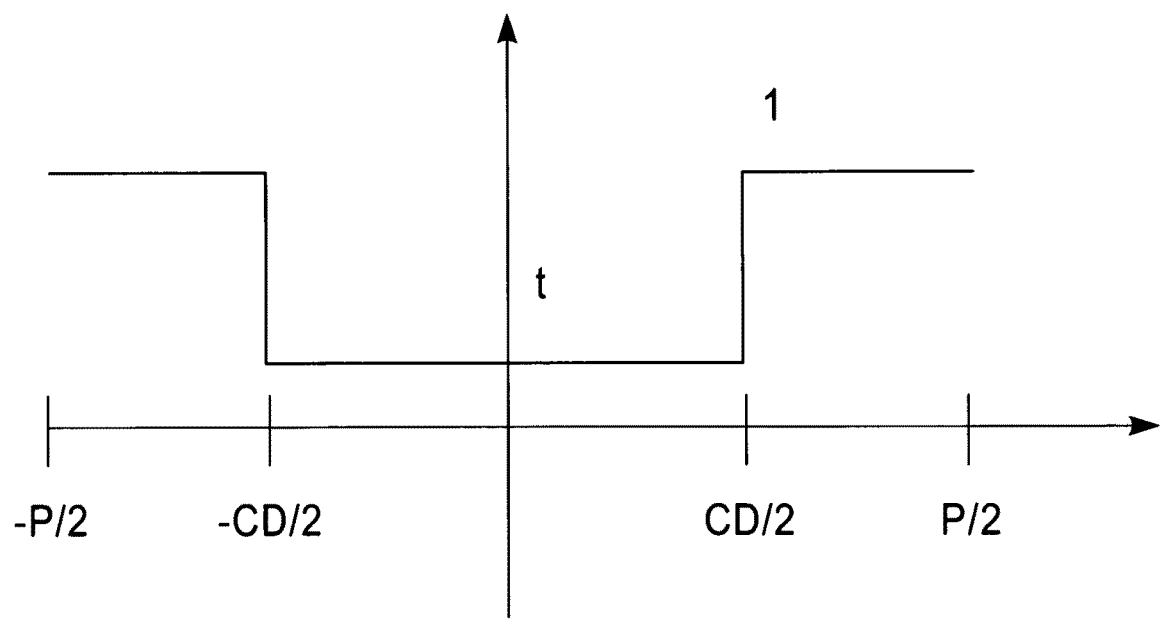

When the Thin Mask Approximation can be assumed to model the field transmitted through a photomask with acceptable accuracy, then for normal incidence illumination of the mask, the aerial image intensity in the wafer plane can be expressed in the important case of 3 beam interference imaging, as equation (B.1):

FIG. 41 shows: a) Diffraction orders diffracted by the photomask with normal incident illumination as described by the Thin Mask Approximation (TMA), and b) Thin Mask Approximation of the mask transmitted Near-fields.

$$I_{image}^{TMA} = |A_0^{TMA}|^2 + 4|A_1^{TMA}|^2 + 4A_0^{TMA}A_1^{TMA*}\cos(k_z - k_0)z \quad (B.1)$$

with $$k_0 = \frac{2\pi}{\lambda} \text{ and } k_z = k_0\left(1 - \left(\frac{\pi}{2P}\right)^2\right)^{\frac{1}{2}}$$

and where, for TMA and real blank transmission (either 0 degs or 180 degs), then the following relation is satisfied:

$$A_0^{TMA}A_1^{TMA*} = A \in \mathfrak{R}$$

Hence, the plane "z" of best focus is given by the solution to equation (b.2):

$$\frac{\partial I_{image}^{TMA}}{\partial z} = -4A(k_z - k_0)\sin(k_z - k_0)z = 0 \quad (B.2)$$

where the best focus is constant across pitch and equal to $z_{BF}$=zero.

Similarly, the asymmetry factor is given by $$AsymFactor = 8\frac{A_0^{TMA}A_1^{TMA*}\cos(k_z - k_0)z}{|A_0^{TMA}|^2 + 4|A_1^{TMA}|^2} \quad (B.3)$$

which, when $$\frac{\text{Space}}{\text{Line}} = \text{Mask Transmission} \rightarrow A_0^{TMA} = 0 \rightarrow AsymFactor = 0$$

hence producing a flat asymmetry factor through focus.

On the other hand, under similar circumstances but taking into account the full electromagnetic nature of the fields transmitted by the photomask, the aerial image intensity at the wafer plane can be expressed as equation (B.4)

Figure 42:
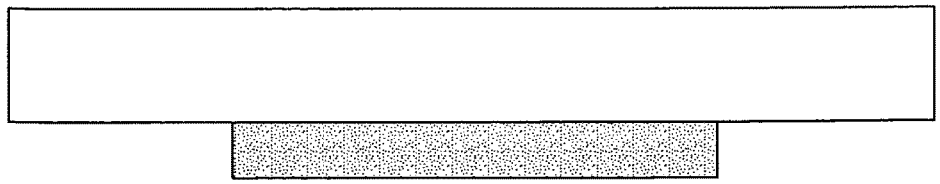
FIG. 42 shows diffraction orders diffracted by the photomask and the photomask electromagnetic near fields.
Figure 42:
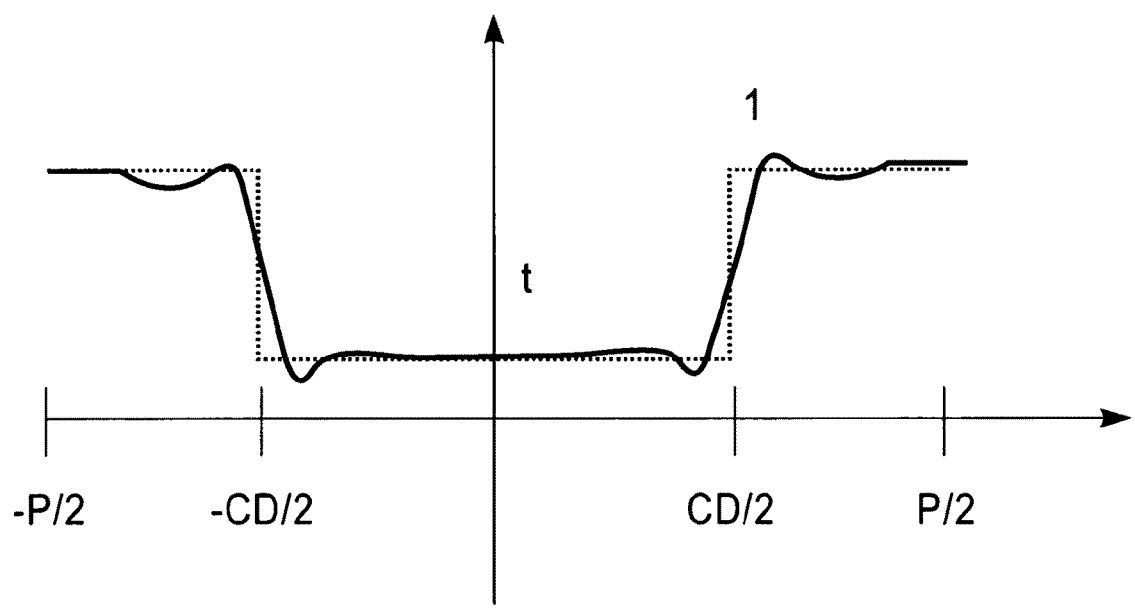

FIG. 42 shows: a) Diffraction orders diffracted by the photomask with normal incident illumination when considering full diffracted electromagnetic field (EMF); b) Sketch of the photomask electromagnetic near fields.

$$I_{image} = |A_0|^2 + 4|A_1|^2 + 2Re[A_0A_1^*e^{-i(k_z - k_0)z}] \quad (B.4)$$

where the diffracted orders are those produced by the full electromagnetic interaction between the mask topography and the incident illumination and the aerial image intensity is evaluated at x=0 for simplicity. It is possible to express the diffracted orders produced by the full electromagnetic interaction as the sum of a TMA term plus an EMF-induced perturbation term due to the EMF impact as follows:

$$A_0^* = A_0^{TMA} + \Delta A_0^{EMF} \quad (B.5a)$$

$$A_1^* = A_1^{TMA} + \Delta A_1^{EMF} \quad (B.5b)$$

where now the terms $\Delta A_0^{EMF} = Re(\Delta A_0^{EMF}) + i\text{Im}(\Delta A_0^{EMF})$ and $\Delta A_1^{EMF} = Re(\Delta A_1^{EMF}) + i\text{Im}(\Delta A_1^{EMF})$ have both in-phase and in-quadrature components, while the TMA term remains purely in-phase, that is, $A_0^{TMA} = Re(A_0^{TMA})$. Then the cross product of the zeroth and first diffracted orders is no longer purely real and it will contain both amplitude and phase terms (or in-phase and in-quadrature components) as indicated by equation B.6:

$$A_0A_1^* = (A_0^{TMA} + \Delta A_0^{EMF})(A_1^{TMA} + \Delta A_1^{EMF})^* = Be^{i\delta} \quad (B.6)$$

Hence, due to the in-quadrature component of the diffracted orders when the full electromagnetics are considered, an EMF-induced phase distortion term is introduced into the aerial image expression that will produce deviations of the best focal plane relative to the ideal z=0 plane, that is, the best focal plane is not longer constant and equal to zero across pitch, instead it will depend on the feature size and pitch of the pattern being imaged (B.7):

$$z_{BF} = \frac{\delta}{k_z - k_0} \quad (B.7)$$

and the asymmetry factor is given by equation (B.8)

$$AsymFactor = -4\frac{B\cos[\delta - (k_z - k_0)z]}{|A_0|^2 + 4|A_1|^2} \quad (B.8)$$

Thus the in-quadrature part of the electromagnetic fields are also producing a non-symmetric plot even when $A_0^{TMA}=A=0$, since the term $\Delta A_0^{EMF}$ and hence the term B will not likely be zero for realistic mask blanks.

The above description of the mask topography-induced focus distortions for normal incident illumination can be extended to oblique incidence of the illumination (so-called off-axis illumination) where it is known that these distortions or shifts of the plane of best focus across pitch can be amplified by the oblique nature of the illumination according to equation (B.10), where $$\sin\theta_d = \frac{\lambda}{\text{Pitch}} - \sin\theta_{inc}. \quad (B.10)$$

$$z_{BF} = \frac{\delta}{k_0(\cos\theta_{inc} - \cos\theta_d)}$$

Figure 43:
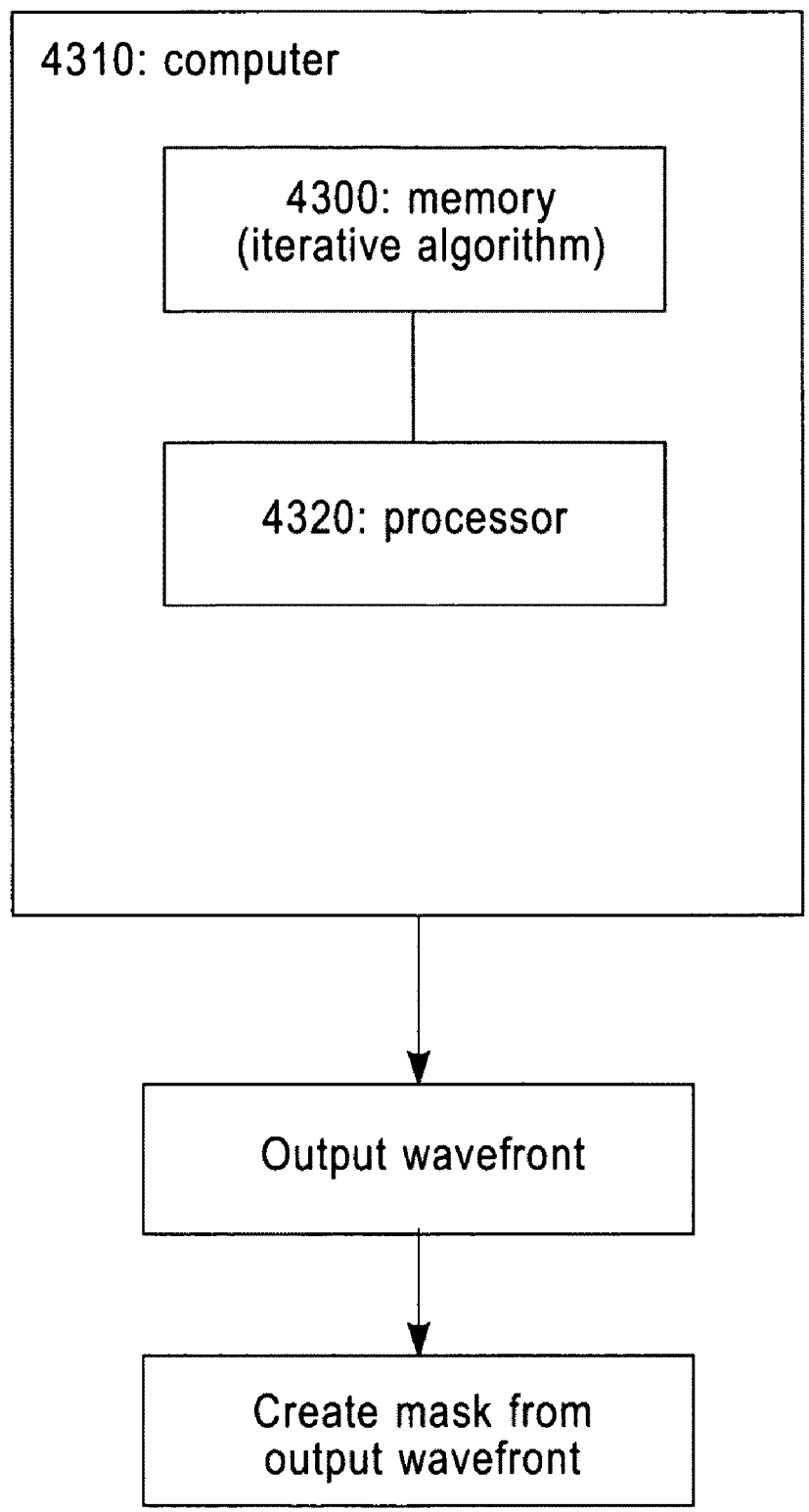
FIG. 43 shows a computer configured with an optimization algorithm stored in its memory that is suitable for the adjusting transmission discontinuities according to an exemplary embodiment of the invention.

Referring now to FIG. 43, there is depicted a computer 4310 having a memory 4300 storing a program of computer readable instructions executable by a processor 4320 to perform actions directed to generating a desired set of diffracted waves using features of a lithographic mask for which a set of allowed transmissions are chosen from a set of supported values, the actions comprising:

creating a representation of the mask as a set of polygonal elements, defining constraints which require that the ratio of the spatial frequencies in the representation take on the amplitude ratios of the desired set of diffracted waves, using an optimization algorithm to adjust the transmission discontinuities at edges of the polygonal elements to substantial equality with the discontinuity values allowed by the set of supported transmissions while maintaining the constraints. The computer 4310 may be a single computer (e.g., mainframe, personal computer, etc) or multiple distinct computers arranged to function in a distributed-computing manner (e.g., cloud computing). Similarly, the memory 4300 and processor 4320 which accomplishes the above creating, defining and adjusting may be within a single computer or the functions detailed herein may be accomplished by a functionally organized group of physically distinct computers each having their own processor and memory and coupled to one another via some communication link. Regardless of how many computers are used, the desired set of diffracted waves (e.g., the wavefront) is output and used to form a lithographic mask.

In one aspect of the memory 4300, the optimization algorithm comprises iterated steps, the iterated steps comprising:
forming a 3D topographical representation from the polygonal elements, and simulating it with a full-3D Maxwell solver to calculate the Fourier transform of the edge discontinuities.

In another aspect of the memory 4300, the iterated steps further comprise:
calculating a compensating adjustment that cancels the deviations of the Fourier transforms of the edge discontinuities from the required spatial frequency ratios.

In a further aspect of the memory 4300 the iterated steps further comprise:
forming an adjusted set of Fourier orders using the compensated edge Fourier transforms calculated in the previous step and use them to generate with thin-mask wavefront engineering a new set of iterated polygonal elements.

In another aspect of the memory 4300, the optimization algorithm further comprises
terminating the iterations when the Fourier transform of the 3D topographical representation of the iterated polygonal elements substantially reproduces the amplitude ratios of the desired set of diffracted waves.

In a yet further aspect of the memory 4300, one or more transmission discontinuities are driven to substantial equality with an allowed value by:
forming the 3D topographical representation of the polygonal elements,
calculating the transmission discontinuity at the edges of the polygonal elements, and
adding features to the mask whose in-quadrature transmission component substantially cancels the in-quadrature component of the transmission discontinuities at edges of the polygonal elements.

In still yet another aspect of the memory 4300, one or more transmission discontinuities are driven to substantial equality with an allowed value by:
giving the desired ratios of spatial frequencies complex values that provide the image with a desired behavior through focus,
forming the 3D topographical representation of the polygon elements,
calculating the transmission discontinuity at the edges of the polygonal elements, and
adding features to the mask whose quadrature transmission component combined with the quadrature component of the transmission discontinuities at the edges of the polygonal elements provides the in-quadrature part of the complex values of the desired spatial frequency ratios.

Thus it is seen that the foregoing description has provided by way of exemplary and non-limiting examples a full and informative description of the best apparatus and methods presently contemplated by the inventors for forming lithographic wavefronts. One skilled in the art will appreciate that the various embodiments described herein can be practiced individually; in combination with one or more other embodiments described herein; or in combination with methods and apparatus differing from those described herein. Further, one skilled in the art will appreciate that the present invention can be practiced by other than the described embodiments; that these described embodiments are presented for the purposes of illustration and not of limitation; and that the present invention is therefore limited only by the claims which follow.

We claim:

1. A method for generating a desired set of diffracted waves using features of a lithographic mask for which a set of supported transmissions are chosen from a set of supported values, by the steps of:
creating at a computer a representation of the mask as a set of polygonal elements,
defining at least one constraint for the computer comprising a ratio of spatial frequencies in the representation takes on amplitude ratios of the desired set of diffracted waves, and
using an optimization algorithm stored in a memory of the computer to adjust transmission discontinuities at edges of the polygonal elements to substantial equality with discontinuity values allowed by the set of supported transmissions while maintaining the at least one constraint,
where the optimization algorithm comprises iterated steps, the iterated steps comprising:
forming a 3D topographical representation from the polygonal elements,
simulating the 3D topographical representation to calculate a Fourier transform of the transmission discontinuities at the edges of the polygonal elements, and
calculating at the computer a compensating adjustment that cancels deviations of the Fourier transforms of the transmission discontinuities at the edges of the polygonal elements from the spatial frequency ratios, where the transmission discontinuities at the edges of the polygonal elements are adjusted based on the compensating adjustment,
where the iterated steps are performed until the adjusted transmission discontinuities at the edges of the polygonal elements are substantial equal with the discontinuity values allowed by the set of supported transmissions.

2. The method of claim 1 where simulating the 3D topographical representation is performed with a full-3D Maxwell solver.

3. The method of claim 2 where the iterated steps further comprise:
forming at the computer an adjusted set of Fourier orders using the compensated edge Fourier transforms calculated in the previous step and use them to generate with thin-mask wavefront engineering a new set of iterated polygonal elements.

4. The method of claim 3, where the optimization algorithm further comprises terminating the iterations when the Fourier transform of the 3D topographical representation of the iterated polygonal elements substantially reproduces the amplitude ratios of the desired set of diffracted waves.

5. The method of claim 1 where one or more transmission discontinuities are driven to substantial equality with an allowed value by:
  adding features to the mask whose in-quadrature transmission component substantially cancels an in-quadrature component of the transmission discontinuities at edges of the polygonal elements.

6. The method of claim 1 where one or more transmission discontinuities are driven to substantial equality with an allowed value by:
  giving the desired ratios of spatial frequencies complex values that provide the image with a desired behavior through focus, and
  adding features to the mask whose quadrature transmission component combined with a quadrature component of the transmission discontinuities at the edges of the polygonal elements provides an in-quadrature part of the complex values of the desired spatial frequency ratios.

7. A non-transitory memory storing a program of computer readable instructions executable by a processor to perform actions directed to generating a desired set of diffracted waves using features of a lithographic mask for which a set of supported transmissions are chosen from a set of supported values, the actions comprising:
  creating a representation of the mask as a set of polygonal elements,
  defining at least one constraint which comprising a ratio of the spatial frequencies in the representation takes on the amplitude ratios of the desired set of diffracted waves, and
  using an optimization algorithm to adjust transmission discontinuities at edges of the polygonal elements to substantial equality with the discontinuity values allowed by the set of supported transmissions while maintaining the at least one constraint,
  where the optimization algorithm comprises iterated steps, the iterated steps comprising:
  forming a 3D topographical representation from the polygonal elements,
  simulating the 3D topographical representation to calculate a Fourier transform of the transmission discontinuities at the edges of the polygonal elements, and
  calculating at the computer a compensating adjustment that cancels deviations of the Fourier transforms of the transmission discontinuities at the edges of the polygonal elements from the spatial frequency ratios, where the transmission discontinuities at the edges of the polygonal elements are adjusted based on the compensating adjustment,
  where the iterated steps are performed until the adjusted transmission discontinuities at the edges of the polygonal elements are substantial equal with the discontinuity values allowed by the set of supported transmissions.

8. The memory of claim 7 where simulating the 3D topographical representation is performed with a full-3D Maxwell solver.

9. The memory of claim 8 where the iterated steps further comprise:
  forming an adjusted set of Fourier orders using the compensated edge Fourier transforms calculated in the previous step and use them to generate with thin-mask wavefront engineering a new set of iterated polygonal elements.

10. The memory of claim 9, where the optimization algorithm further comprises terminating the iterations when the Fourier transform of the 3D topographical representation of the iterated polygonal elements substantially reproduces the amplitude ratios of the desired set of diffracted waves.

11. The memory of claim 7 where one or more transmission discontinuities are driven to substantial equality with an allowed value by:
  adding features to the mask whose in-quadrature transmission component substantially cancels an in-quadrature component of the transmission discontinuities at edges of the polygonal elements.

12. The memory of claim 7 where one or more transmission discontinuities are driven to substantial equality with an allowed value by:
  giving the desired ratios of spatial frequencies complex values that provide the image with a desired behavior through focus, and
  adding features to the mask whose quadrature transmission component combined with a quadrature component of the transmission discontinuities at the edges of the polygonal elements provides an in-quadrature part of the complex values of the desired spatial frequency ratios.

13. An apparatus for generating a desired set of diffracted waves using features of a lithographic mask for which a set of supported transmissions are chosen from a set of supported values, the apparatus comprising a processor and a memory storing a program of computer readable instructions executable by the processor to perform, at least, the steps of:
  creating a representation of the mask as a set of polygonal elements,
  defining at least one constraint comprising a ratio of spatial frequencies in the representation takes on amplitude ratios of the desired set of diffracted waves, and
  using an optimization algorithm to adjust transmission discontinuities at edges of the polygonal elements to substantial equality with discontinuity values allowed by the set of supported transmissions while maintaining the at least one constraint, where the optimization algorithm comprises iterated steps, the iterated steps comprising:
  forming a 3D topographical representation from the polygonal elements,
  simulating the 3D topographical representation to calculate a Fourier transform of the transmission discontinuities at the edges of the polygonal elements, and
  calculating a compensating adjustment that cancels deviations of the Fourier transforms of the transmission discontinuities at the edges of the polygonal elements from the spatial frequency ratios, where the transmission discontinuities at the edges of the polygonal elements are adjusted based on the compensating adjustment,
  where the iterated steps are performed until the adjusted transmission discontinuities at the edges of the polygonal elements are substantial equal with the discontinuity values allowed by the set of supported transmissions.

14. The apparatus of claim 13 where simulating the 3D topographical representation is performed with a full-3D Maxwell solver.

15. The apparatus of claim 14 where the iterated steps further comprise:
  forming an adjusted set of Fourier orders using the compensated edge Fourier transforms calculated in the previous step and use them to generate with thin-mask wavefront engineering a new set of iterated polygonal elements.

16. The apparatus of claim 15, where the optimization algorithm further comprises terminating the iterations when the Fourier transform of the 3D topographical representation of the iterated polygonal elements substantially reproduces the amplitude ratios of the desired set of diffracted waves.

17. The apparatus of claim 13 where one or more transmission discontinuities are driven to substantial equality with an allowed value by:
adding features to the mask whose in-quadrature transmission component substantially cancels an in-quadrature component of the transmission discontinuities at edges of the polygonal elements.

18. The apparatus of claim 13 where one or more transmission discontinuities are driven to substantial equality with an allowed value by:
giving the desired ratios of spatial frequencies complex values that provide the image with a desired behavior through focus, and
adding features to the mask whose quadrature transmission component combined with a quadrature component of the transmission discontinuities at the edges of the polygonal elements provides an in-quadrature part of the complex values of the desired spatial frequency ratios.

* * * * *